US009659775B2

(12) United States Patent
Ikeda et al.

(10) Patent No.: US 9,659,775 B2
(45) Date of Patent: May 23, 2017

(54) METHOD FOR DOPING IMPURITIES, METHOD FOR MANUFACTURING SEMICONDUCTOR DEVICE

(71) Applicants: KYUSHU UNIVERSITY, NATIONAL UNIVERSITY CORPORATION, Fukuoka (JP); FUJI ELECTRIC CO., LTD., Kawasaki (JP)

(72) Inventors: Akihiro Ikeda, Fukuoka (JP); Hiroshi Ikenoue, Fukuoka (JP); Tanemasa Asano, Fukuoka (JP); Kenichi Iguchi, Nagano (JP); Haruo Nakazawa, Nagano (JP); Koh Yoshikawa, Nagano (JP); Yasukazu Seki, Nagano (JP)

(73) Assignees: FUJI ELECTRIC CO., LTD., Kawasaki (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 0 days.

(21) Appl. No.: 15/052,427

(22) Filed: Feb. 24, 2016

(65) Prior Publication Data
US 2016/0247681 A1    Aug. 25, 2016

(30) Foreign Application Priority Data

Feb. 25, 2015 (JP) ................. 2015-035615
Aug. 28, 2015 (JP) ................. 2015-169697
Aug. 28, 2015 (JP) ................. 2015-169698

(51) Int. Cl.
*H01L 21/04* (2006.01)
*H01L 21/02* (2006.01)
(Continued)

(52) U.S. Cl.
CPC ...... *H01L 21/0455* (2013.01); *H01L 21/0217* (2013.01); *H01L 21/0485* (2013.01);
(Continued)

(58) Field of Classification Search
CPC ............. H01L 21/0485; H01L 21/2254; H01L 21/0217; H01L 21/0455
See application file for complete search history.

(56) References Cited

U.S. PATENT DOCUMENTS 8,962,459 B2 *  2/2015  Inns .................... H01L 21/2225
                                                          257/E21.491
9,337,359 B2 *  5/2016  Park ................ H01L 31/022425

FOREIGN PATENT DOCUMENTS

JP         1-261878       10/1989
JP         2-65128         3/1990
(Continued)

OTHER PUBLICATIONS

Yuki, Inoue et al., "Nitrogen Doping of 4H—SiC by Laser Irradiation in Ammonia Solution", *Proceedings of the 74th Japan Society of Applied Physics*, Autumn Meeting, 2003, p. 15-222.
(Continued)

*Primary Examiner* — Dung Le

(57) ABSTRACT

Impurity elements are doped at a high concentration exceeding a thermodynamic equilibrium concentration into a solid material having an extremely small diffusion coefficient of the impurity element. A method for doping impurities includes steps for depositing source film made of material containing impurity elements with a film thickness on a surface of a solid target object (semiconductor substrate) made from the solid material. The film thickness is determined in consideration of irradiation time per light pulse and the energy density of the light pulse. The method also includes a step for irradiating the source film by the light pulse with the irradiation time and the energy density so as
(Continued)

US 9,659,775 B2

Page 2 to dope the impurity elements into the target object at a concentration exceeding a thermodynamic equilibrium concentration.

24 Claims, 43 Drawing Sheets

(51) Int. Cl.
| | |
|---|---|
| *H01L 21/225* | (2006.01) |
| *H01L 29/40* | (2006.01) |
| *H01L 29/167* | (2006.01) |
| *H01L 29/16* | (2006.01) |
| *H01L 21/268* | (2006.01) |
| *H01L 21/324* | (2006.01) |
| *H01L 29/45* | (2006.01) |
| *H01L 29/47* | (2006.01) |
| *H01L 29/66* | (2006.01) |
| *H01L 29/739* | (2006.01) |

(52) U.S. Cl.
CPC ...... *H01L 21/0495* (2013.01); *H01L 21/2254* (2013.01); *H01L 21/2686* (2013.01); *H01L 21/324* (2013.01); *H01L 29/167* (2013.01); *H01L 29/1608* (2013.01); *H01L 29/401* (2013.01); *H01L 29/45* (2013.01); *H01L 29/47* (2013.01); *H01L 29/66333* (2013.01); *H01L 29/7395* (2013.01)

(56) References Cited

FOREIGN PATENT DOCUMENTS

| | | |
|---|---|---|
| JP | 4-250617 | 9/1992 |
| JP | 8-148443 | 6/1996 |
| JP | 8-264468 | 10/1996 |
| JP | 2000-277448 | 10/2000 |
| JP | 2004-158702 | 6/2004 |
| JP | 2007-227655 | 9/2007 |
| JP | 2013-214657 | 10/2013 |
| JP | 2013-232553 | 11/2013 |

OTHER PUBLICATIONS

Nakashima, Kenshiro, "Pulsed laser processing on SiC semiconductor substrates", *The Japan Society of Applied Physics*, vol. 70, No. 2, 2001, pp. 188-190.

* cited by examiner

METHOD FOR DOPING IMPURITIES, METHOD FOR MANUFACTURING SEMICONDUCTOR DEVICE

CROSS REFERENCE TO RELATED APPLICATIONS AND INCORPORATION BY REFERENCE

This application claims benefit of priority under 35 USC 119 based on Japanese Patent No. P2015-035615 filed Feb. 25, 2015, and Japanese Patent No. P2015-169698 filed Aug. 28, 2015, and Japanese Patent No. P2015-169697 filed Aug. 28, 2015, the entire contents of which are incorporated by reference herein.

BACKGROUND OF THE INVENTION

Field of the Invention

The present invention relates to a method for doping impurities, a method for manufacturing a semiconductor device, and the semiconductor device. The present invention especially relates to a technology for doping impurity elements into a solid material having an extremely small diffusion coefficient of impurity elements.

As power semiconductor devices, wide band gap semiconductor such as silicon carbide (SiC), especially 4H silicon carbide (4H—SiC) has a small diffusion coefficient of impurity elements. In a case where a semiconductor substrate is 4H—SiC, when high-dose amount of ions, for example, about $10^{15}/cm^2$ or higher are implanted into a (0001) surface ((000-1) surface) of 4H—SiC, for promoting activation of impurity elements together with recrystallization of 4H—SiC, it is necessary to anneal the semiconductor substrate in advance so that the temperature of the semiconductor substrate is increased to about 300 to 800° C. And, after the ion implantation, it is necessary to anneal at high temperature at about 1600 to 1800° C. However, even after such treatments, aluminum (Al), for example, that is a p-type dopant, hardly diffused thermally inside the crystal of 4H—SiC. According to the knowledge up to the present, it is understood that a diffusion coefficient inside the crystal of SiC is also small with regard to useful impurity elements other than Al.

On the contrary, JP2013-214657A proposes a method for forming a p-type impurity-doped layer in a SiC semiconductor substrate by depositing Al on a surface of an n-type SiC semiconductor substrate to form a film with a thickness of about 200 nanometers and irradiating the Al film with a light pulse of a laser beam. In the invention described in JP2013-214657A, four shots of light pulses (a KrF excimer laser with a wavelength of 248 nanometers) with an energy density of about 1 $J/cm^2$ are irradiated in irradiation time of 20 nanoseconds at room temperature and in a low-pressure state of about $6.7 \times 10^{-5}$ Pa so as to dope Al, which is an impurity element, into a surface of the n-type SiC semiconductor substrate at a concentration level of $4 \times 10^{20}$ $cm^{-3}$. However, even when the technology described in JP2013-214657A is used, a doping concentration of Al is limited to a level of $1 \times 10^{16}$ $cm^{-3}$ at a depth of about 50 nanometers to 100 nanometers from the surface. A value at the level of $1 \times 10^{16}$ $cm^{-3}$ is a lower limit value of the doping concentration in the technology according to Patent Literature 1.

Similarly, thermal diffusion of, for example, nitrogen (N), which is an n-type dopant, hardly happens inside the crystal of 4H—SiC even if a semiconductor substrate is heated in advance to increase temperature of the semiconductor substrate to about 300 to 800° C., and annealing is performed at high temperature of about 1600 to 1800° C. after ion implantation.

On the contrary, Inoue et al. proposed a method for forming an n-type impurity-doped layer in a SiC substrate by immersing an n-type SiC substrate into a high ammonia-concentration aqueous solution ($NH_3$aq) and irradiating the SiC substrate with a light pulse of a laser beam through the ammonia aqueous solution (Inoue Yuki, et al., "Nitrogen doping of 4H—SiC by laser irradiation in ammonia solution", Proceedings of the $74^{th}$ Japan Society of Applied Physics, Autumn Meeting, (2013)).

Inoue et al. used an ammonia aqueous solution at a concentration of ten weight % and irradiated a SiC substrate through three shots of light pulses (a KrF excimer laser with a wavelength of 248 nanometers) having an energy density of about 2.5 $J/cm^2$, with irradiation time of 55 nanoseconds, so as to dope N into the surface of the SiC substrate. However, in the scheme of Inoue et al., because the concentration of N in the material contacting practically to the SiC substrate is low, there is a problem that it is difficult to dope N into SiC at a higher concentration than a thermodynamic equilibrium concentration, namely, a solid-solubility limit concentration of N.

SUMMARY OF THE INVENTION

The present invention has been accomplished while focusing on the above-mentioned problem, and an object of the present invention is to provide a method for doping impurities, a method for manufacturing a semiconductor device, and the semiconductor device, in which impurity elements are doped at a high concentration exceeding a thermodynamic equilibrium concentration even in a solid material such as a wide band gap semiconductor material having an extremely small diffusion coefficient of impurity elements.

In order to solve the above-mentioned problem, an aspect of the present invention inheres in a method for doping impurities encompassing a step of depositing source film made of material containing impurity elements on a surface of a solid target object, a thickness of the source film is determined by an irradiation time per light pulse and an energy density of the light pulse, and a step of irradiating the source film by the light pulse with the irradiation time and the energy density so as to dope the impurity elements into the target object at a concentration exceeding a thermodynamic equilibrium concentration.

And another aspect of the present invention inheres in a method for manufacturing a semiconductor device encompassing a process of preparing an intermediate product having a first semiconductor region, a process of depositing source film made of material containing impurity elements on a surface of the first semiconductor region, a thickness of the source film is determined by an irradiation time per light pulse and an energy density of the light pulse, and a process of forming a second semiconductor region by irradiating the source film by the light pulse with the irradiation time and the energy density and doping the impurity elements into the first semiconductor region at a concentration exceeding a thermodynamic equilibrium concentration.

And another aspect of the present invention inheres in a semiconductor device encompassing a first semiconductor region, and a second semiconductor region in the first semiconductor region. Impurity elements are doped into the second semiconductor region at a concentration exceeding a thermodynamic equilibrium concentration.

DETAILED DESCRIPTION OF THE INVENTION

Figure 1:
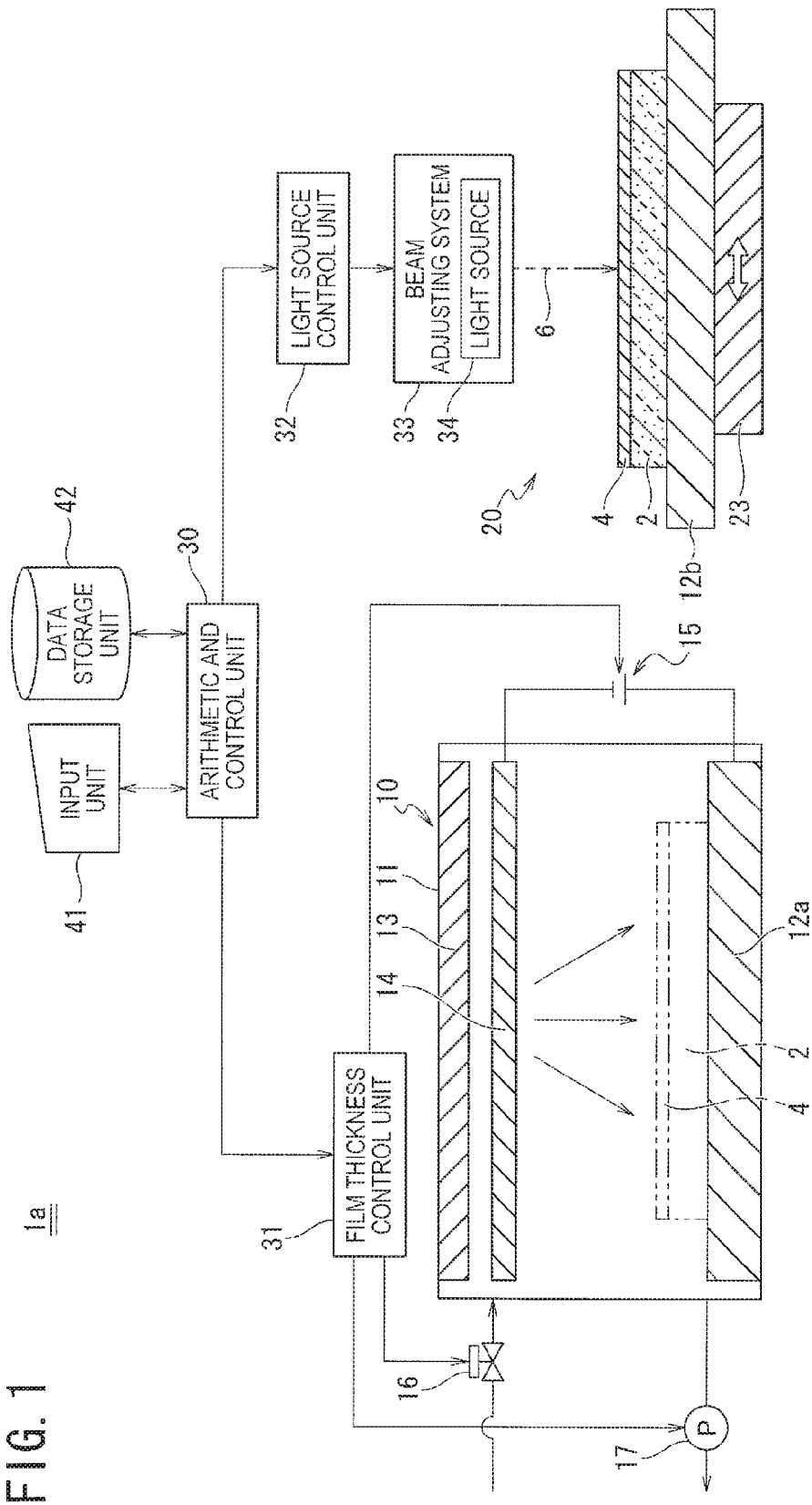
FIG. 1 is a block diagram including a sectional view for schematically explaining a rough structure of impurity doping apparatus used in the first embodiment of the present invention.

The first to third embodiments of the present invention are explained below. The first and second embodiments provide methods for doping impurities, by which impurity elements are doped at a high concentration exceeding a thermodynamic equilibrium concentration, and impurity elements are doped at a high concentration close to a solid solution concentration of a solid material at a position as deep as 50 nanometers or more from a surface of the solid material. The first and second embodiments also provide manufacturing methods for a semiconductor device using the above-mentioned methods for doping impurities, as well as the semiconductor device.

The third embodiment provides a method for doping impurities, by which nitrogen is doped in a surface of a solid material at a high concentration exceeding a thermodynamic equilibrium concentration of the solid material even when the solid material is, for example, wide band gap semiconductor, which has an extremely small diffusion coefficient of nitrogen. The third embodiment also provides a method for manufacturing a semiconductor device using the method for doping impurities, as well as the semiconductor device.

In the description of the drawings below, the same or similar reference numerals are used for the same or similar parts. However, it should be noted that the drawings are schematic, and relations between thicknesses and flat dimensions, ratios of thicknesses in each apparatus and each member, and so on are different from those in reality. Therefore, specific thicknesses and dimensions should be determined in consideration of the explanation below. Needless to say, relations and ratios of dimensions are partially different among the drawings.

In the following explanation, directions expressed as "left and right" and "up and down" are defined only for convenience of explanation, and do not limit the technical ideas of the present invention. Therefore, it is needless to say that when the sheet is rotated by 90 degrees, for example, "left and right" and "up and down" are exchanged with each other when read, and, when the sheet is rotated by 180 degrees, the "left" becomes "right" and "right" becomes "left". In the specification and the attached drawings, regions or layers that begin with n and p stand for that electrons or holes are a majority carriers in the subject regions or layers, respectively. Further, superscript notations of + or − added to n and p stand for that semiconductor regions have a higher or lower impurity concentration compared to a semiconductor region without + or −, respectively.

(The First Embodiment)
—Structure of Impurity Doping Apparatus—

As illustrated in FIG. 1, an impurity doping apparatus 1a pertaining to the first embodiment of the present invention encompasses a coating equipment 10, configured to provide source film 4 containing impurity elements on a surface of a solid target object 2, which is made from a solid material, a light irradiation apparatus 20, which irradiates the target object 2 having a flat surface with a light pulse having high irradiation fluence (energy density) such as a laser beam 6 through the source film 4 so as to dope impurity elements into the target object 2, and an arithmetic and control unit 30, having a capability of controlling film forming conditions such as a film thickness of the source film 4, controlling light irradiation conditions such as the energy density of the laser beam 6, controlling a light irradiation position of the beam relative to the target object 2.

As the coating equipment 10, for example, a sputtering system, an electron beam evaporation apparatus, a plasma chemical vapor deposition (CVD) apparatus, and so on may be used. In FIG. 1, the sputtering system is adopted for the coating equipment 10 pertaining to the first embodiment. The sputtering system includes a chamber 11 configured to be evacuated, a lower electrode 12a provided in the chamber 11 and a chamber upper plate 13 opposing to the lower electrode 12a, in the chamber 11. The target object 2 is mounted on the lower electrode 12a. In the chamber 11, a target 14 made of material containing impurity is provided to be the chamber upper plate 13, so as to face to the lower electrode 12a.

As the sputtering system, the coating equipment 10 further encompasses a power source 15, a gas doping valve 16, and a vacuum pump 17. The power source 15 is connected between the lower electrode 12a and the target 14. The gas doping valve 16 is connected with the camber 11 and dopes rare gas, such as argon (Ar) gas, into the chamber 11. The vacuum pump 17 is connected with the chamber 11 and implemented by a rotary pump, a turbo-molecular pump, a cryopump or the likes, which evacuate in the inside of the chamber 11 up to a predetermined vacuum pressure. A film thickness control unit 31, which controls a film thickness of the source film 4 to be formed, is electrically connected to the power source 15, the gas doping valve 16, and the vacuum pump 17. Further, the film thickness control unit 31 has a thickness monitor (not illustrated), equipped on the coating equipment 10, which can monitor in-situ the thickness of the source film 4, and feedback the signals from the thickness monitor to the film thickness control unit 31. The power source 15, the gas doping valve 16, and the vacuum pump 17 are connected with the arithmetic and control unit 30 through the film thickness control unit 31.

In the case of the DC sputtering system illustrated in FIG. 1, a direct current voltage is applied across the lower electrode 12a and the target 14 by the power source 15, the introduced rare gas is ionized so as to facilitate the collision to the target 14, thereby particles of the impurity element flown off by the target 14 are allowed to collide with and be stuck on a surface of the target object 2, depositing a film. The coating equipment 10 may be implemented by an RF sputtering system, a magnetron sputtering system, an ion beam sputtering system, and so on, apart from the DC sputtering system. The film thickness of the source film 4 to be deposited is controlled by adjusting treatment time at the time of film forming.

The light irradiation apparatus 20 of the impurity doping apparatus 1a pertaining to the first embodiment encompasses a beam adjusting system 33, which scans and irradiates the surface of the target object 2 with a light pulse in an irradiation area having a certain dimension through the source film 4, and an X-Y motion stage 23, which freely moves the target object 2 through a support stand 12b in an X-Y direction defined in a plane parallel to a main surface of the target object 2. The light irradiation apparatus 20 scans and irradiates an upper surface of the target object 2 with a light pulse of the laser beam 6 through the source film 4, thereby doping impurity elements in a part of inside of the target object 2 by using an energy effect given by the laser beam 6. The energy effect includes an effect of thermal energy.

Figure 4:
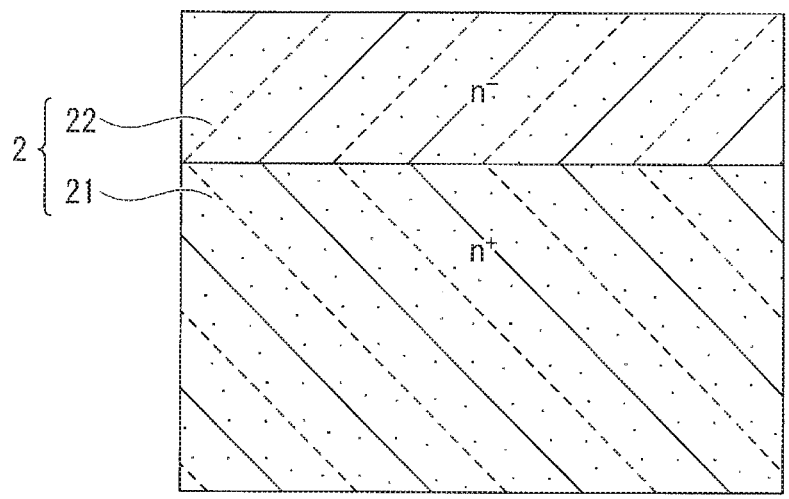
FIG. 4 is a process sectional view explaining the method for doping impurities according to the first embodiment (No. 1)

A SiC substrate is employed as an example of the target object 2 in the impurity doping apparatus 1a pertaining to the first embodiment. Specifically, a case, where a 4H—SiC substrate which is expected as a substrate for power semiconductor devices, is used. The target object 2 has a double-layer structure as illustrated in FIG. 4 as an example in which an epitaxial growth layer (herein below, referred to as an "epi layer") 22 of n⁻-type 4H—SiC having a concentration of about $1 \times 10^{16}/cm^3$ and a thickness of about ten micrometers is provided on top of an n⁺-type semiconductor substrate 21 having a (0001) surface ((000-1) surface). The target object 2 is oriented such that the epi layer 22 is assigned as the upper surface of the target object 2, and the upper surface faces to the beam adjusting system 33. Although not illustrated, a reference mark for positioning may be provided on the surface of the target object 2. A material for the target object 2 is not limited to SiC, and the present invention may be applied even when other wide band gap semiconductor materials such as gallium nitride (GaN), gallium oxide ($Ga_2O_3$), diamond are used. Also, the material for the target object 2 is not limited to the wide band gap semiconductor material.

The source film 4 is a film that serves as a doping source of impurities and contains impurity elements to be doped into the target object 2. In a case where, for example, Al is selected as a p-type impurity element, an Al thin film can be used. The source film 4 is not limited to a single element layer made of impurity elements itself, and may also be a thin film made from a compound or a mixture with other elements, such as a compound of nitride and so on, or a multilevel composite film in which such films are layered. The impurity elements are not limited to Al, and other impurity elements such as boron (B), gallium (Ga), nitrogen (N), phosphorus (P), and arsenic (As) may be used as appropriate in accordance with the selection of conductivity types or the selection of substitutional or interstitial site in a parent lattice structure.

As illustrated in FIG. 1, the beam adjusting system 33 of the impurity doping apparatus 1a pertaining to the first embodiment encompasses a light source 34, which emits a light pulse of the laser beam 6 and so on with a large energy density, a lens system (not illustrated) that condenses the emitted laser beam 6, an adjustable slit that forms the laser beam 6 into a given shape, and soon. A light source control unit 32, which controls irradiation conditions of the laser beam 6 to be irradiated, is connected with the beam adjusting system 33, and the light source control unit 32 is connected with the arithmetic and control unit 30. The light source 34 of the beam adjusting system 33 is controlled by the arithmetic and control unit 30 through the light source control unit 32.

For sweeping the laser beam 6, the beam adjusting system 33 may encompasses other optical systems (not illustrated) such as a reflecting mirror and a prism, if necessary, for reflecting and directing the formed laser beam 6 towards a light condensing device (not illustrated) such as a lens. The light pulse with a large energy density such as the formed laser beam 6 is irradiated towards an interface region between the upper surface of the target object 2 and the source film 4.

A shape of the formed laser beam 6 is preferably a rectangular shape, but is not limited to the rectangular shape and may be other shapes. Although not illustrated, an imaging device such as a CCD camera, which captures an image of the reference mark on the target object 2, an illumination light emitting device that emits illumination light, a mirror and an alignment mechanism for reflecting and transmitting the illumination light, and so on may be provided additionally in the beam adjusting system 33 where necessary, when controlling an irradiation position of a light pulse on the target object 2.

As a light pulse with a large energy density, a pulse of the laser beam 6 is preferred as the laser beam 6 has a wavelength capable of giving optical energy to the impurity element and lattice vibration of the target object 2 so that sufficient reaction energy is generated through the source film 4. For example, it is possible to use an excimer laser having an oscillation wavelength of 248 nanometers (KrF), 193 nanometers (ArF), 308 nanometers (XeCl), 351 nanometers (XeF) and so on, 266 nanometers (YAG fourth harmonic), 355 nanometers (YAG third harmonic), 532 nanometers (YAG second harmonic) lasers, 1.064 micrometers (YAG fundamental harmonic) and 10.6 micrometers (carbon dioxide ($CO_2$) gas) lasers and so on. Because it is also possible to obtain a light pulse with a larger energy density through a spectroscopy or a filter, by selecting a specific wavelength in high-output continuous light of, for example, a mercury (Hg) lamp and a xenon (Xe) lamp. Therefore, a light pulse is not limited to that of a laser.

Further, by using, for example, an excimer laser that emits the laser beam 6 with a wavelength in an ultraviolet region, which produces larger energy than band gap of many semiconductor materials, it is possible to optically excite a surface reaction such as a photocatalytic action due to optical energy in the ultraviolet region. Thus, lattice vibration is excited on a surface of a solid body serving as the doping target of impurity elements, thereby facilitating a surface reaction that includes surface migration by which the impurity elements move to a doping site such as interstitial and substitutional of the lattice structure in the target solid material. However, light with a shorter wavelength than that of ArF (=193 nanometers) laser, namely, namely, light with a short wavelength within a range of vacuum ultraviolet light, is absorbed in oxygen molecules in the atmosphere and propagation is inhibited. Therefore, for laser doping in the atmosphere, the laser beam 6 having a wavelength of about 190 nanometers or more is preferred.

The X-Y motion stage 23 supports the supporting plate 12b from below horizontally, and is connected with a motion stage driving apparatus (not illustrated). As the arithmetic and control unit 30 controls the motion stage driving apparatus, the X-Y motion stage 23 moves the supporting plate 12b in a direction within a horizontal plane (X-Y direction) freely so that the target object 2 is freely moved with respect to the irradiation position of a light pulse. For example, by freely moving the position of the target object 2 with respect to the irradiation position of a light pulse, a method of direct writing becomes possible. Further, a Z motion stage may be provided between the supporting plate 12b and the X-Y motion stage 23. The Z motion stage moves the supporting plate 12b in Z direction perpendicular to the X-Y direction. Thus, the supporting plate 12b facilitates movement in Z direction in addition to the X-Y direction. Thus, focus adjustment so on can be carried out.

An input unit 41 and a data storage unit 42 are connected with the arithmetic and control unit 30, and the arithmetic and control unit 30 is structured so as to be able to access data stored inside the data storage unit 42. In the data storage unit 42, a category (physical property) of impurity elements, irradiation time per pulse (shot) (pulse width), and an energy density of the laser beam 6 are stored through the input unit 41. The arithmetic and control unit 30 is able to set a category of impurity element, irradiation time per pulse, and an energy density, which are stored in the data storage unit 42, by using Eq. (1), which is an equation determined by experimental rule, so as to calculate a film thickness $t_f$ of the source film 4.

$$t = \alpha \cdot \ln(F) - \beta \qquad (1)$$

Here, $\alpha$ represents a thermal diffusion length (nanometers) decided by a category of impurity elements and irradiation time of the laser beam 6, and F represents an energy density ($J/cm^2$) of the laser beam 6. Further, $\beta$ represents a correction coefficient (nanometers) that is determined by experimental rule in consideration of the category of the impurity element and the irradiation time of the laser beam 6 based on previous experiment data. The thermal diffusion length $\alpha$ and the correction coefficient $\beta$ are stored in the data storage unit 42 through the input unit 41.

Details are given to Eq. (1). Laser energy absorbed in the surface of the Al film is diffused inside the substrate by thermal diffusion. At this time, a thermal diffusion length α at time t is given by $$\alpha = 2\sqrt{Dt} \quad (2)$$

where D is a thermal diffusion coefficient. Therefore, temperature T(x) at a depth x immediately after laser pulse irradiation is approximately given by:

$$T(x) = AF\exp(-x/2\sqrt{Dt}) \quad (3)$$

Here, τ represents a pulse width (irradiation time) of the laser, F represents laser irradiation fluence (energy density), A is a function of specific heat, density, reflectance and so on of a solid body, and may approximately be a constant coefficient.

For a maximum film thickness $x_{max}$ with which doping can be done with certain irradiation fluence, the following Eq. is obtained when the lowest temperature in an Al/SiC interface, at which doping can be done, is $T_{limit}$ ($x=x_{max}$).

$$T_{limit}(x = x_{max}) = AF\exp\left(\frac{-x_{max}}{2\sqrt{D\tau}}\right) \quad (4)$$

$$x_{max} = 2\sqrt{D\tau}\ln(F) + 2\sqrt{D\tau}\ln\left(\frac{A}{T_{limit}(x = x_{max})}\right) \quad (5)$$

is obtained. Here, thermal conductivity is k=2.3×10² W/mK, specific heat is ρ=0.90 J/gK, and a density is C=2.7 g/cm³ for Al. Therefore, a thermal diffusion coefficient D is obtained as follows.

$$D = k/\rho c \approx 0.95 \text{ cm}^2/\text{s} \quad (6)$$

Hence, the thermal diffusion length α immediately after laser pulse irradiation is obtained as follows because a pulse width is about 50 nanoseconds:

$$2\sqrt{D\tau} \approx 4.4 \times 10^3 \text{ (nm)} \quad (7)$$

Further, from Eqs. (5) and (7), $$x_{max} = 4.4 \times 10^3 \ln(F) + 4.4 \times 10^3 \ln\left(\frac{A}{T_{limit}(x = x_{max})}\right) \quad (8)$$

is obtained.

Here, when an Al film thickness is as small as about 120 nanometers, a very poor surface morphology, with a large amount of surface defects, is formed, causing an increase in reverse leakage current and a decrease in on-state current. Thus, electrical characteristics are deteriorated. When the Al film thickness increases to about 240 nanometers and an amount of surface defect is reduced, a decrease in reverse saturation current (leakage current) and an increase in on-state current are achieved, thereby improving electrical characteristics. This means that doping with better characteristics is achieved when the Al film thickness is as large as about 240 nanometers as illustrated by a dotted line in FIG. 2 as "a minimum film thickness".

Further, it was found that the maximum value (maximum thickness) $t_{fmax}$ of an Al film thickness with certain irradiation fluence F is given by Eq. (9) by fitting the experimental results in FIG. 2 to Eq. (8).

$$t_{fmax} = 4.4 \times 10^3 \cdot \ln(F) - 5350 \text{ (nanometers)} \quad (9)$$

Thus, in order to carry out doping process by laser ablation of an Al film, it is preferred that a film thickness $t_f$ of Al is $t_f \geq 240$ nanometers (minimum thickness $t_{fmin}$) and
$t_f \leq 4.4 \times 10^3 \cdot \ln(F) - 5350$ nanometers (maximum thickness $t_{fmax}$)

Figure 2:
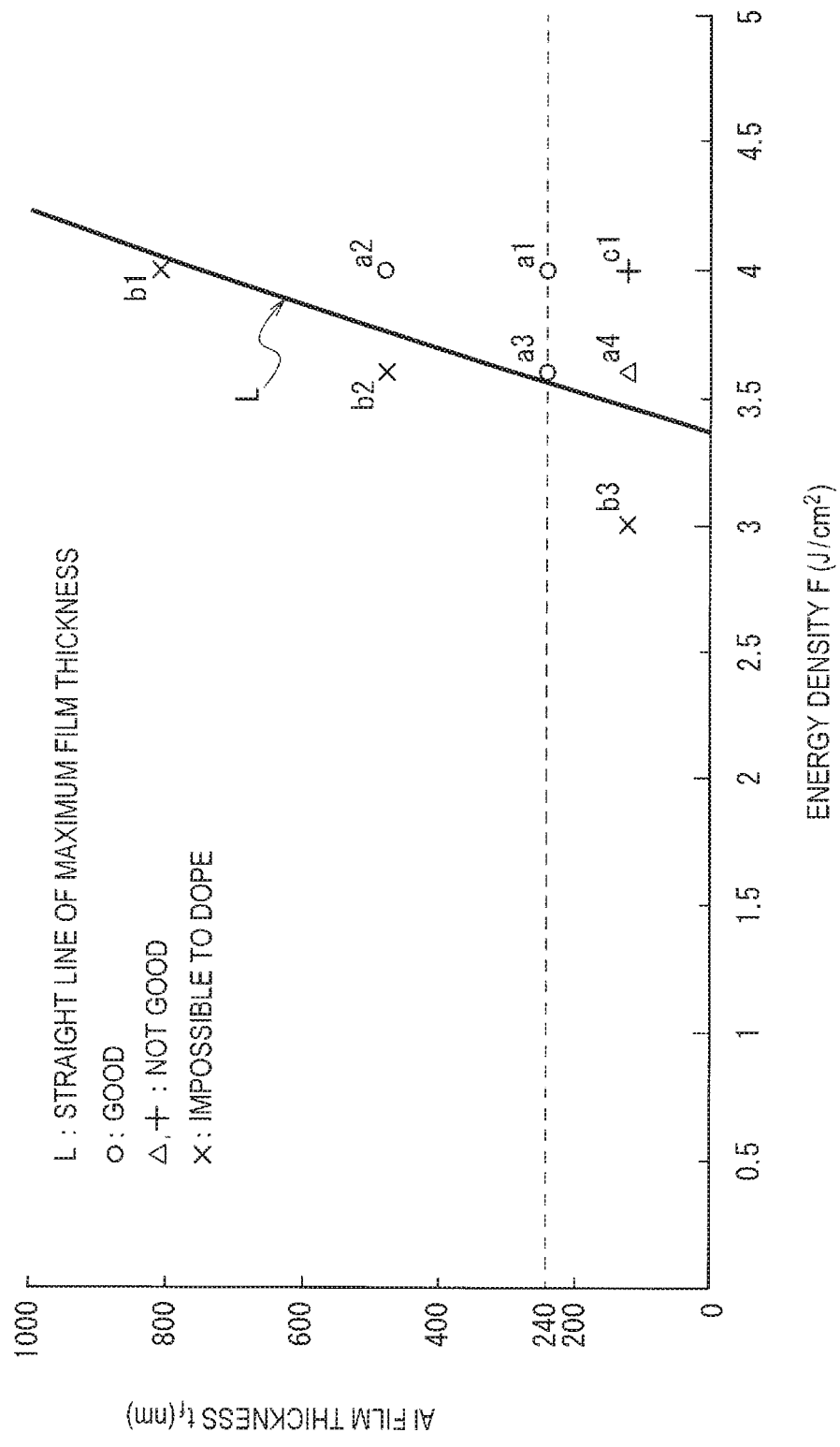
FIG. 2 is a graph for explaining a relation between an energy density of a light pulse and a film thickness of source film, which are used in a method for doping impurities according to the first embodiment.

By setting a diffusion length α and a correction coefficient β in accordance with the category of impurity elements and the irradiation time τ, a straight line of maximum film thickness L illustrated in FIG. 2 is obtained. Because, Eq. (1) is a Eq. using the natural logarithm, strictly speaking, the curve L in FIG. 2 is not a straight line. However, the curve L in FIG. 2 can be regarded generally as a straight line when focusing on the range illustrated in FIG. 2. Therefore, in this specification, Eq. (1) is explained using the word "straight line" for explanation.

On the right side of the straight line of maximum film thickness L in FIG. 2, three plots a1 to a3, the data points of which are marked by open circles (○), one plot a4, the data point of which is marked by an open triangle (Δ), and one plot c1, the data point of which is marked by a plus (+), are included. Out of the three plots a1 to a3 marked by open circles (○), the two plots a1, a2 on the right side in the drawing both have an energy density F of about 4.0 J/cm² and film thicknesses $t_f$ of about 240 nanometers and about 480 nanometers, respectively. Out of the four plots a1 to a4, the two plots of a3 marked by the open circle (○) and a4 marked by the open triangle (Δ), respectively, on the left side in the drawing both have an energy density F of 3.7 J/cm² and film thicknesses $t_f$ of about 240 nanometers and about 120 nanometers, respectively. Further, in the case of the plot c1 marked by a plus (+), an energy density F is about 4.0 J/cm², and a film thickness $t_f$ is about 120 nanometers.

When the source film 4 of Al is irradiated with one shot of light pulse with an energy density F=4.0 J/cm² and irradiation time τ=50 ns, the maximum thickness $t_{fmax}$ of the film thickness $t_f$ of the source film 4 becomes as follows by using the formula of the straight line of maximum film thickness L expressed by Eq. (9).

$$t_{fmax} = 4.4 \times 10^3 \cdot \ln(4.0) - 5350 \text{ nanometers} \approx 750 \text{ nanometers}$$

In other words, by setting a film thickness $t_f$ before light pulse irradiation within a range of $240 \leq t_f \leq 750$ (nanometers), the source film 4 is able to remain on the surface of the target object 2 after irradiation of light pulse by an amount of a film thickness corresponding to at least one atomic layer. A method for setting one film thickness $t_f$ within a certain proper range may be decided appropriately from time to time, or the film thickness $t_f$ may be decided by using, for example, "$(t_{fmax}+t_{fmin})/2$", which is an intermediate value between the maximum thickness $t_{fmax}$ and the minimum thickness $t_{fmin}$.

As long as a combination (F, $t_f$) of a value of an energy density F of a light pulse and a film thickness $t_f$ of the source film 4 satisfies Eq. (9), like the four plots a1 to a4 in FIG. 2, it is possible to dope impurity elements in the surface of the target object 2 at a higher concentration and also deeply from the surface of the target object 2 with one shot. Further, with regard to the three plots a1 to a3 having the minimum thickness $t_{fmin}$ or larger, the source film 4 is allowed to remain by a film thickness corresponding to at least one atomic layer, on the surface of the target object 2, after light pulse irradiation. The remnant atomic layers can restrain generation of surface defects within an allowable range so that desired diode characteristic is obtained when a semiconductor device is manufactured by delineating electrodes on the surface of the target object 2. Meanwhile, in the case of the plot a4 marked by an open triangle (Δ) and the plot c1 marked by a plus (+), in which the minimum thickness $t_{fmin}$ is smaller than 240 nanometers, although the doping may be possible, because a degree of a surface defect is large, deterioration of electrical characteristics is caused.

As illustrated by an intersection between the straight line of maximum film thickness L and the abscissa axis that represents an energy density F in FIG. 2, there is a lower limit value of the energy density F of a light pulse in order to dope desirably with one shot. In the example case illustrated in FIG. 2 where the impurity element is Al and the irradiation time τ=50 ns, the lower limit value of the energy density F can be set to about 3.3 J/cm² from the value at the intersection between the straight line of maximum film thickness L and the abscissa axis. Meanwhile, an upper limit value of the energy density F can be increased in accordance with the film thickness $t_f$ of the source film 4. However, in the viewpoint of energy efficiency, it is preferred that the upper limit value of the energy density F is 6.0 J/cm² or smaller in the impurity doping apparatus 1a pertaining to the first embodiment.

By selecting a combination (F, $t_f$) of a value of an energy density F of a light pulse and a film thickness $t_f$ of the source film 4, which satisfies Eq. (9) and the minimum thickness $t_{fmin}$, it is possible to set the smallest film thickness $t_f$ by which the source film 4 is able to remain on the surface of the target object 2 after light pulse irradiation by an amount of a film thickness corresponding to at least one atomic layer, with respect to a certain energy density F. At the same time, it is also possible to set the smallest energy density F with respect to a certain film thickness $t_f$.

In a region in FIG. 2 on the left side of the straight line of maximum film thickness L, three plots b1 to b3 are illustrated as examples, the data point of which are marked by a cross (x). In the case of a combination (F, $t_f$) of a value of an energy density F of a light pulse and a film thickness $t_f$ of the source film 4 (F, $t_f$) like the three plots b1 to b3, it is not possible to establish desired laser doping unlike the foregoing three plots a1 to a3.

Figure 16B:
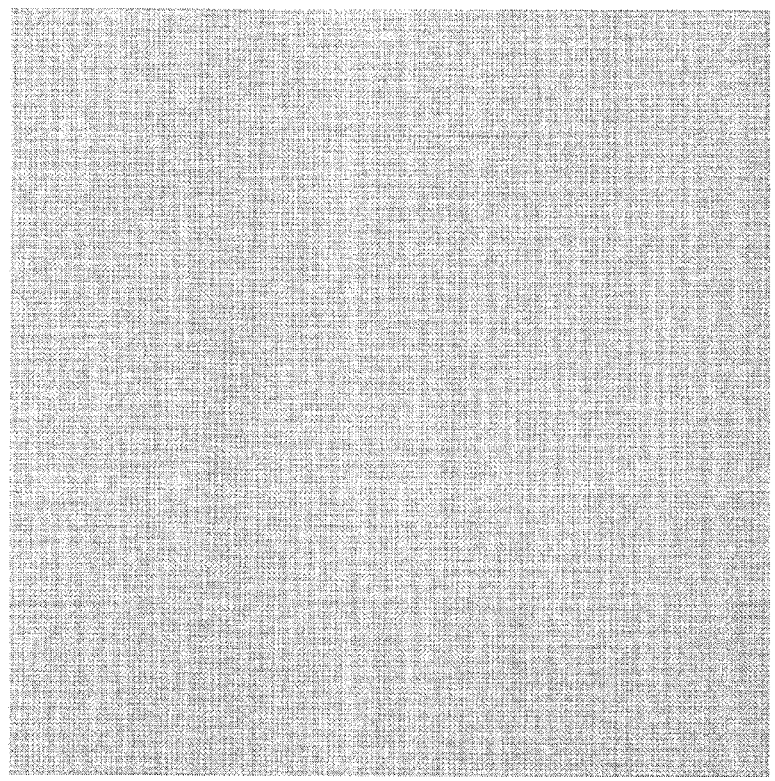
FIG. 16A and FIG. 16B are parts of SEM images illustrating states after removal of the remaining source films on the upper surfaces of the impurity doped regions that are obtained by using the source films having different film thicknesses by the method for doping impurities according to a comparative example.
Figure 16A:
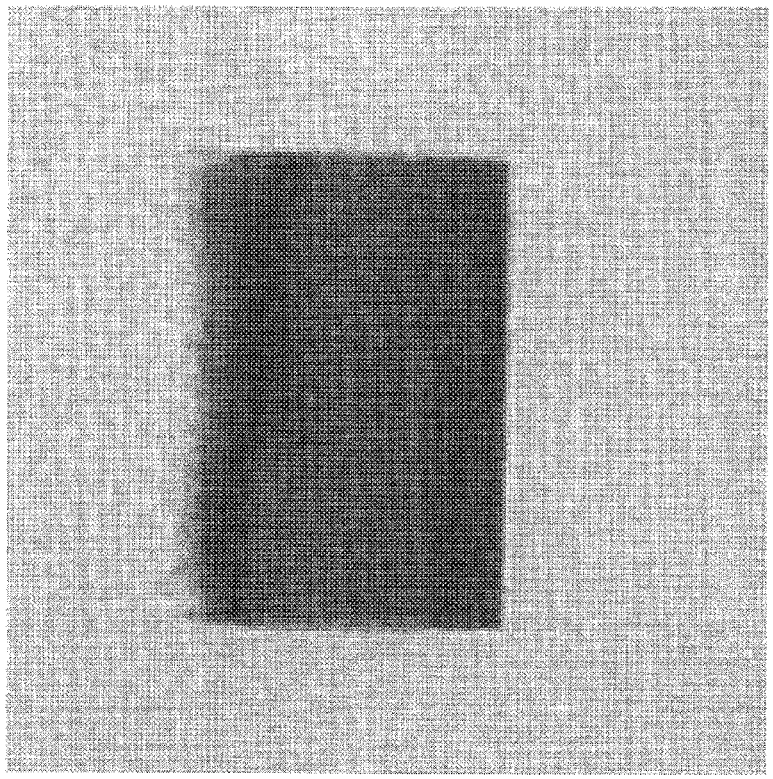

Out of the three plots b1 to b3 marked by a cross (x), in the case of the plot b2 in the center and the plot b1 on the right side, the energy densities F are too large with respect to the film thicknesses $t_f$ or the film thicknesses $t_f$ are too small with respect to the energy densities F. Therefore, even if it is possible to dope the impurity element into the surface of the target object 2, the source film 4 is not able to remain on the surface of the target object 2 after light pulse irradiation by an amount of a film thickness corresponding to at least one atomic layer. Then, degrees of recessed irregularities M in FIG. 7 and surface defects in impurities doping region 2a illustrated in FIG. 16A become heavily poor.

Then, when a semiconductor device is manufactured by delineating electrodes on the surface of the target object 2 in the subsequent process steps, a decrease in a forward current and an increase in reverse-bias leakage current are caused. Thus, the semiconductor device is not able to have sufficient desired characteristics. Further, out of the three plots b1 to b3 marked by x, in the case of the plot b3 on the left side, the energy density F of a light pulse becomes smaller than the lower limit value. In other words, by prescribing a process window w with the straight line of maximum film thickness L, so as to define the energy density F of the light pulse and the film thickness $t_f$ of the source film 4, the recessed irregularities M will not excessively formed on the surface of the target object 2, and, even if surface defects are generated, the degree of the defect is contained within an allowable certain range.

Data of a film thickness $t_f$ calculated by the arithmetic and control unit 30 is entered into the film thickness control unit 31. At the same time, data of irradiation time τ and an energy density F, as well as data indicating that the number of pulses is one, which are entered in the arithmetic and control unit 30, are fed to the light source control unit 32. Also, it is possible to connect a display device (not illustrated) with the arithmetic and control unit 30 so that data of a film thickness $t_f$, irradiation time τ, an energy density F, the number of pulses, and so on is displayed.

The film thickness control unit 31 controls voltage of the power supply 15, and operations of the gas doping valve 16 and the vacuum pump 17 in the coating equipment 10 so that the source film 4 is deposited with data of the entered film thickness $t_f$ on the target object 2. The light source control unit 32 controls operations of the beam adjusting system 33 so that the scanning irradiation of a light pulse is performed with data of the energy density F, the number of pulses, and irradiation time τ entered.

—Doping Method of Impurities According to the First Embodiment—

Example 1

Figure 3:
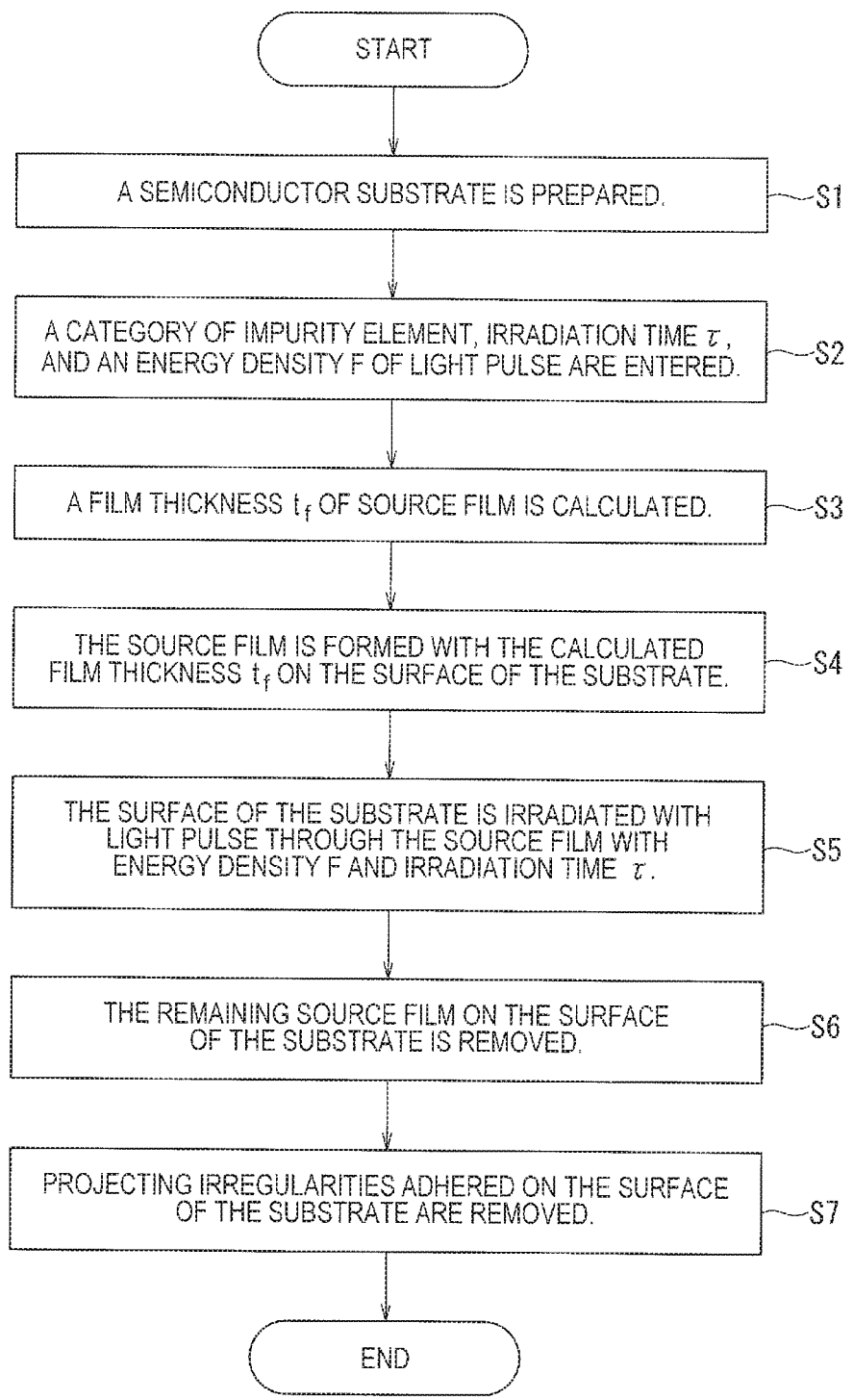
FIG. 3 is a flowchart for explaining the method for doping impurities according to the first embodiment.

Next, a method for doping impurities according to the first embodiment of the present invention is explained with reference to FIGS. 4 to 12 in addition to the flowchart in FIG. 3. First of all, in step S1 in FIG. 3, the target object 2 is prepared, in which the n⁻-type epi layer 22 is grown on the upper surface side of an n⁺-type semiconductor substrate 21 as illustrated in FIG. 4. As illustrated by a two-dotted line inside the coating equipment 10 in FIG. 1, the target object 2 is mounted and fixed so that an upper surface of the target object 2 faces to the target 14.

Next, in step S2, data of a category of impurity element, irradiation time τ per pulse, and an energy density F of the laser beam 6 are stored in the data storage unit 42 through the input unit 41. Step S2 may be carried out before step S1. It is assumed that the impurity element is Al, the irradiation time τ=50 ns, and the energy density F=4.0 J/cm². Also, for a thermal diffusion length α and a correction coefficient β in Eq. (1), values are previously set to foregoing 4.4×10³ nanometers and 5350 nanometers, respectively.

In step S3, the arithmetic and control unit 30 reads out the data of the irradiation time τ per pulse, the energy density F of the laser beam 6, the thermal diffusion length α and the correction coefficient β from the data storage unit 42. And the control unit 30 calculates the film thickness $t_f$ of the source film 4 as follows by using Eq. (1).

$$t_f(F=4.0, ns=50) < 4.4 \times 10^3 \cdot 1n(4.0)) - 5350 < 750 \text{ nanometers}$$

Then, the arithmetic and control unit 30 sets the film thickness $t_f$ as a film deposition condition in the subsequent deposition step. In this Example 1, the film thickness is $t_f$=240 nanometers.

As irradiation conditions for the irradiation step of the laser beam 6, the number of pulse shots is one, the irradiation time τ=50 ns, and the energy density F=4.0 J/cm² are elected. Then, the elected film thickness $t_f$=240 nanometers is fed to the film thickness control unit 31 of the coating equipment 10, and, at the same time, the number of pulse shots=one, the irradiation time τ=50 ns, and the energy density $F=4.0$ J/cm² are fed to the light source control unit 32 of the light irradiation apparatus 20.

Figure 5:
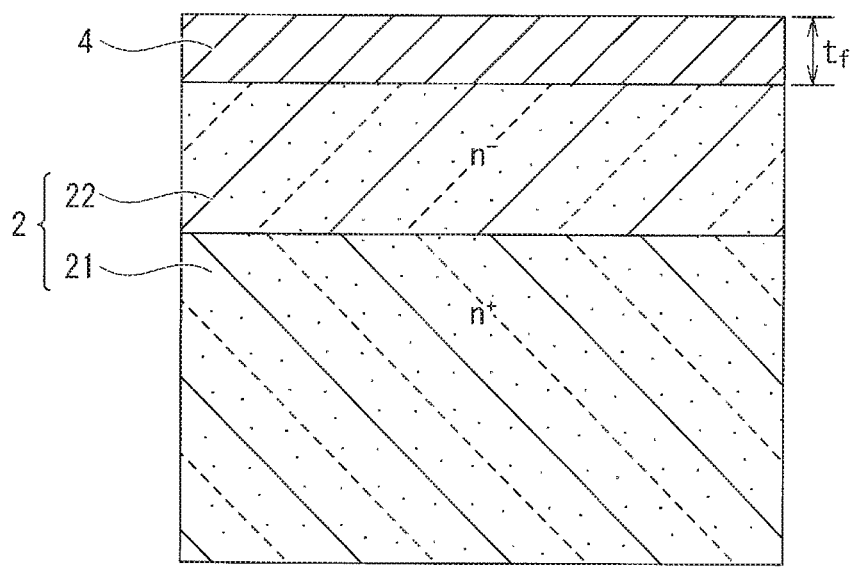
FIG. 5 is a process sectional view explaining the method for doping impurities according to the first embodiment (No. 2)

Next, in step S4, the film thickness control unit 31 of the coating equipment 10 controls voltages across the lower electrode 12a and the target 14 and operations of the gas doping valve 16 and the vacuum pump 17, so as to deposit the source film 4 made from Al with the film thickness $t_f=240$ nanometers on the upper surface of the epi layer 22 of the target object 2 as illustrated in FIG. 5.

Next, the target object 2, on which the source film 4 is formed, is taken out from the coating equipment 10 and conveyed to the light irradiation apparatus 20, and then is mounted and fixed on the supporting plate 12b so that an upper surface of the source film 4 faces to the beam adjusting system 33. The light irradiation apparatus 20 is exposed in a normal ambient atmosphere at room temperature. Then, the beam adjusting system 33 moves the optical axis of the laser beam 6, by a given amount in X direction and Y direction, so that the position of the initial reference mark coincides with the optical axis. The initial reference mark corresponds to an initial irradiation position from where the doping of impurity element in the epi layer 22, located in the target object 2, starts.

Figure 6:
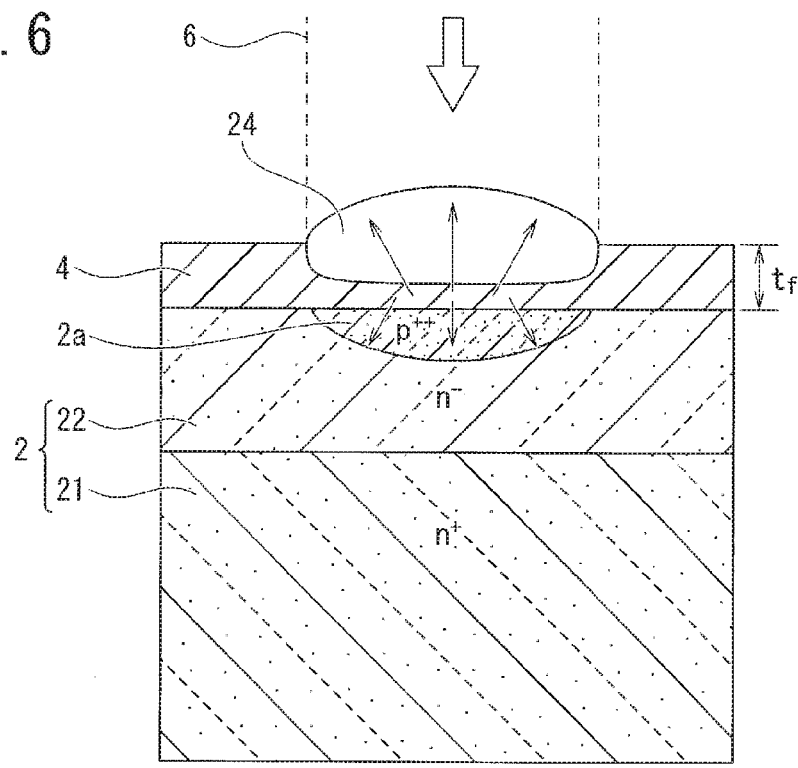
FIG. 6 is a process sectional view explaining the method for doping impurities according to the first embodiment (No. 3)

Next, the light source control unit 32 of the light irradiation apparatus 20 controls operations of the beam adjusting system 33 so that irradiation with the laser beam 6 is performed with the number of pulses=one, the irradiation time τ=50 ns, and the energy density $F=4.0$ J/cm², the data of which have been previously elected and stored. Then, as illustrated in FIG. 6, in step S5, the upper surface of the epi layer 22 in the target object 2 is irradiated with a light pulse of the laser beam 6 through the source film 4. For the laser beam 6, for example, a 248 nanometers (KrF) excimer laser is used, and the beam is formed so that the irradiation area becomes a square shape of 350 micrometers square in a planar pattern.

Figure 7:
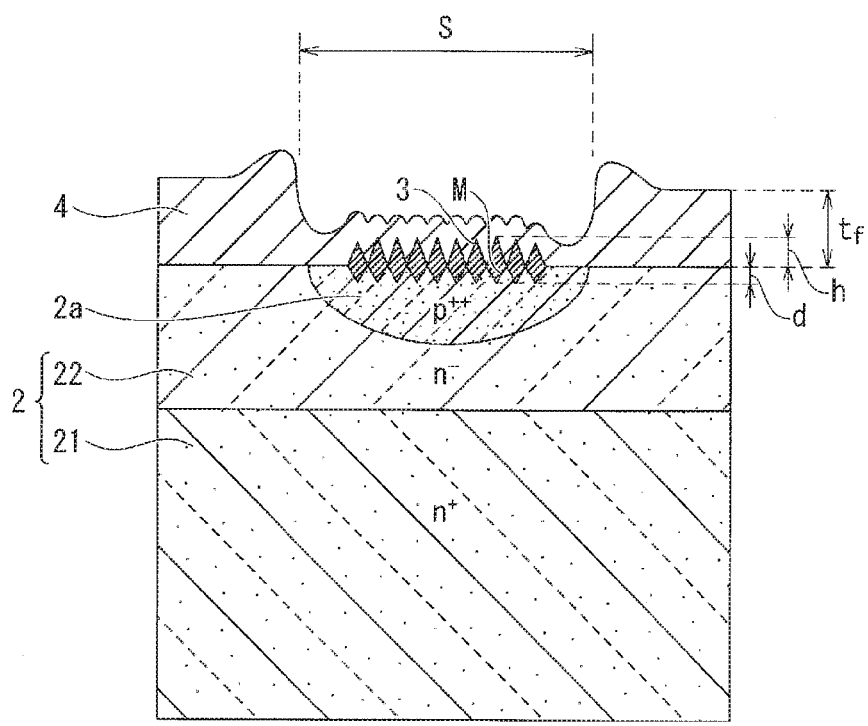
FIG. 7 is a process sectional view explaining the method for doping impurities according to the first embodiment (No. 4)

At this time, because the energy density F of the light pulse for irradiation is 4.0 J/cm², which is a high-energy state, in the irradiation area of the source film 4 irradiated by the laser beam, Al is dramatically activated and melted and Al is doped in the epi layer 22 at the interface between the source film 4 and the epi layer 22. Also, a plume 24 due to ablation is generated on the surface of the source film 4 on the laser beam 6 side, and Al is scattered in the periphery of the irradiation area, and a melt flow region is generated around the irradiation area. As a result, as illustrated in FIG. 7, in the irradiation area S, the film thickness $t_f$ of the source film 4 is reduced, and a part of Al rises in a part of a region near a boundary between the irradiation area S and a non-irradiation area.

After the light pulse irradiation, inside the source film 4 of the irradiation area S, a part of the upper surface of the target object 2 is also abraded due to irradiation with the high-energy light pulse, and the plurality of recessed irregularities M (step irregularities) that make a surface defect of the target object 2 are generated in different depths. However, because of the treatments in steps S2 and S3 carried out previously, distribution of the recessed irregularities M generated in the irradiation area S are controlled. The maximum depth d of the recessed irregularities M from the surface of the epi layer 22 is about 120 nanometers to 200 nanometers.

Further, a plurality of projecting irregularities 3 are formed on an inner side of the recessed irregularities M. The projecting irregularities 3 are adhered onto the surface of the epi layer 22 through the recessed irregularities M and project upwardly with different heights. A maximum height h of the projecting irregularities 3 from the surface of the epi layer 22 is about 120 nanometers to 200 nanometers. In the irradiation area S of the light pulse, a part of the source film 4 is deposited and remains with a certain thickness to cover the plurality of projecting irregularities 3 such that a thickness corresponding to at least one atomic layer remains on the surface of the impurity doped region 2a after light pulse irradiation. Therefore, as illustrated in a scanning electron microscope (SEM) top view in FIG. 8A, light metallic luster of the remaining Al thin film is observed on an inner side of an outline of a shot, which is illustrated in a nearly square shape in the drawing. On an outer side of the outline of the shot, a blackish color tone illustrates Al and so on, which is melted and flown around the irradiation area due to ablation of Al after light pulse irradiation.

Figure 8B:
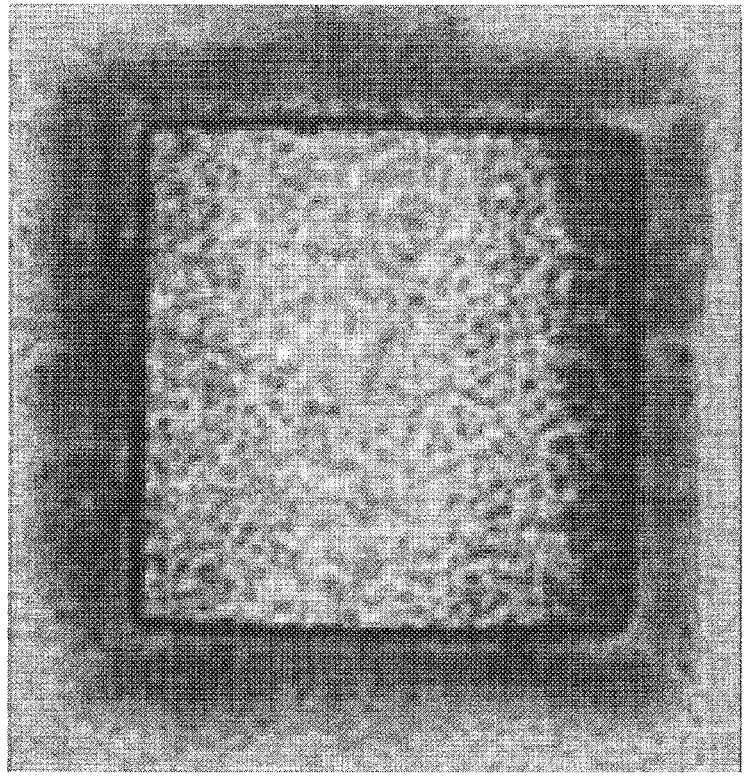
FIG. 8A and FIG. 8B are parts of SEM images illustrating states before removal of remaining source films on upper surfaces of impurity doped regions that are obtained by using the source films having different film thicknesses in the method for doping impurities according to the first embodiment.
Figure 8A:
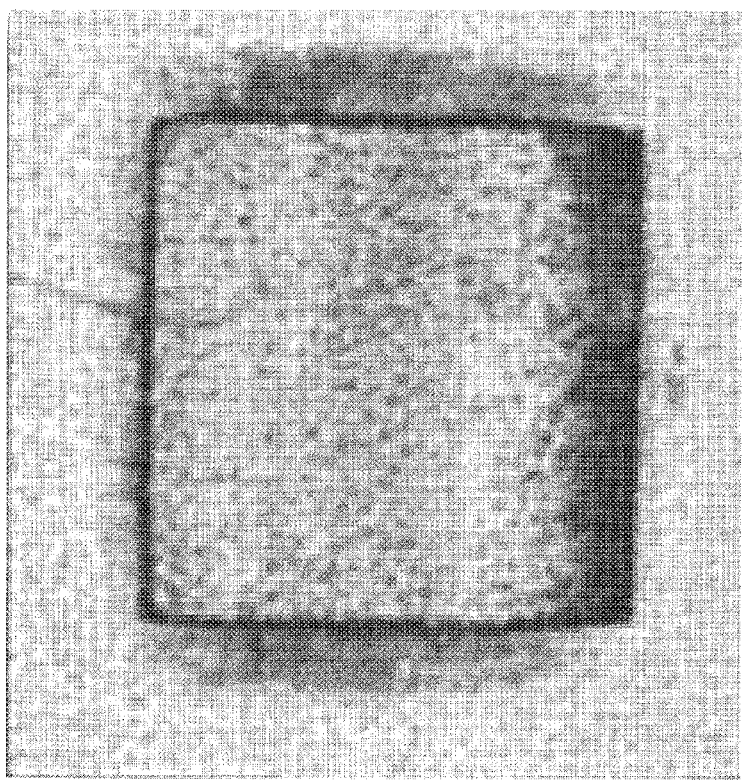

FIG. 8B is a SEM image of an upper surface of an irradiation area in a case where doping is carried out under the same irradiation conditions of the laser beam 6 in the case where the film thickness $t_f$ of the source film 4 is 240 nanometers, except that the film thickness $t_f$ of the source film 4 is 480 nanometers. Similarly to the top view in FIG. 8A, light metallic luster of a remaining Al thin film after light pulse irradiation is illustrated on an inner side of an outline of a shot. Also, on an outer side of the outline of the shot, Al that is melted and flown around the irradiation area due to ablation of Al is illustrated in an even more blackish color tone than that in the case of FIG. 8A. Sectional shapes of the recessed irregularities M illustrated in FIG. 7 are schematically illustrated for explanation, and do not limit actual shapes. Similarly, sectional shapes of the projecting irregularities 3 are illustrated as an example, and actual shapes can be various geometric shapes including a nearly columnar shape, a nearly triangular pyramid shape, and other prism shapes.

Figure 9:
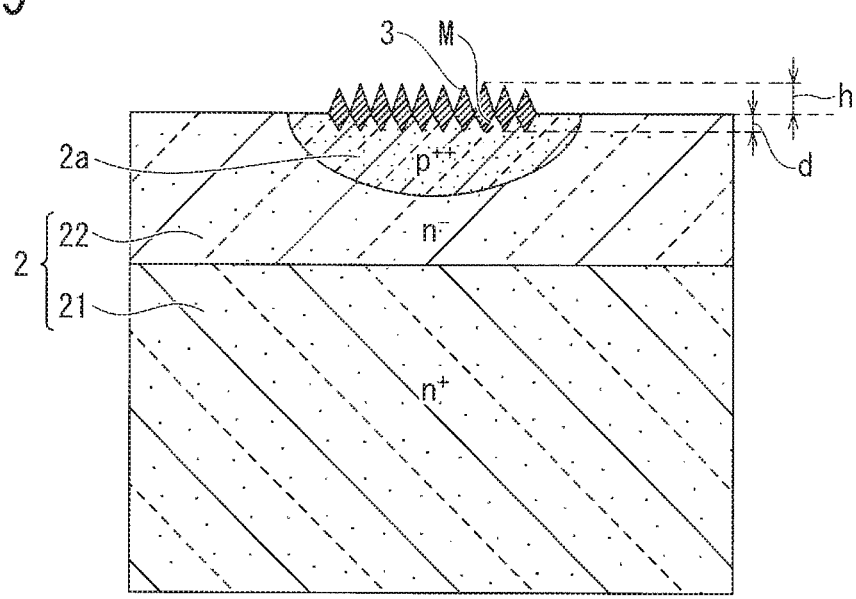
FIG. 9 is a process sectional view explaining the method for doping impurities according to the first embodiment (No. 5)

Next, in step S6, in the case where the source film 4 is Al, the source film 4 remaining on the surface of the epi layer 22 of the target object 2 is removed by using hot phosphoric acid ($H_3PO_4$) and so on as illustrated in FIG. 9. In the top view of a SEM image in FIG. 10A, a blackish color tone is illustrated in gradation on the inner side of the irradiation area, illustrating that the remaining source film 4 has removed generally, and the projecting irregularities 3 are adhered and remain on the target object 2.

Figure 10B:
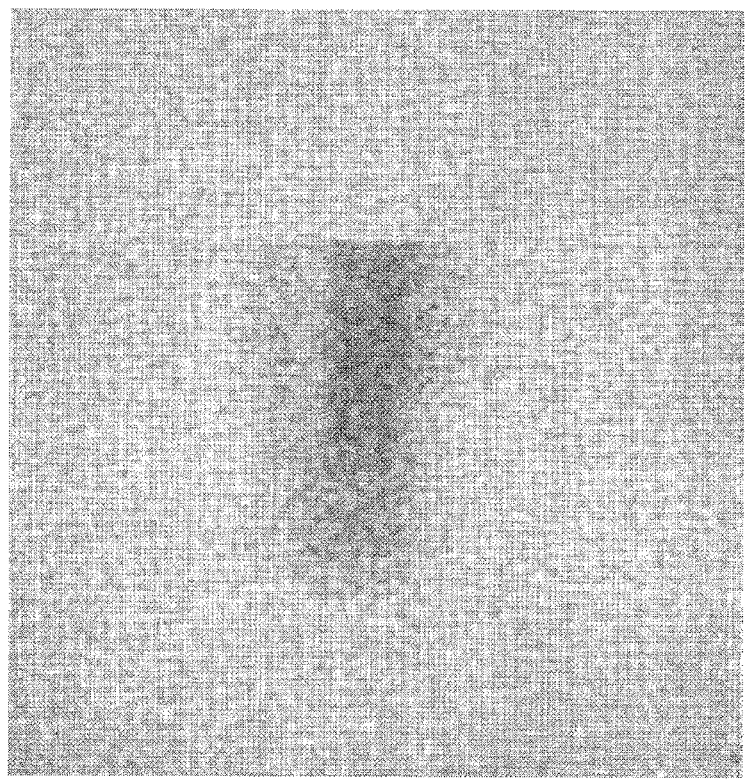
FIG. 10A and FIG. 10B are parts of SEM images illustrating states after removal of the remaining source films on the upper surfaces of the impurity doped regions that are obtained by using the source films having different film thicknesses in the method for doping impurities according to the first embodiment.
Figure 10A:
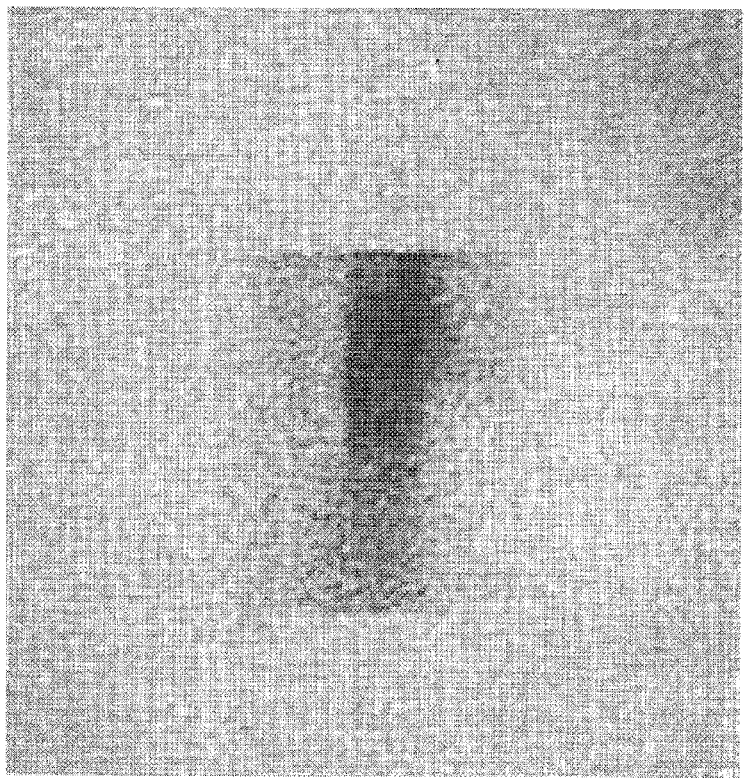

FIG. 10B is a top view of a SEM image after the source film 4, which remains after light pulse irradiation, is removed by using hot phosphoric acid and so on, similarly to the case of FIG. 10A, from the upper surface of the irradiation area of the target object 2 in the case of FIG. 8B (the film thickness $t_f$ of the source film 4=480 nanometers). Similarly to the top view of FIG. 10A, the color tone and gradation is illustrated on the inner side of the irradiation area to the same degree as those in the case of the film thickness $t_f=240$ nanometers, illustrating that the remaining source film 4 has removed nearly, and the projecting irregularities 3 are adhered and remain on the target object 2.

Figure 11A:
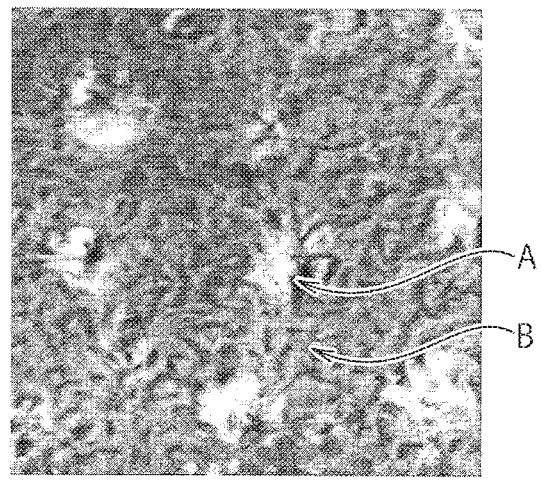
FIG. 11A is an enlarged view of a partial region of FIG. 10A.
Figure 11B:
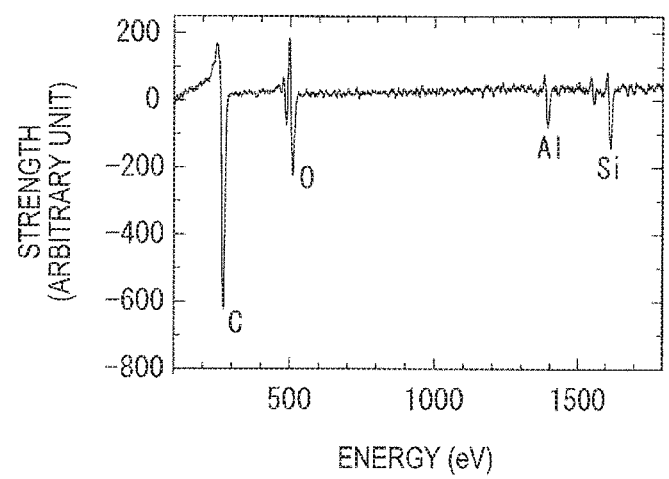
FIG. 11B is a graph illustrating an AES analysis result of portion A in FIG. 11A.
Figure 11C:
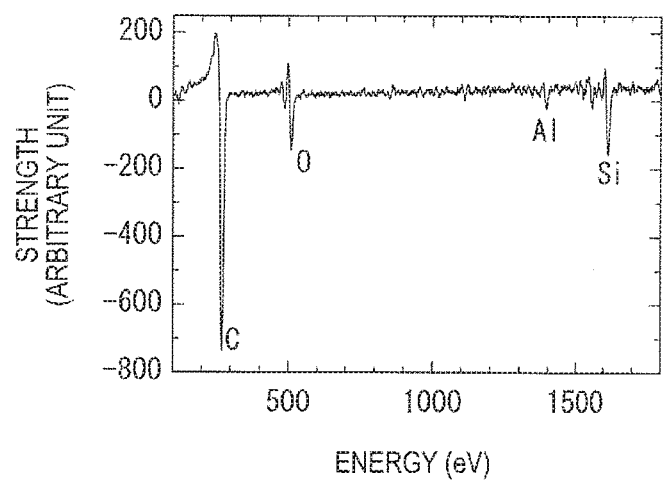
FIG. 11C is a graph illustrating an AES analysis result of portion B in FIG. 11A.

In the blackish region in the center of FIG. 10A, many projecting irregularities 3 are crowded and packed at a high density as illustrated in an enlarged view in FIG. 11A. As illustrated in a view of energy spectrum in FIG. 11B, when auger electron spectroscopy (AES) analysis is performed on portion A in the projecting irregularities 3 in FIG. 11A, it is understood that the projecting irregularities 3 is a Si-based reaction product containing Al. Further, as illustrated in a view of energy spectrum in FIG. 11C, it is also understood that a Si-based reaction product containing Al is deposited in a region illustrated by portion B that is positioned between the plurality of projecting irregularities 3 and lower than the projecting irregularities 3 in FIG. 11A.

Figure 12:
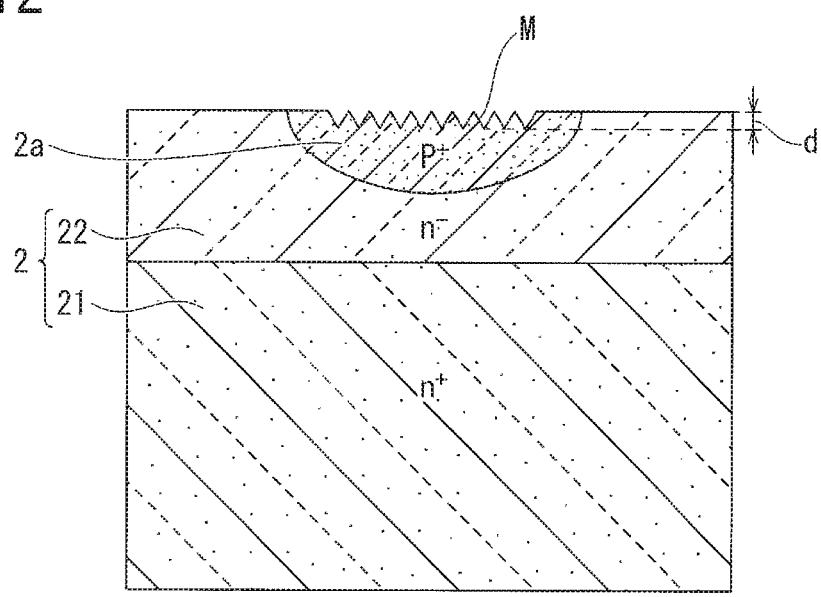
FIG. 12 is a process sectional view explaining the method for doping impurities according to the first embodiment (No. 6)

Next, in step S7, the surface of the epi layer 22 is treated by plasma etching and so on by using, for example, tetrafluoromethane ($CF_4$) for about 20 minutes, thereby removing the projecting irregularities 3 adhered on the surface of the target object 2. Due to the removal of the projecting irregularities 3, the plurality of recessed irregularities M are exposed on the surface of the epi layer 22 as illustrated in FIG. 12, and the method for doping impurities according to the first embodiment finishes.

Figure 13:
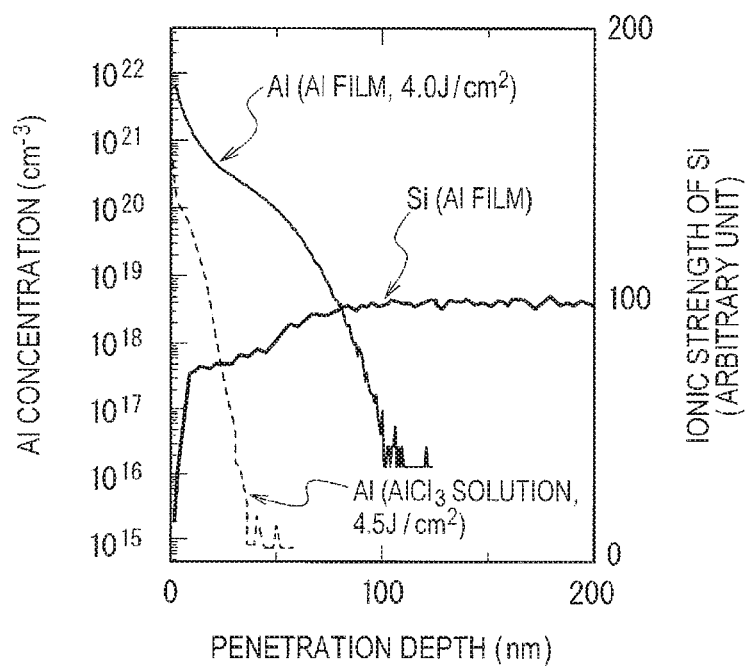
FIG. 13 is a graph illustrating profiles of a concentration and a penetration depth of impurity elements inside a semiconductor substrate obtained by using the method for doping impurities according to the first embodiment.

As illustrated in FIG. 13, with the foregoing method for doping impurities according to the first embodiment, it is possible to dope Al at about concentration $6 \times 10^{21}$ $cm^{-3}$ or higher, which exceeds the solid-solubility limit concentration of 4H—SiC, in the outermost surface of the epi layer 22, and to a position at a depth of nearly 100 nanometers in the epi layer 22. At a depth position of about 50 nanometers from the surface of the epi layer 22, it is possible to dope Al at about $1 \times 10^{20}$ $cm^{-3}$ that is close to the solid-solubility limit concentration of 4H—SiC. In this regard, as illustrated by a locus that expresses ionic strength of Si in FIG. 13, a concentration of Si is reduced significantly from the surface of the epi layer 22 through a position at the depth of about 50 nanometers, revealing that a compound of Al and Si such as an alloy or a mixture of Al and Si is formed in a region near the surface of the target object 2.

As a reference value, a broken line in FIG. 13 illustrates a secondary ion mass spectroscopy (SIMS) measurement result for a case where Al contained om a liquid phase is doped into 4H—SiC by irradiating with the laser beam 6 at an energy density F of 4.5 $J/cm^2$, in an aluminum chloride ($AlCl_3$) aqueous solution. Other conditions and methods regarding doping in a solution are disclosed by Ikeda Akihiro et al. ("Phosphorus doping of 4H—SiC by liquid immersion excimer laser irradiation" by Ikeda Akihiro et al., Applied Physics Letters, 102, 052104-1 to 052104-4 (January 2013)) and so on.

Figure 14A:
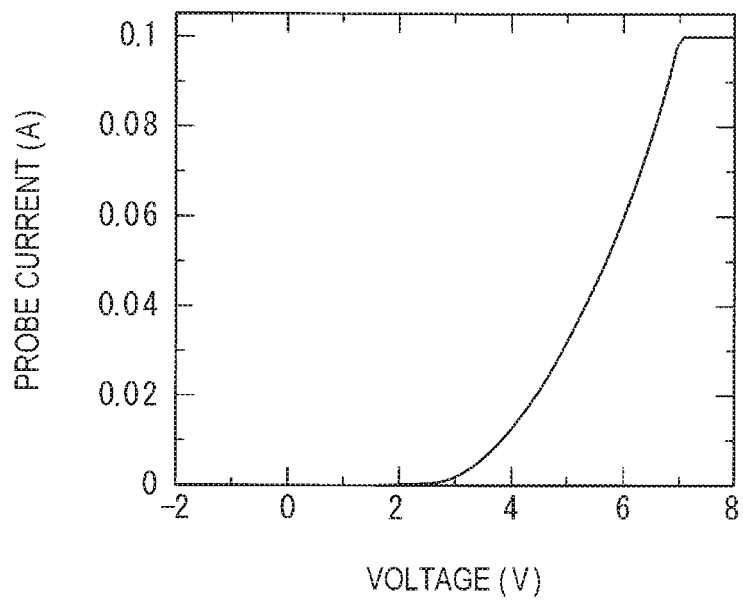
FIG. 14A and FIG. 14B are graphs illustrating I-V characteristics of an pn junction diode inside the semiconductor substrate in different scales, the semiconductor substrate being obtained by using the method for doping impurities according to the first embodiment.
Figure 14B:
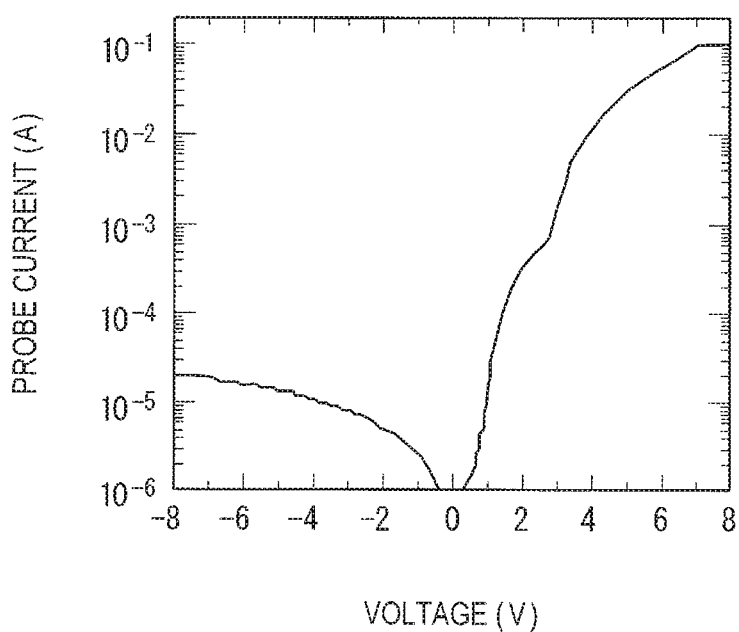

As illustrated in FIG. 13, a concentration at the surface of 4H—SiC through the doping with the $AlCl_3$ aqueous solution is $2 \times 10^{20}$ $cm^{-3}$ or lower, and the penetration depth into the target object 2 is nearly 40 nanometers. It is thus understood that laser doping from a solid phase using an Al thin film can obtain deeper doping depth at a higher concentration compared to doping from a liquid phase. Further, characteristics of a pn junction diode, which is formed by a $p^{++}$-type impurity doped region 2a formed by doping Al into 4H—SiC, and a region of the surface of the $n^-$-type epi layer 22, are measured by bringing a tungsten probe into contact with the impurity doped region 2a. The tungsten probe has an ohmic contact property with the impurity doped region 2a. As illustrated in FIG. 14A, initial voltage of the pn junction diode was nearly 2.5 V that is about built-in voltage of 4H—SiC serving as the target object 2. As illustrated in FIG. 14B, an on/off ratio of the pn junction diode has a rectifying property in about four digits, confirming that a sufficient pn junction is formed.

Comparative Example

FIG. 15 illustrates a SEM image of an upper surface of a solid target object 2 in which a p-type impurity doped region is formed in 4H—SiC by using a method for doping impurities according to a comparative example. FIG. 15 is an image of the comparative example, corresponding to FIG. 8 that illustrates the upper surface of the target object 2 in the method for doping impurities according to the first embodiment. In the comparative example, doping is performed by using a combination of an energy density F and a film thickness $t_f$, which lie in the outer area of the process window w, illustrated in the upper right side in FIG. 2, between the straight line of maximum film thickness L and the dotted line representing the lower limit of the film thickness in FIG. 2. The other doping conditions are similar to those in the case of the film thickness $t_f$=240 nanometers.

Figure 15B:
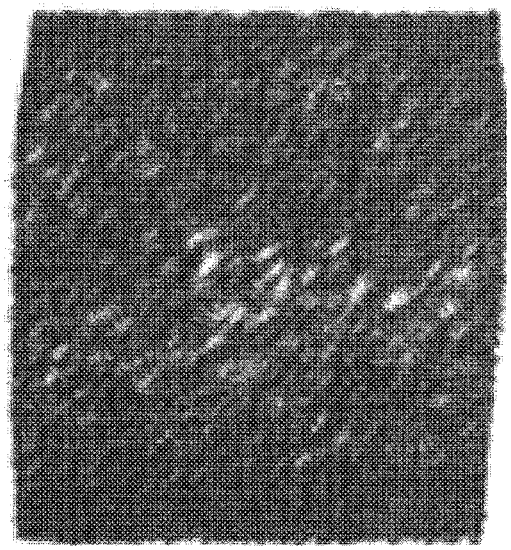
FIG. 15A and FIG. 15B are parts of SEM images illustrating states before removal of remaining source films on upper surfaces of impurity doped regions that are obtained by using the source films having different film thicknesses by a method for doping impurities according to a comparative example.
Figure 15A:
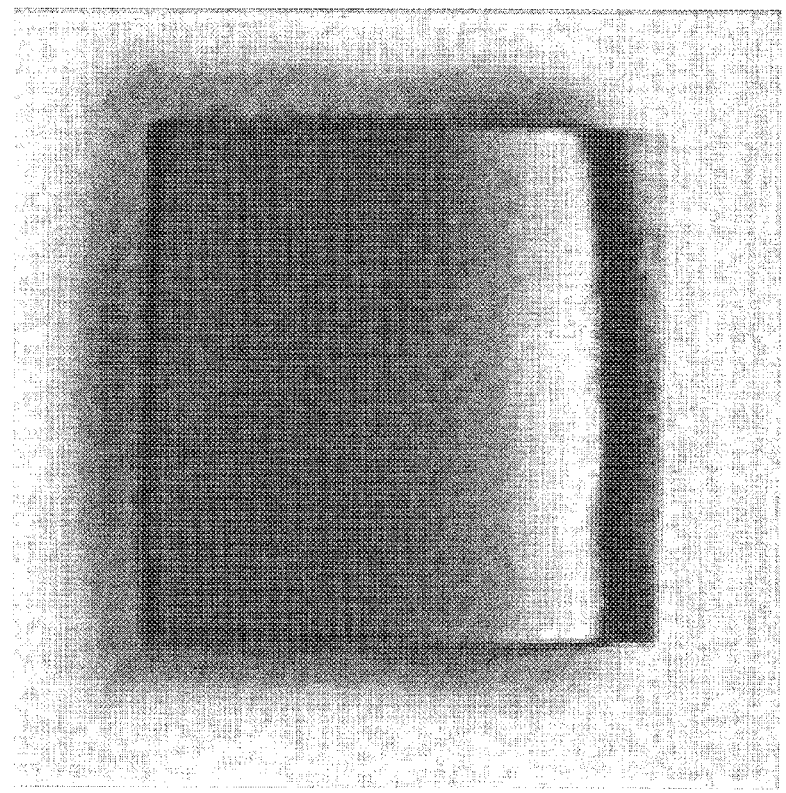

FIG. 15A is a top view of SEM image in the case of the plot c1 marked by a plus (+) in FIG. 2 (the film thickness $t_f$=120 nanometers). After light pulse irradiation with the energy density F=4.0 $J/cm^2$, the inner side of the outline of the shot is represented by a blackish color tone, and no metallic luster is illustrated. It is thus understood that the source film 4 does not remain. On the outer area of the outline of the shot, traces of Al that is melted and flown after light pulse irradiation are illustrated. In this case, as illustrated in a top view of SEM image in FIG. 16A, a discolored surface morphology is formed across a broad range of the irradiation area, and a large amount of recessed irregularities M and projecting irregularities 3 are formed and widely distributed.

FIG. 15B is a top view of SEM image in the case of the uppermost plot b1 (the film thickness $t_f$=8 ten nanometers) out of the three plots b1 to b3 marked by x in FIG. 2, and the inner side of the outline of the shot is represented by an extremely blackish color tone, and metallic luster is illustrated. On the outer side of the outline of the shot, traces of Al that is melted and flown after light pulse irradiation are not illustrated. In this case, as illustrated in a top view of SEM image in FIG. 16B, the upper surface of the target object 2 is not discolored at all, and no recessed irregularities M and projecting irregularities 3 are formed whatsoever.

Figure 17A:
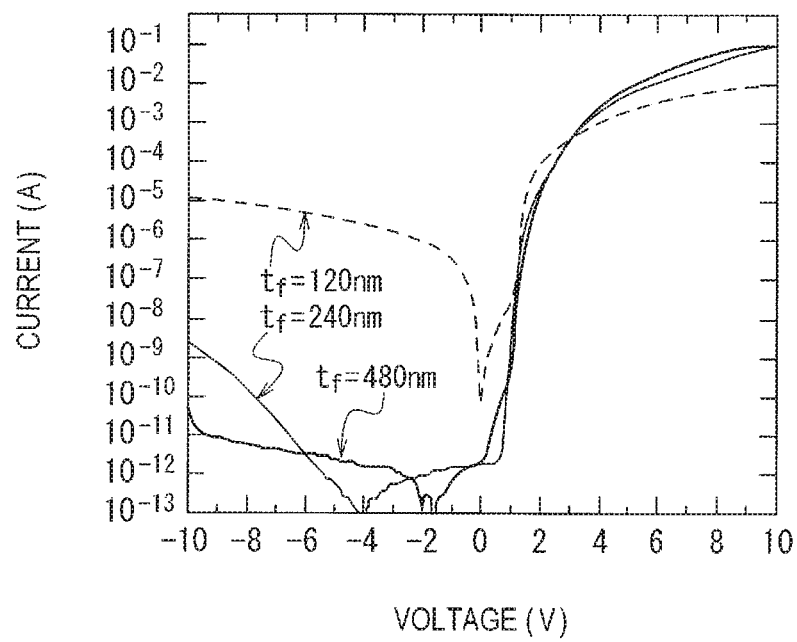
FIG. 17A and FIG. 17B are graphs illustrating I-V characteristics of pn junction diodes inside the semiconductor substrates in different scales, the semiconductor substrates being obtained by using the methods for doping impurities according to the first embodiment and the comparative example.
Figure 17B:
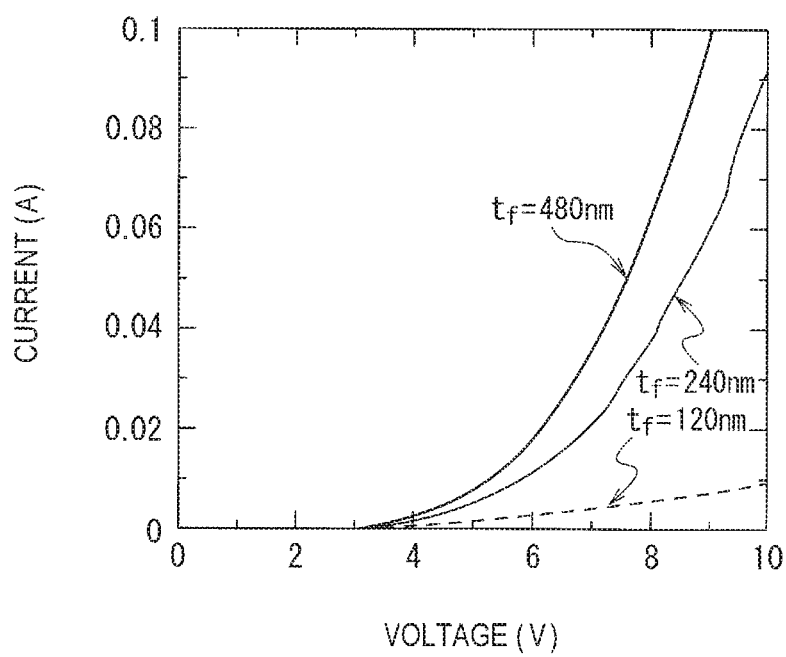

Here, in the cases where the film thicknesses $t_f$=240 nanometers and 480 nanometers according to the first embodiment, and in the case where the film thicknesses $t_f$=120 nanometers and 8 ten nanometers according to the comparative example, current was measured when various voltages were applied and diode characteristic is inspected. As illustrated in FIG. 17A, in any of the cases where the film thicknesses $t_f$=240 nanometers and 480 nanometers, the generation of a surface defect was restrained to a degree less than the case where the film thickness $t_f$=120 nanometers. Therefore, leakage current was small when reverse voltage was applied. As illustrated in FIG. 17B, in any of the cases where the film thicknesses $t_f$=240 nanometers and 480 nanometers, forward current was able to become larger than that in the case of the film thickness $t_f$=120 nanometers. In the case where the film thickness $t_f$=810 nanometers, when the tungsten probe was brought into contact with the top of the irradiation area to measure current, even with higher voltages, because current was detected only in a picoamperes (pA) level, the irradiation area on the surface of the target object 2 was scarcely doped.

With the method for doping impurities according to the first embodiment, irradiation is performed at room temperature and under atmospheric pressure with the energy density F per one shot of the light pulse in a high-energy state that is dramatically higher than the earlier technology. Then, lattice vibration in the light pulse irradiation area of the source film 4 is activated and temperature is increased instantly. At the same time, lattice vibration near the interface between the epi layer 22 of 4H—SiC serving as the target object 2, and the source film 4 is activated, and temperature is increased so that ablation of the surface of the epi layer 22 begins. Thus, doping of impurity elements into the surface of the epi layer 22 of 4H—SiC per shot under atmospheric pressure is promoted.

With the method for doping impurities according to the first embodiment, the thickness of the source film 4 before light pulse irradiation is set to a level that allows the source film 4 will remain after the light pulse irradiation is finished by taking into consideration that poor surface morphology with surface defect (roughness) in the epi layer 22 under the source film 4, which is ascribable to the influence of a high-energy light pulse, will be generated because the energy density F per shot of the light pulse is increased. Then, with the above consideration of the film thickness, the source film 4 is formed on the surface of the epi layer 22. Thus, even when the source film 4 is irradiated with the high-energy light pulse, because the source film 4 remains on the surface of the epi layer 22 after the irradiation, the surface defect state of the epi layer 22 within a given allowable range is controlled.

As a result, with the method for doping impurities according to the first embodiment, it is possible to dope impurity elements at a high concentration in a level of a latter half of $1 \times 10^{21}$, which is much higher than a normal solid-solubility limit concentration of 4H—SiC, on the surface of the epi layer 22 of 4H—SiC serving as the target object 2. At the same time, it is also possible to dope Al at about $1 \times 10^{20}$ cm$^{-3}$ or higher, spanning from the surface of the target object 2 to a depth of about 50 nanometers. Further, up to portions at the depths of 50 nanometers or deeper, it is possible to dope Al to depths in a level of 100 nanometers from the surface.

In this regard, when ions of the impurity element are accelerated at high voltage and implanted in crystal, it is difficult to dope impurity elements at $10^{19}$ cm$^{-3}$ or higher even in a range from a surface of a substrate to a depth of 30 nanometers. With the method for doping impurities according to the first embodiment, upper limit values of doping with the ion implantation method are exceeded with regard to both a concentration at an outermost surface and a penetration depth. Further, the method for doping impurities according to the first embodiment is advantageous in that both processes of heat treatment of a target object before implantation, and of high-temperature annealing after implantation, which are necessary for the ion implantation method, can be omitted.

Conventionally, when impurity elements are provided as a solid phase doping source on a target object 2 of 4H—SiC and irradiated with a laser beam 6 for laser doping, the laser doping is performed in a low-pressure ambient of about $6.7 \times 10^{-5}$ Pa. However, with the method for doping impurities according to the first embodiment, it is possible to dope impurity elements even under atmospheric pressure. Therefore, facility and workload burdens for establishing a low-pressure ambient are removed, and it is possible to achieve laser doping more easily and swiftly than the earlier technology.

—Method for Manufacturing a Semiconductor Device According to the First Embodiment—

A method for manufacturing a semiconductor device according to the first embodiment is explained with reference to FIGS. 4-7, 9, 12, and 18 used for explaining the method for doping impurities according to the first embodiment. For example, as similarly illustrated in FIG. 4, an intermediate product having the epi layer 22, which serves as a first semiconductor region having a first conductivity-type, is prepared as the target object 2. In the method for manufacturing a semiconductor device according to the first embodiment, the n-type is assigned as the first conductivity-type, and the p-type, which is opposite to the first conductivity-type, is assigned as the second conductivity type. Thereafter, as similarly illustrated in FIG. 5, the source film 4 containing a second conductivity-type impurity element is formed on the upper surface of the first semiconductor region having the first conductivity-type on the side of the n$^-$-type epi layer 22.

Next, as similarly illustrated in FIG. 6, the upper surface of the epi layer 22, that is the first semiconductor region, is scanned and irradiated with a light pulse of the laser beam 6 through the source film 4. At this time, the upper surface of the epi layer 22 is scanned and irradiated by the laser beam 6, impurity elements of a second conductivity type are doped into an upper part of the epi layer 22, a p$^{++}$-type second semiconductor region 2a is formed selectively in a desired pattern, thereby obtaining a pn junction. Scanning may be carried out by moving the X-Y motion stage 23 as illustrated by the two-way arrow inside the X-Y motion stage 23 in FIG. 1, or by moving the beam adjusting system 33. Patterning of the second semiconductor region 2a may be carried out as follows. The source film 4 is delineated into a desired pattern on the surface of the epi layer 22 in advance, and then irradiation is scanned along the pattern on the film. Alternatively, the source film 4 may be formed on the entire surface of the epi layer 22, and then the irradiation may be scanned along a desired pattern.

Figure 18:
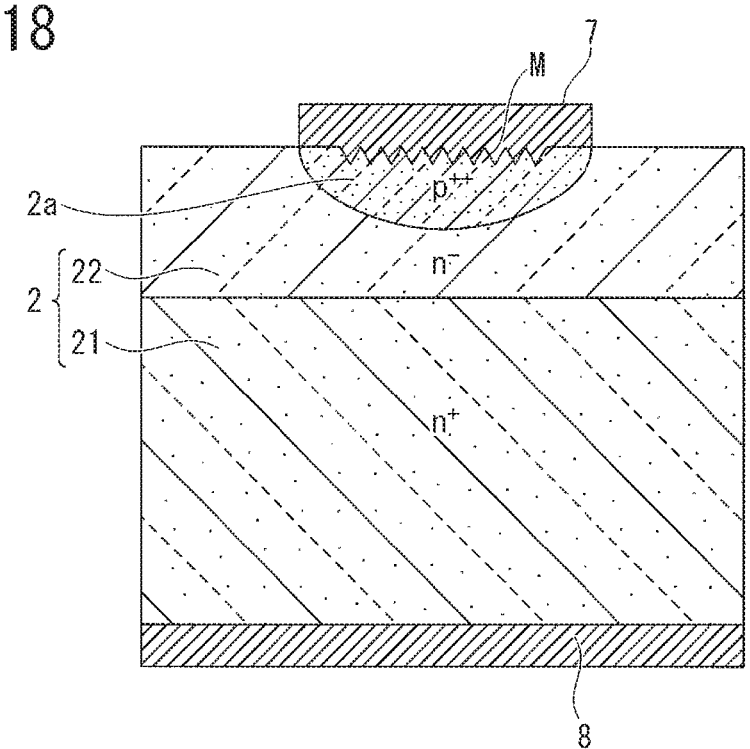
FIG. 18 is a process sectional view explaining a method for manufacturing a semiconductor device according to the first embodiment.

Next, as similarly illustrated in FIG. 9, the source film 4 remaining on the surface of the epi layer 22 is removed, and thereafter, as similarly illustrated in FIG. 12, the projecting irregularities 3 adhered on the surface of the epi layer 22 are removed, thereby exposing the second semiconductor region 2a. Then, as illustrated in FIG. 18, an anode electrode film 7, such as a laminated film of, for example, nickel (Ni), titanium (Ti), and Al, which can establish an ohmic contact with the second semiconductor region 2a, is joined and delineated on top of the exposed second semiconductor region 2a. On a back surface of the semiconductor substrate 21, a cathode electrode film 8 made from, for example, Ni, is doped.

Thereafter, annealing was performed in vacuum at 875° C. for about six minutes, thereby making the anode electrode film 7 as an electrode film of, for example, Ti$_3$Si$_3$C$_2$. Thus, the method for manufacturing a semiconductor device according to the first embodiment finishes. In the method for manufacturing a semiconductor device according to the first embodiment, it is possible to manufacture various kinds of semiconductor devices by combining different types of impurity elements to be doped, different concentrations, and different irradiation patterns to be delineated.

With the method for manufacturing a semiconductor device according to the first embodiment, the film thickness $t_f$ of the source film 4 is adjusted so as to control a defect state generated at the surface of the target object 2, and it is thus possible to overcome the problem caused by the use of a high-energy light pulse. Also, an increase in speed of laser doping of a solid phase impurity element and higher quality of a semiconductor device are both achieved. Even with a single shot of a light pulse, it is possible to form a doped region of impurity elements at a sufficient depth and a surface concentration that exceeds a solid-solubility limit concentration. Therefore, working hours required for delineating of a semiconductor region is significantly reduced, and, at the same time, semiconductor devices maintaining certain quality are mass-produced efficiently.

Moreover, with the method for manufacturing a semiconductor device according to the first embodiment, a semiconductor region is formed by doping impurity elements from the surface of the target object 2 to a very deep position and at a high concentration. Therefore, it is possible to obtain semiconductor devices suitable for power semiconductor devices and so on in which large current capability is required.

(The First Modified Example of the Method for Manufacturing a Semiconductor Device According to the First Embodiment)

In the method for manufacturing a semiconductor device according to the first embodiment, the explanation was given in the example case where the intermediate product having the first conductivity-type (n-type) first semiconductor region serves as the target object 2, and the p$^{++}$-type impurity element is doped into the n$^-$-type epi layer 22 of the target object 2. On the contrary, as illustrated in FIG. 19 to FIG. 22, for example, in an intermediate product having a second conductivity type (p-type) first semiconductor region as a base layer 73, a p$^{++}$-type second semiconductor region is formed as a base contact region 74a inside the p-type base layer 73, at a higher concentration than that of the base layer 73. Thus, it is possible to structure a part of a method for manufacturing a MOSFET.

Figure 19:
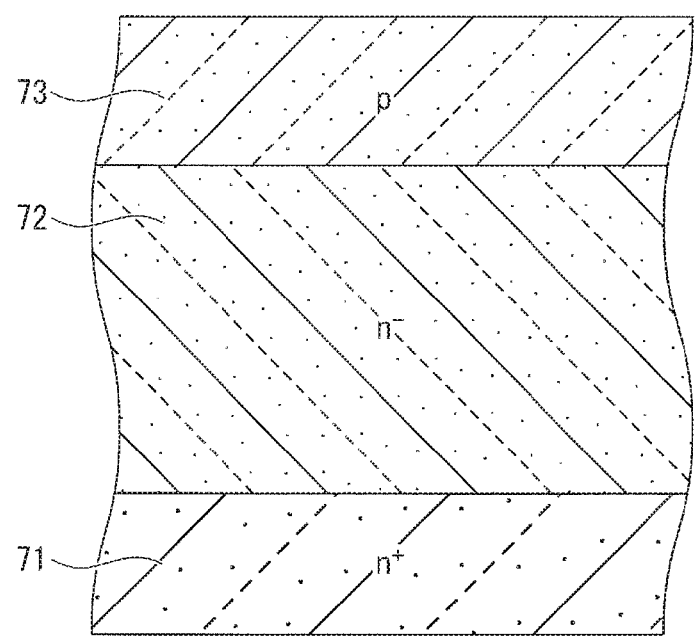
FIG. 19 a process sectional view explaining the first modified example of the method for manufacturing a semiconductor device according to the first embodiment (No. 1)
Figure 20:
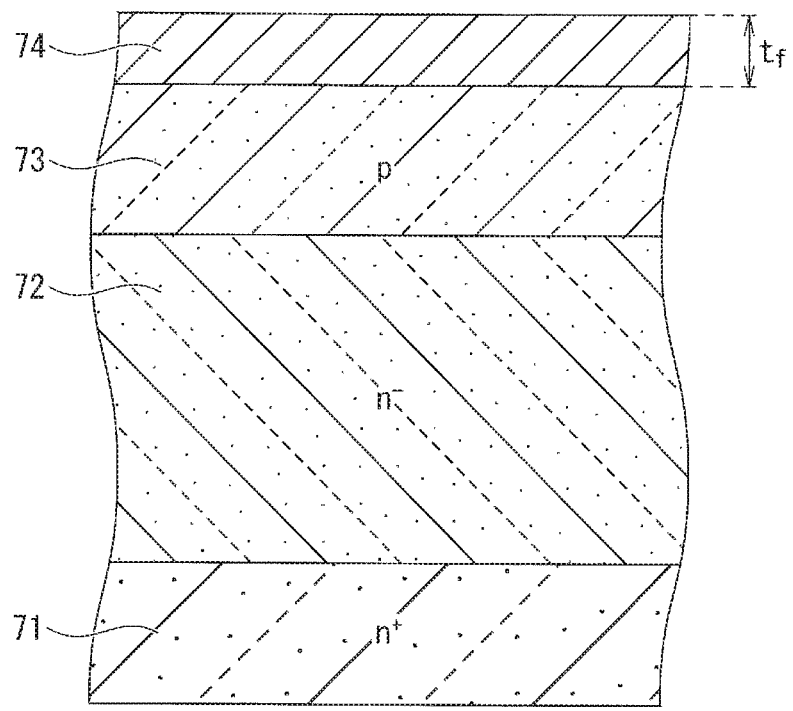
FIG. 20 is a process sectional view explaining the first modified example of the method for manufacturing a semiconductor device according to the first embodiment (No. 2)

In this case, as illustrated in FIG. 19 first, an intermediate product is prepared, which is obtained by forming an n$^-$-type drift layer 72 through epitaxial growth on a drain region 71, and further forming the p-type base layer 73 on the drift layer 72 through continuous epitaxial growth. Thereafter, as illustrated in FIG. 20, source film 74 containing a second conductivity type impurity element is formed on an upper surface of the second conductivity type base layer 73 so as to have a film thickness $t_f$ decided in consideration of irradiation time τ and an energy density F per light pulse.

Next, the source film 74 is irradiated with a light pulse of a laser beam 6 through the source film 74. At this time, the upper surface of the base layer 73 is scanned and irradiated by the laser beam 6, the second conductivity type impurity element is doped into an upper part of the base layer 73, and the p$^{++}$-type base contact region 74a is selectively formed in a desired pattern at a higher concentration than that of the base layer 73. Methods for scanning with the laser beam 6 and patterning of the base contact region 74a are based on the method for manufacturing a semiconductor device illustrated in FIG. 6 and so on.

Figure 21:
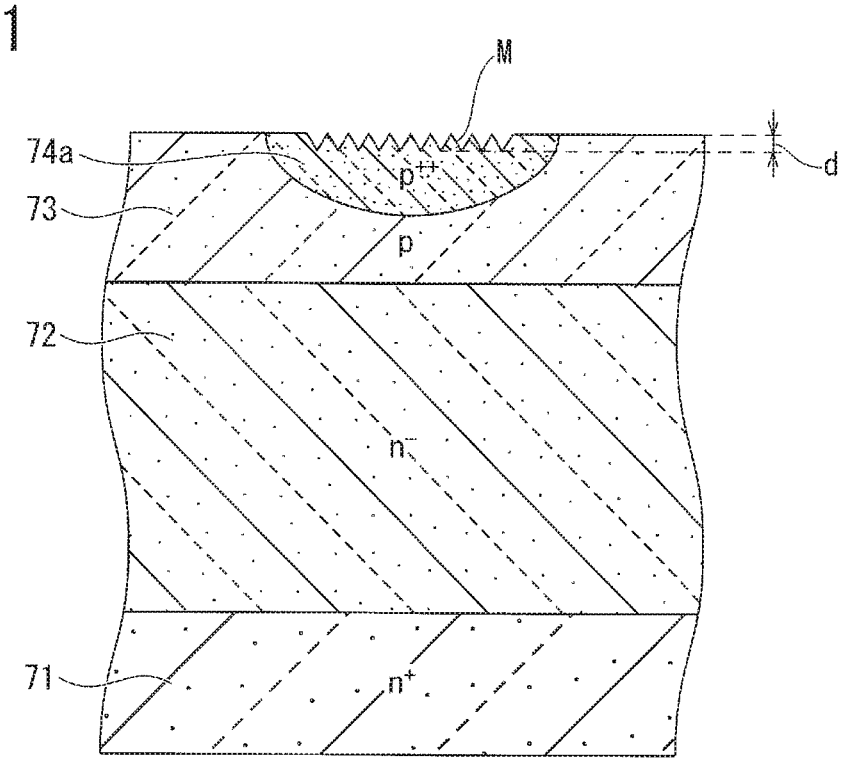
FIG. 21 is a process sectional view explaining the first modified example of the method for manufacturing a semiconductor device according to the first embodiment (No. 3)
Figure 22:
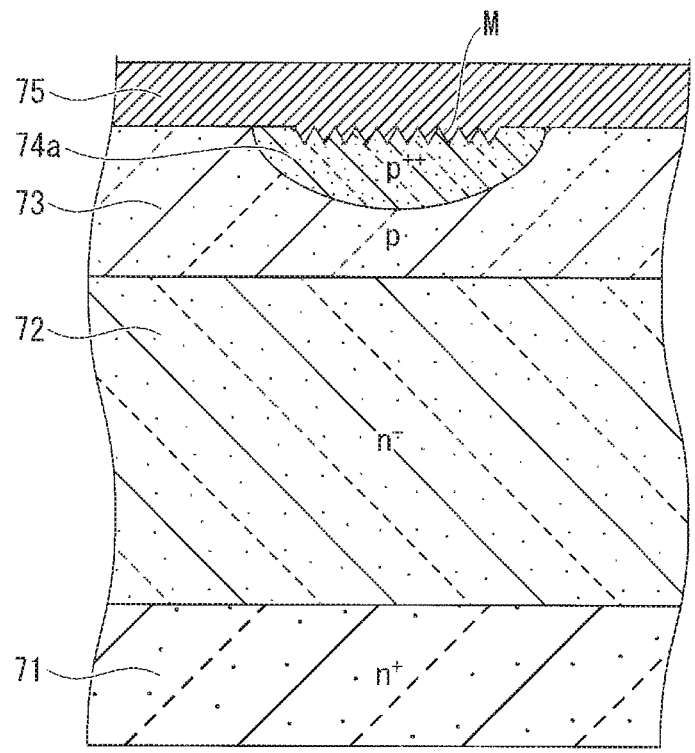
FIG. 22 is a process sectional view explaining the first modified example of the method for manufacturing a semiconductor device according to the first embodiment (No. 4)

Next, the source film 74 remaining on the surfaces of the base layer 73 and the base contact region 74a is removed. Thereafter, as illustrated in FIG. 21, projecting irregularities 3 adhered on the surface of the base contact region 74a are removed. Then, after steps of forming a source region, forming an U-shaped groove passing through the base layer 73, forming a gate insulation film on an inner side of the U-shaped groove, forming of a gate electrode on the top of the gate insulation film, and so on, which are not illustrated, a source electrode film 75 is formed on the exposed base layer 73 and base contact region 74a as illustrated in FIG. 22. The source electrode film 75 is, for example, a laminated film of, for example, Ni, Ti, and Al, and has an ohmic contact with the base layer 73 and the base contact region 74a. Then, a drain electrode film (not illustrated) is formed on a back surface of the drain region 71. Thus, the manufacturing process for MOSFET, which is a semiconductor device according to the first embodiment, ends.

With the method for manufacturing MOSFET using the method for manufacturing a semiconductor device according to the first modified example, it is possible to form the base contact region 74a swiftly inside the base layer 73 on the surface of the intermediate product at an extremely higher concentration compared to that of the base layer 73. Thus, it is possible to mass-produce MOSFET effectively while maintaining a quality.

(The Second Modified Example of the Method for Manufacturing a Semiconductor Device According to the First Embodiment)

Figure 31:
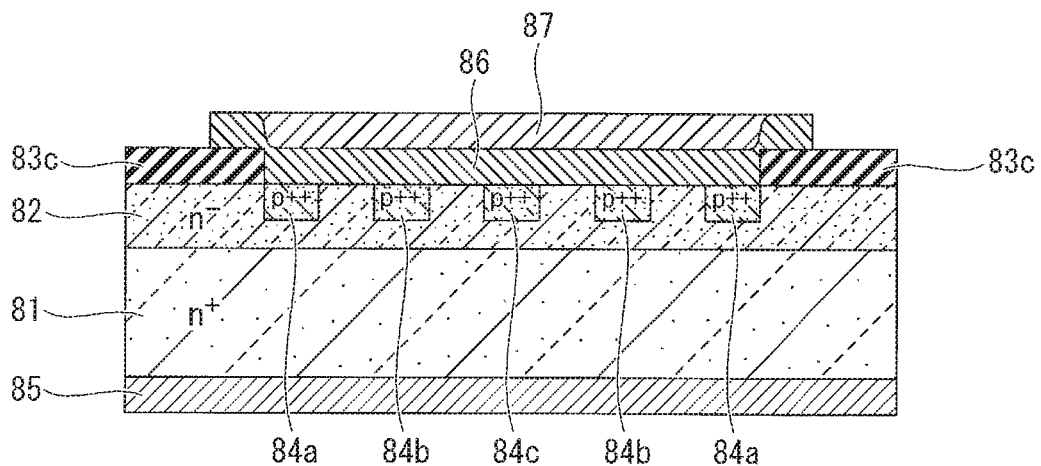
FIG. 31 is a process sectional view explaining the second modified example of the method for manufacturing a semiconductor device according to the first embodiment (No. 8)
Figure 32:
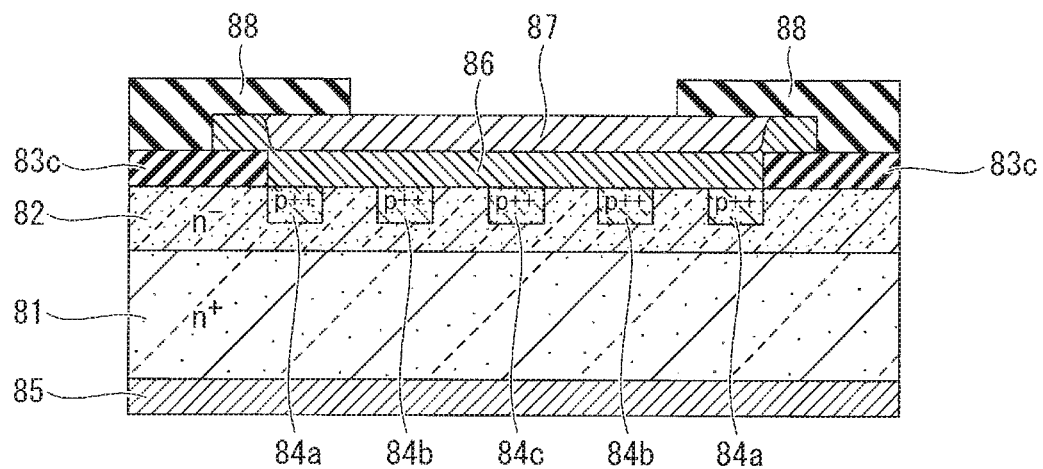
FIG. 32 is a process sectional view explaining the second modified example of the method for manufacturing a semiconductor device according to the first embodiment (No. 9)

When the method for doping impurities according to the first embodiment is used, it is possible to manufacture a semiconductor device (diode) in which a pn junction in parallel to a main surface is structured by forming p$^{++}$-type second semiconductor regions 84a to 84c at a high concentration in a desired arbitral pattern in an upper part of an epitaxial growth layer (epi layer) 82 as illustrated in FIG. 32. Herein below, by using FIG. 23 to FIG. 33, explanation is given regarding a method in which an intermediate product having a first conductivity-type (n-type) first semiconductor region as an epi layer 82 is prepared, and a impurity doping mask is provided so as to carry out selective laser doping. The impurity doping mask has a first doping stopper pattern 83a, a second doping stopper pattern 83b, and a third doping stopper pattern 83c between an n-type epi layer 82 of the intermediate product and the source film 84 as barriers that selectively inhibit doping of impurity elements.

Figure 23:
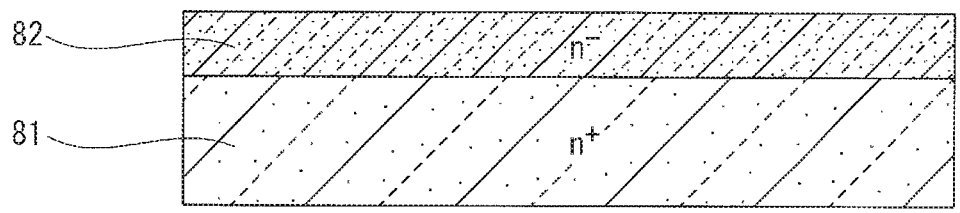
FIG. 23 is a process sectional view explaining the second modified example of the method for manufacturing a semiconductor device according to the first embodiment (No. 1)

First of all, as illustrated in FIG. 23, the intermediate product is prepared, configured to provide the epi layer 82 that is formed on the n$^+$-type semiconductor substrate 81 through epitaxial growth of an n$^-$-type semiconductor region. The epi layer 82 may have a concentration of about $1\times10^{16}$ cm$^{-3}$ and a thickness of about ten micrometers. Thereafter, a thin film made of silicon oxide (SiO$_2$) is formed on an upper surface of the epi layer 82 by, for example, plasma enhanced CVD (PECVD). Then, a photoresist film is applied on the formed SiO$_2$ film, the applied photoresist film is patterned using a photolithography technology. The thin film is etched using the patterned photoresist film as a mask, and is thus formed into a desired pattern. In a case where the thin film is a SiO$_2$ film, etching can be performed by using, for example, buffered hydrofluoric acid (BHF) that is an aqueous solution containing the ammonium fluoride (NH$_4$F) and hydrofluoric acid (HF).

Figure 24:
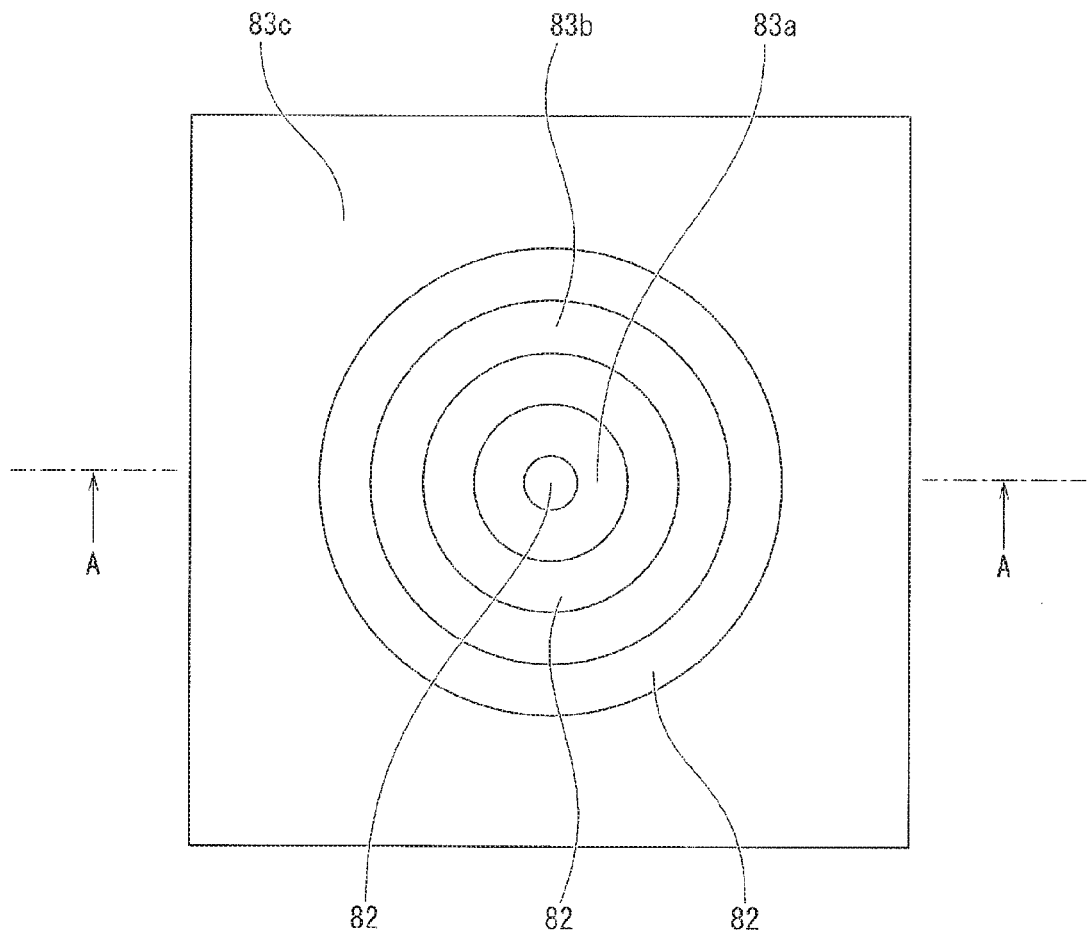
FIG. 24 is a process top view explaining the second modified example of the method for manufacturing a semiconductor device according to the first embodiment (No. 2)

The top view (plan view) in FIG. 24 illustrates an example case where a pattern, configured to provide an annular first doping stopper pattern 83a, an annular second doping stopper pattern 83b, and a frame-shaped third doping stopper pattern 83c, is formed by etching a thin film. The annular first doping stopper pattern 83a is formed in the center of the main surface of the epi layer 82, the annular second doping stopper pattern 83b is formed concentrically with the first doping stopper pattern 83a and on an outer side of the first doping stopper pattern 83a through a gap serving as a doping window part. The frame-shaped third doping stopper pattern 83c is formed on an outer side of the second doping stopper pattern 83b through a gap serving as a doping window part. The first doping stopper pattern 83a, the second doping stopper pattern 83b, and the third doping stopper pattern 83c structure an "impurity doping mask" according to the present invention.

Figure 25:
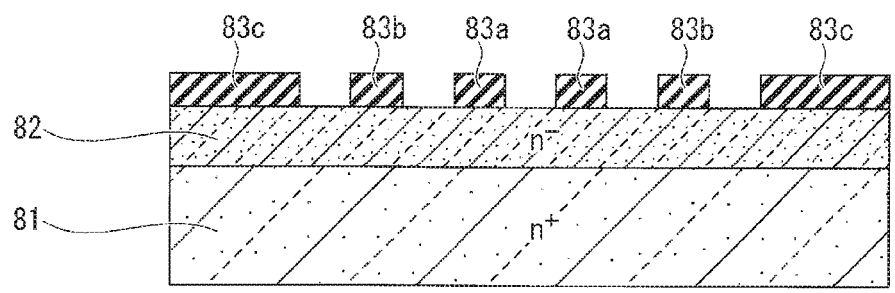
FIG. 25 is a process sectional view in the A-A direction in FIG. 24.

The gap between the first doping stopper pattern 83a and the second doping stopper pattern 83b, and the gap between the second doping stopper pattern 83b and the third doping stopper pattern 83c have a given interval, and respectively serve as window parts for selective doping of impurity elements. As illustrated in FIG. 25, parts of the upper surface of the epi layer 82 are exposed in the respective gaps. Widths of the gaps serving as the window parts illustrated as examples in FIG. 24 and FIG. 25 are equal to each other, and are set in consideration of a stretching state of depletion layers generated due to the pn junctions of the epi layer 82 and the second semiconductor regions 84a to 84c. Therefore, in reality, the widths of the gaps are not limited to the examples and may be changed as appropriate.

Figure 26:
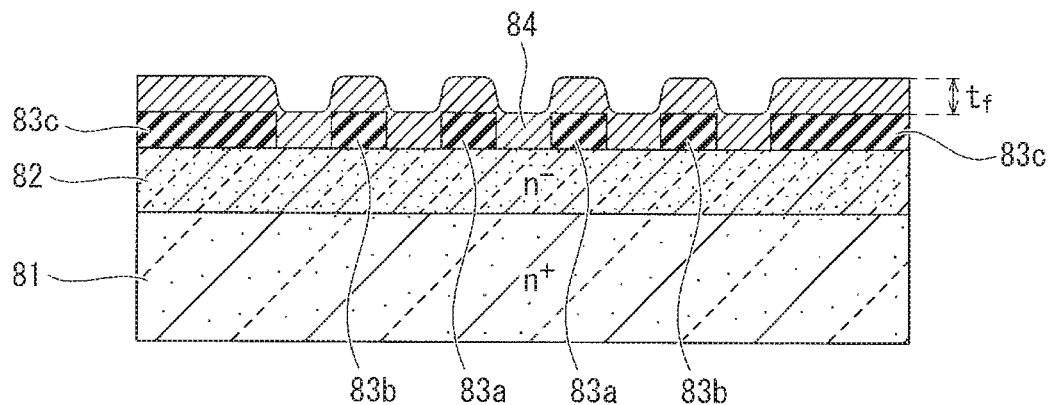
FIG. 26 is a process sectional view explaining the second modified example of the method for manufacturing a semiconductor device according to the first embodiment (No. 3)

Next, as illustrated in FIG. 26, source film 84 containing a second conductivity type impurity element is formed on the epi layer 82 through the first doping stopper pattern 83a, the second doping stopper pattern 83b, and the third doping stopper pattern 83c. A film thickness $t_f$ of the source film 84 is decided in consideration of irradiation time τ and an energy density F per shot of a light pulse. In a case where the impurity element is Al, the film thickness $t_f$ is, for example, about 240 nanometers. The thickness of the epi layer 82 and the thickness of the source film 84 illustrated in FIG. 26 are approximately equal for convenience of explanation.

Figure 27:
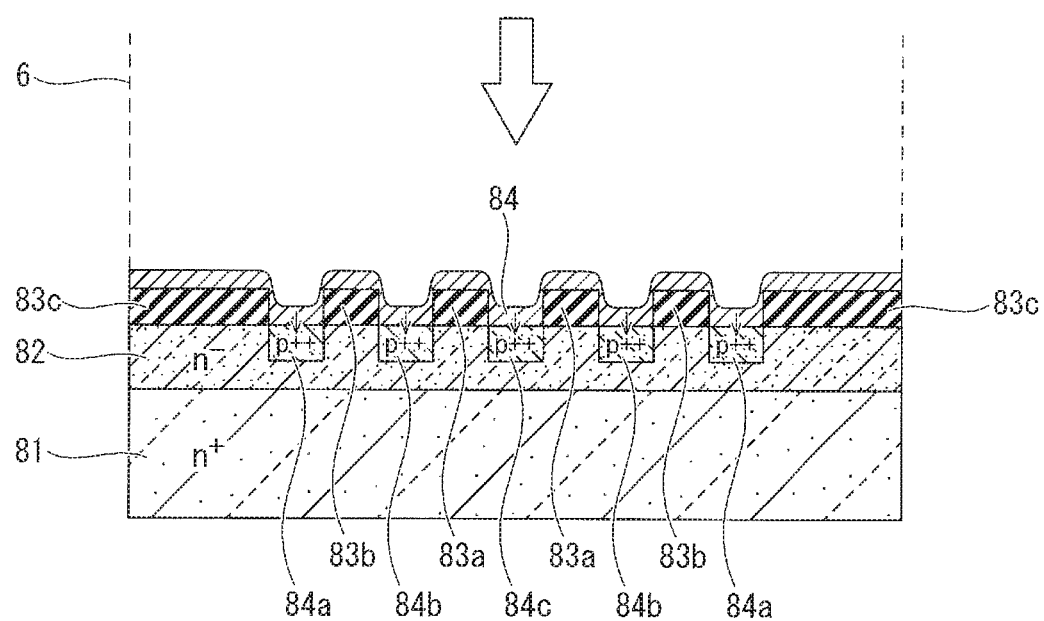
FIG. 27 is a process sectional view explaining the second modified example of the method for manufacturing a semiconductor device according to the first embodiment (No. 4)

Next, as illustrated in FIG. 27, irradiation is performed with a light pulse of a KrF excimer laser serving as the laser beam 6 through the source film 84 in the atmosphere. In the case where the impurity element is Al, the energy density F of the light pulse is, for example, 4.0 J/cm², and the shot number is once. Irradiation by the light pulse is performed while forming the beam so that an irradiation range of one shot includes the entire region on the inner side of the flame of the third doping stopper pattern 83c without exception. FIG. 27 illustrates a state where all of the surfaces of the first doping stopper pattern 83a, the second doping stopper pattern 83b, and the third doping stopper pattern 83c are irradiated with the light pulse.

Due to the light pulse irradiation, the $p^{++}$-type impurity element is selectively doped into the upper part of the epi layer 82 exposed in the gap between the first doping stopper pattern 83a and the second doping stopper pattern 83b, through the deposited source film 84. Also, the $p^{++}$-type impurity element is selectively doped into the upper part of the epi layer 82 exposed in the gap between the second doping stopper pattern 83b and the third doping stopper pattern 83c, through the deposited source film 8.

As a result, in the upper part of the epi layer 82, upper surfaces of the semiconductor regions 84a to 84c, in which the $p^{++}$-type impurity element is selectively doped, and the upper surface of the epi layer 82 in which the $p^{++}$-type impurity element is not doped, are illustrated alternately at equal intervals in a concentric planar pattern. In other words, a surface pattern is structured on the upper part of the epi layer 82, the surface pattern having an n-type semiconductor region and a p-type semiconductor region that are formed repeatedly within a plane parallel to the main surface. Widths of the $p^{++}$-type semiconductor regions 84a to 84c and widths of the gaps among the $p^{++}$-type semiconductor regions 84a to 84c may be changed and set as appropriate.

Figure 28:
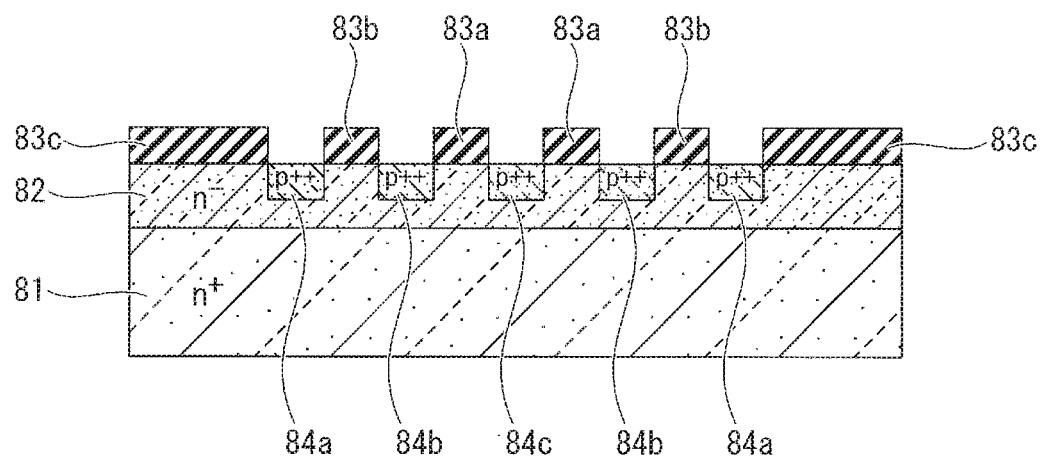
FIG. 28 is a process sectional view explaining the second modified example of the method for manufacturing a semiconductor device according to the first embodiment (No. 5)
Figure 29:
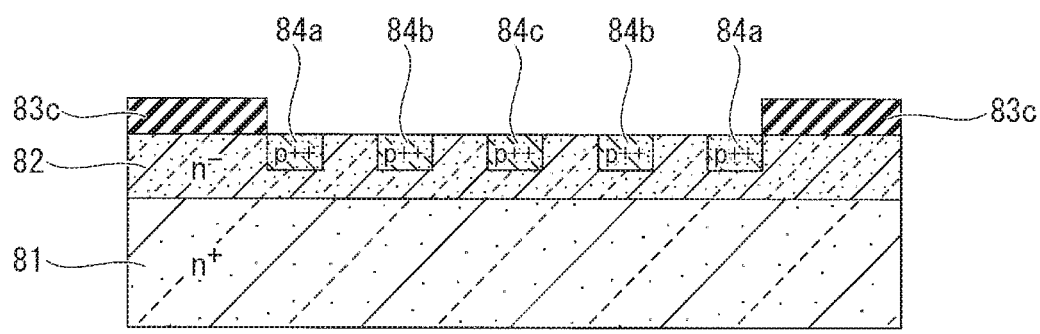
FIG. 29 is a process sectional view explaining the second modified example of the method for manufacturing a semiconductor device according to the first embodiment (No. 6)

Next, as illustrated in FIG. 28, a part of the source film 84 remaining on the first doping stopper pattern 83a, the second doping stopper pattern 83b, and the third doping stopper pattern 83c is removed by using given etchant. Thereafter, projecting parts like those illustrated in FIG. 9, which are generated and adhered on the surfaces of the $p^{++}$-type semiconductor regions 84a to 84c, are removed. In the case where the source film 84 is Al, it is possible to use, for example, hot phosphoric acid ($H_3PO_4$) or the like at about 75° C. as etchant. In addition, various other acids such as a liquid mixture of phosphoric acid/nitric acid/acetic acid and an aqua regia may be used.

Next, a photoresist film is applied on the upper surface of the epi layer 82, and the upper surfaces of the first doping stopper pattern 83a, the second doping stopper pattern 83b, and the third doping stopper pattern 83c. Then, the photoresist film is patterned by using a photolithography technology. Then, the patterned photoresist film is used as a mask, and the impurity doping mask remaining on the upper surface of the epi layer 82 is selectively removed by etching with BHF, and then the photoresist film is removed. Thus, as illustrated in the example in FIG. 29, a pattern is formed, in which only the third doping stopper pattern 83c remains. In other words, the first doping stopper pattern 83a and the second doping stopper pattern 83b are removed, and a circular opening is formed in a planar pattern. An upper surface of a region of the upper part of the epi layer 82, in which the $p^{++}$-type semiconductor regions 84a to 84c are formed concentrically, is exposed in this opening.

Figure 30:
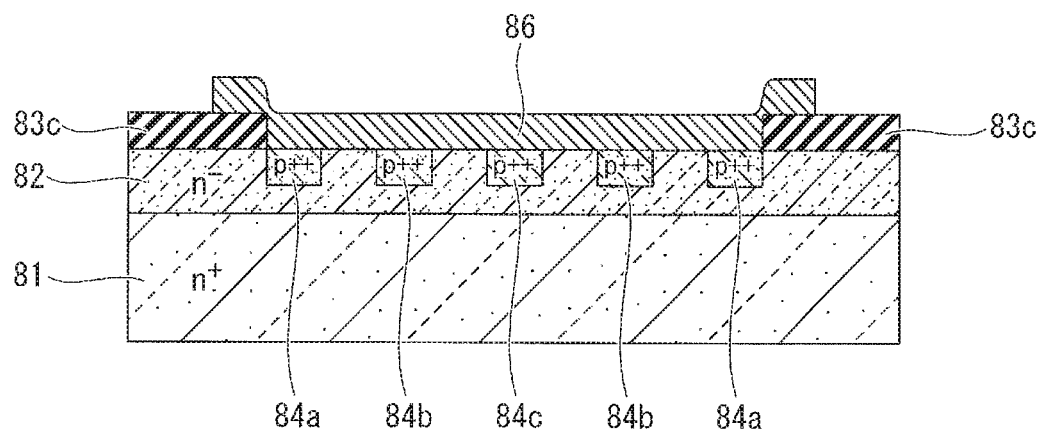
FIG. 30 is a process sectional view explaining the second modified example of the method for manufacturing a semiconductor device according to the first embodiment (No. 7)

Next, as illustrated in FIG. 30, a metal film of, for example, Ti is formed so as to cover the region of the epi layer 82 in which the $p^{++}$-type semiconductor regions 84a to 84c are formed concentrically. Then, the semiconductor substrate 81 is annealed at given temperature and for a given period of time, thereby forming an anode electrode film 86 on the surface side. FIG. 30 illustrates an example case where the anode electrode film 86 is laminated on the upper surface of the region of the epi layer 82 in which the $p^{++}$-type semiconductor regions 84a to 84c are formed. The anode electrode film 86 is also laminated on an upper surface of a partial region on an inner edge side of the third doping stopper pattern 83c, thereby forming a periphery edge part of the anode electrode film 86. An interface between a circular region of the epi layer 82 on the inner side of the third doping stopper pattern 83c, and the anode electrode film 86 makes a Schottky interface, and the $p^{++}$-type semiconductor regions 84a to 84c and the anode electrode film 86 are in ohmic contact in their interfaces.

Next, as illustrated in FIG. 31, an electrode pad 87 is formed on an upper surface of the anode electrode film 86 on the Schottky interface. Thereafter, a metal film of, for example, Ni is formed on a surface of the semiconductor substrate 81 on the opposite side of the epi layer 82, which is a back surface of the semiconductor device. Then, given annealing is performed on the semiconductor substrate 81, thereby forming a cathode electrode film 85 on the back surface side.

Next, a polyimide film or the like is deposited on the entire surface on the epi layer 82 side, thereby forming a passivation film 88. The third doping stopper pattern 83c remaining on the surface of the epi layer 82 is used as an interlayer insulation film. However, an additional $SiO_2$ film may also be laminated by a CVD method and so on so as to form a necessary thickness as the interlayer insulation film.

Next, as illustrated in FIG. 32, a part of the passivation film 88 on the electrode pad 87 may be opened by a photolithography technology and an etching technology. Thereafter, the semiconductor substrate 81 is diced into a plurality of chips, wire-bonded through the electrode pad 87, and mounted on a package. Then, the manufacturing process for a semiconductor device according to the second modified example ends.

Figure 33:
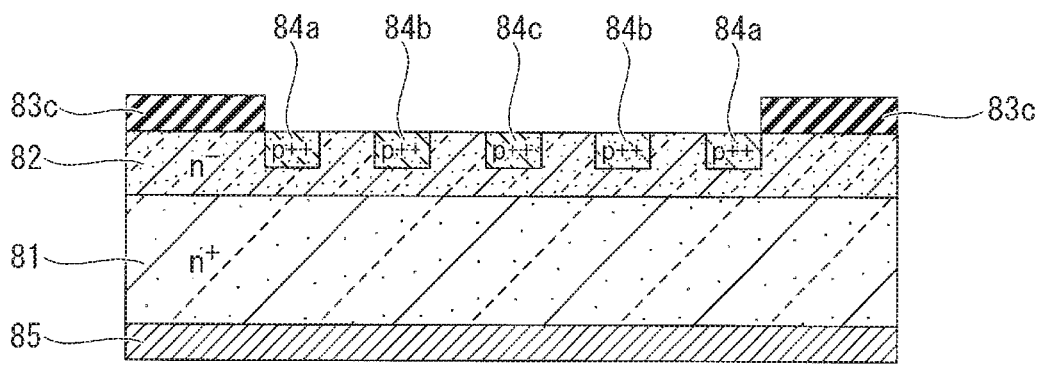
FIG. 33 is a process sectional view explaining a process in a case where a cathode electrode film is formed first in the method for manufacturing a semiconductor device according to the second modified example.

In order to improve characteristics of the Schottky junction between the epi layer 82 and the anode electrode film 86, and characteristics of the ohmic contact between the semiconductor substrate 81 and the cathode electrode film 85, temperature of annealing after deposition of the anode electrode film 86 is decreased to be lower than that for the cathode electrode film 85. In such a case, as illustrated in FIG. 33, the anode electrode film 86 illustrated in FIG. 30 may be formed after the cathode electrode film 85 is formed. Thereafter, the processes explained in FIG. 31 and FIG. 32 may be carried out. At this time, for example, annealing temperature for the cathode electrode film 85 may be set to 900° C., and annealing temperature for the anode electrode film 86 may be set to 500° C.

Figure 34:
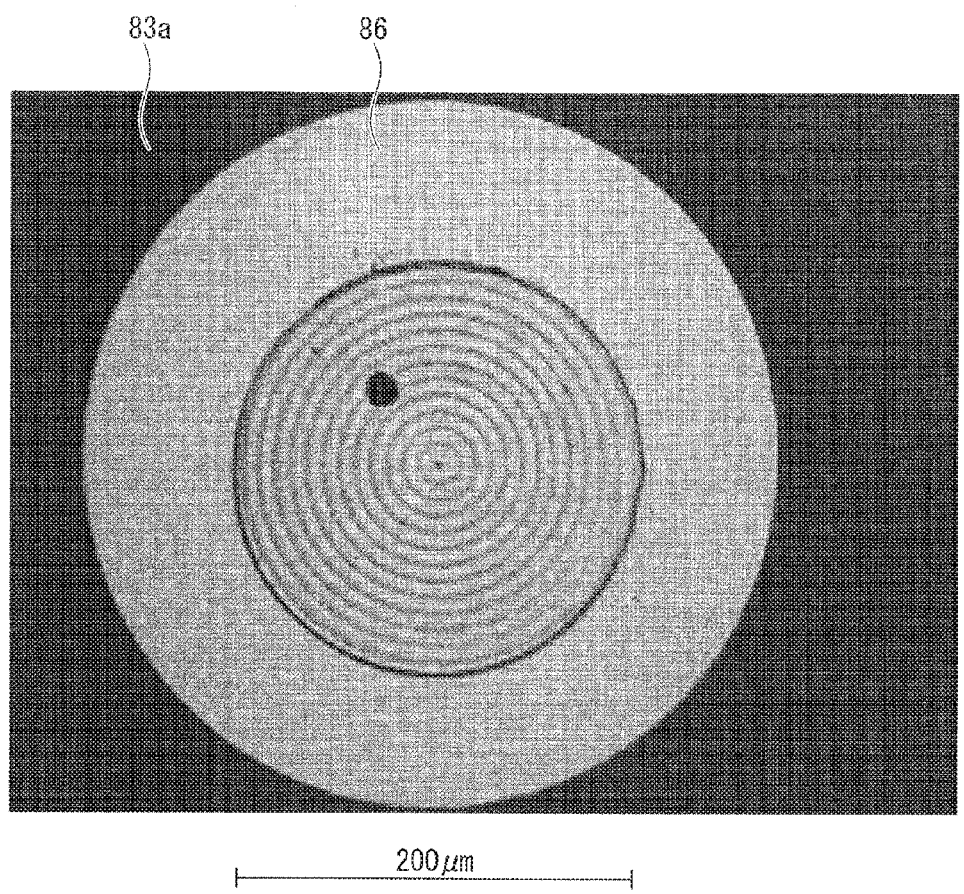
FIG. 34 is a top view under an optical microscope illustrating a state where a semiconductor device according to Example 1, which is obtained by using the method for manufacturing a semiconductor device according to the second modified example, is horizontally cut at a height of an upper surface of an anode electrode film.

As Example 1 of the second modified example, FIG. 34 illustrates an example of a semiconductor device having a circular Schottky interface of about 200 micrometers in a planar pattern. On the inner side of the circle, Al, which is a p-type impurity element, is selectively doped so that the upper surfaces of the $p^{++}$-type semiconductor regions 84a to 84c and the upper surface of a part of the epi layer 82 are illustrated concentrically with widths of about 4 micrometers. In other words, the semiconductor device according to Example 1 is a diode in which the pn junctions formed on the upper part of the epi layer 82 in parallel to the main surface form a so-called junction barrier Schottky structure. Voltage was applied to the surface and the back surface of the semiconductor device according to the Example 1, and current flowing vertically between the surface and the back surface was measured.

Figure 35:
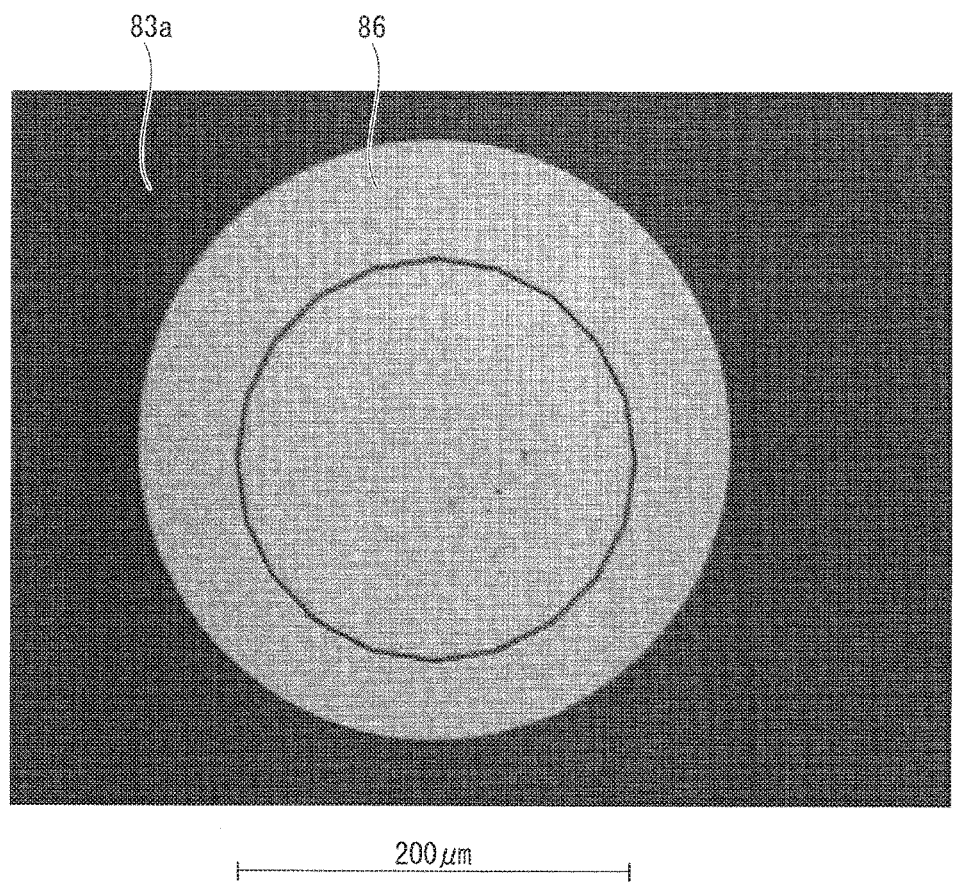
FIG. 35 is a top view under an optical microscope illustrating a state where a semiconductor device according to a comparative example is horizontally cut at a height of an upper surface of an anode electrode film.

Meanwhile, processes similar to those explained in FIG. 23 to FIG. 33 were carried out except the laser doping of the $p^{++}$-type semiconductor regions 84a to 84c. Then, as illustrated in FIG. 35, a semiconductor device, in which the pattern of the selective $p^{++}$-type semiconductor regions is not formed, was manufactured as a comparative example. In other words, the semiconductor device according to the comparative example is a normal Schottky barrier diode (SBD). In the semiconductor device according to the comparative example, voltage was applied and current was measured similarly to the semiconductor device according to Example 1.

Figure 36:
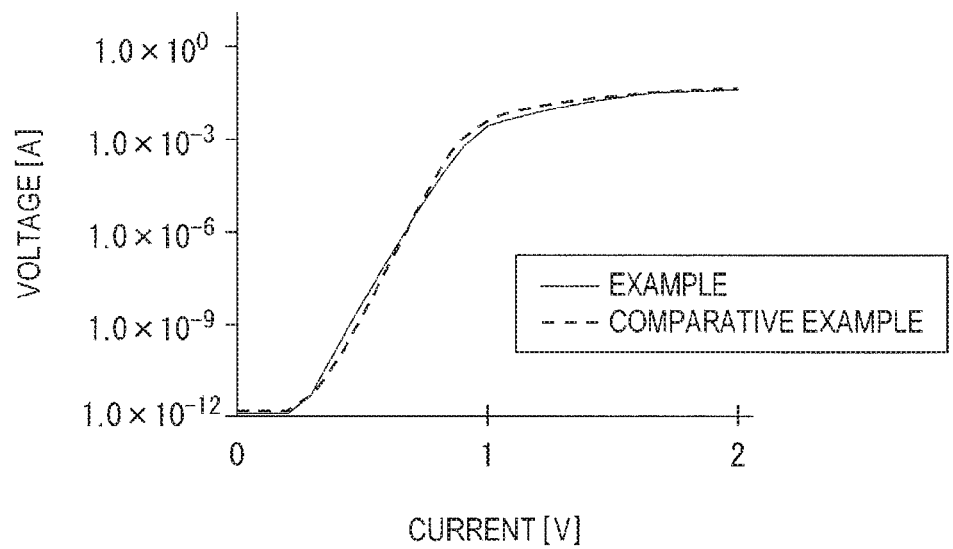
FIG. 36 is a graph illustrating I-V characteristics in positive voltage regions of the semiconductor devices according to Example 1 and the comparative example, respectively.
Figure 37:
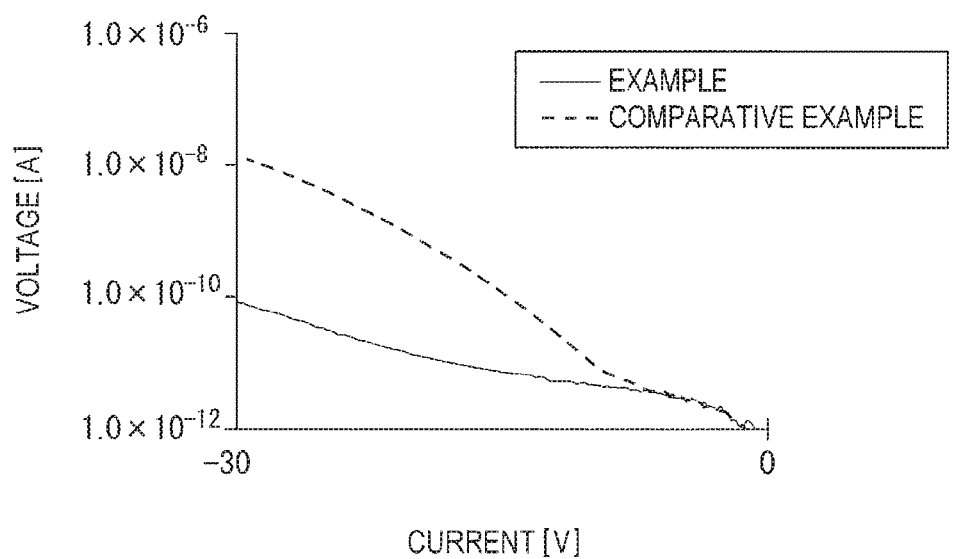
FIG. 37 is a graph illustrating I-V characteristics in negative voltage regions of the semiconductor devices according to Example 1 and the comparative example, respectively.

As illustrated by the solid-line locus in FIG. 36, when positive voltage (forward bias) was applied, current flowing in the semiconductor device according to Example 1 was almost equal to that of the comparative example illustrated by a broken line with application of small voltage of 2V or smaller. When negative voltage (reverse bias) was applied, flowing current (leakage current) was kept small as illustrated by the solid-line locus in FIG. 37, similarly to the comparative example illustrated by the broken-line locus. It is thus found that the semiconductor device according to Example 1 has rectification as a diode. Meanwhile, when voltage of, for example, −30 V is applied, leakage current of the semiconductor device according to Example 1 was kept to about $1\times10^{-10}$ A while leakage current of the semiconductor device according to the comparative example was about $1\times10^{-8}$ A. This means the leakage current was decreased by about two digits compared to that in the case of the comparative example.

As stated above, in the semiconductor device according to the second modified example, it was possible to remarkably improve the characteristics of the junction barrier Schottky structure. With the method for manufacturing a semiconductor device according to the second modified example, a p-type impurity element is doped selectively at a high concentration, and a desired pattern is written by using a semiconductor region in which the impurity element is doped and a semiconductor region in which the impurity element is not doped. Thus, it is possible to realize a high-voltage semiconductor device, in which wide band gap semiconductor is used, with low on-resistance and reduced leakage current, (The Second Embodiment)
—Structure of the Impurity Doping Apparatus—

Figure 38:
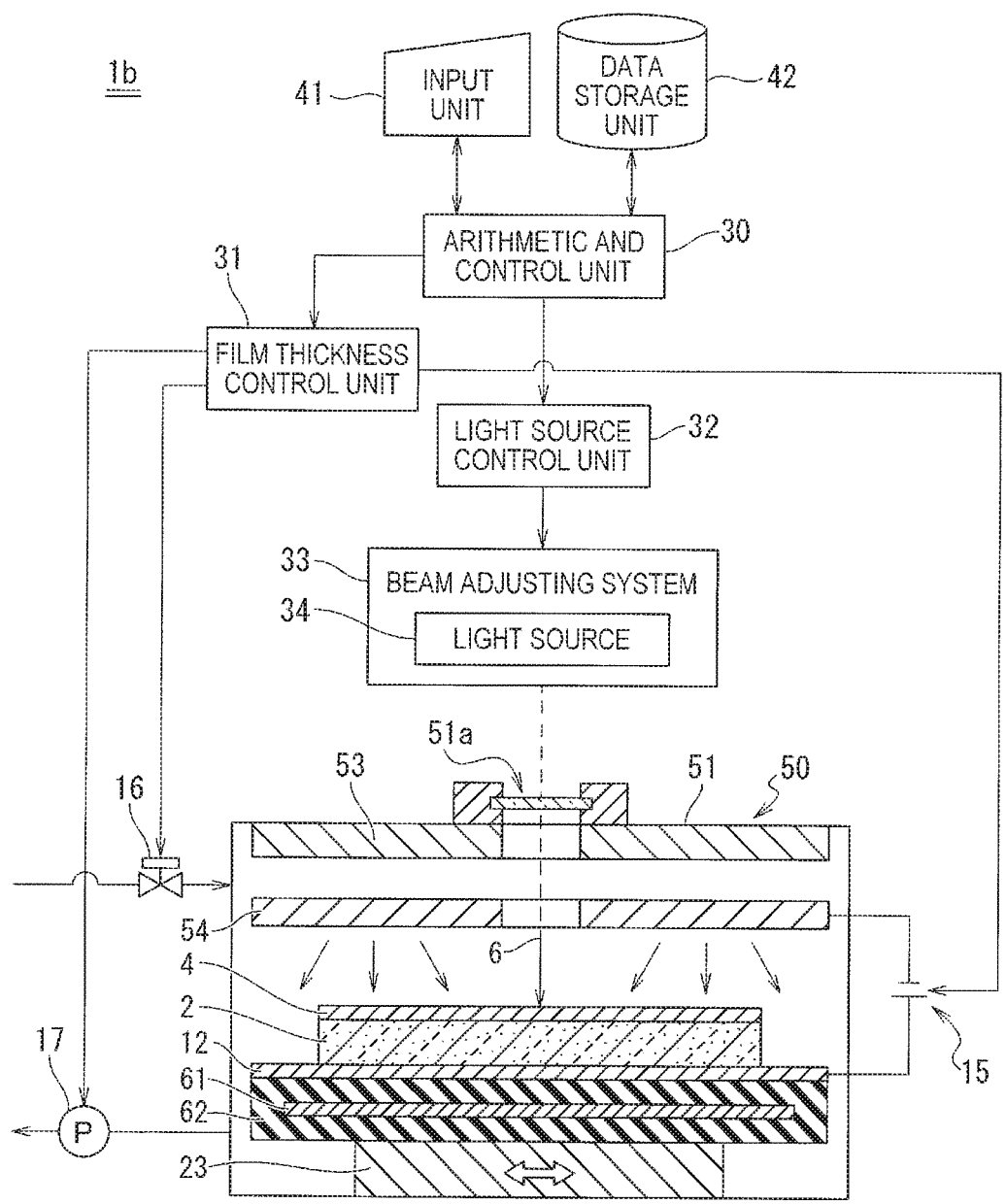
FIG. 38 is a block diagram including a sectional view for schematically explaining a rough structure of impurity doping apparatus used in the second embodiment of the present invention.

As illustrated in FIG. 38, the impurity doping apparatus 1b used in the second embodiment of the present invention is provided with a doping processing apparatus 50 and an arithmetic and control unit 30. The doping processing apparatus 50 provides source film 4 containing impurity elements on a surface of a solid target object 2, and dopes the impurity element into the target object 2 by irradiating the target object 2 with a light pulse with a large energy density such as a laser beam 6 through the source film 4. The arithmetic and control unit 30 is able to control film deposition conditions such as a film thickness of the source film 4 of the doping processing apparatus 50, and light irradiation conditions such as an energy density of the laser beam 6 and a light irradiation position of a light pulse relative to the target object 2.

The doping processing apparatus 50 includes a chamber 51 that can be evacuated, a support stand 62 that is provided inside the chamber 51, supports the target object 2 and is structured by including an insulating material, and a lower electrode 12 provided on the support stand 62. Inside the chamber 51, a target 54 containing Impurity elements are arranged so as to face the lower electrode 12. At a position in an upper part of the chamber 51 facing the target object 2, an optical window (viewport) 51a is provided and held on the top of a chamber upper plate 53. In the chamber upper plate 53 and the target 54 provided under the chamber upper plate 53, coaxial through holes are formed.

Above the optical window 51a, a beam adjusting system 33 having a light source 34 is provided. An upper surface of the target object 2 is irradiated by the laser beam 6 from the beam adjusting system 33. The laser beam 6 passes through the through holes of the optical window 51a, the chamber upper plate 53, and the target 54. Further, in the doping processing apparatus 50, a heating apparatus 61 such as a sheet heater that heats the target object 2 is buried inside the support stand 62.

The doping processing apparatus 50 is further provided with a power supply 15 connected between the lower electrode 12 and the target 54, a gas doping valve 16 that is connected with the chamber 51 and dopes rare gas into the chamber 51, a vacuum pump 17 that is connected with the chamber 51 and makes inside of the chamber 15 in a vacuum pressure. All of the power supply 15, the gas doping valve 16 and the vacuum pump 17 are connected with the arithmetic and control unit 30 through a film thickness control unit 31, and operations of the power supply 15, the gas doping valve 16 and the vacuum pump 17 are controlled similarly to the case of the impurity doping apparatus 1a pertaining to the first embodiment.

The beam adjusting system 33 has the light source 34 that emits a light pulse, is connected with the arithmetic and control unit 30 through the light source control unit 32, and operations of the beam adjusting system 33 are controlled similarly to the case of the impurity doping apparatus 1a pertaining to the first embodiment. In FIG. 38, members designated by the same reference numerals as those in the impurity doping apparatus 1a illustrated in FIG. 1 are not explained in detail.

The impurity doping apparatus 1b used in the second embodiment is structured as integration of the coating equipment 10 and the light irradiation apparatus 20 illustrated in FIG. 1, and film forming processing and laser irradiation processing can be carried out alternately in succession inside the same chamber 51 of the doping processing apparatus 50 in a state where the target object 2 is kept inside the chamber 51. This is a characteristic of the impurity doping apparatus 1b different from the impurity doping apparatus 1a pertaining to the first embodiment. Further, in the impurity doping apparatus 1b used in the second embodiment, since it is possible to irradiate with laser beam 6 in vacuum, it is possible to use a short-wavelength light pulse such as an ArF excimer laser (193 nanometers) and a $F_2$ laser (157 nanometers) in a range of vacuum ultraviolet light near 10 to 200 nanometers.

According to the impurity doping apparatus $1b$ used in the second embodiment, the coating equipment 10 and the light irradiation apparatus 20 are integrated, and laser doping is performed from a solid phase of impurity elements. Therefore, it is not necessary to convey the target object 2 to a different location after the film forming processing of the source film 4. It is also possible to repeatedly carry out light pulse irradiation processing and film forming processing alternately in succession. For example, after a shot the laser beam 6, the source film 4 may be formed again on an irradiation area, and, another shot of the laser beam 6 may irradiate the same irradiation area as the previous shot. Thus, it is possible to accelerate impurity element doping speed even further, and increase a doping concentration Moreover, according to the impurity doping apparatus $1b$ used in the second embodiment, temperature of the lower electrode 12, on which the target object 2 is mounted, is adjusted by the heating apparatus 61, and temperature of the target object 2 is increased to a certain temperature. In this state, irradiation with a light pulse can be performed to carry out laser doping. Because of a heat effect that increases the temperature of the target object 2, it is possible to promote recovery of 4H—SiC crystal that becomes deficient due to implantation and diffusion of the impurity element. In a case where the impurity element is Al, it is preferred that temperature of the target object 2 is room temperature or higher but not exceeding about 500° C. When the temperature exceeds 500° C., Al could be melted and a solid phase may not be maintained in consideration of an amount of heat generated in equipment around the target object 2. Explanation is omitted regarding a method for doping impurities by using the impurity doping apparatus $1b$ used in the second embodiment, because it is similar to the method for doping impurities according to the first embodiment. Also, for the same reason, explanation is omitted regarding a method for manufacturing a semiconductor device by using the method for doping impurities according to the second embodiment.

(A Modified Example of the Impurity Doping Apparatus Used in the Second Embodiment)

In the method for doping impurities according to the first embodiment, irradiation with a light pulse of the laser beam 6 was performed under atmospheric pressure. On the contrary, irradiation with a light pulse may be performed after pressure inside the chamber 51 is increased to be higher than atmospheric pressure in the following way. For example, by using the impurity doping apparatus $1b$ used in the second embodiment, impurity elements in a vapor phase is contained in atmospheric gas inside the chamber 51, and partial pressure of molecules made of the same impurity element as that of the source film 4 is increased. Thus, it is possible to promote doping of the impurity element using partial pressure of the impurity element contained in the atmospheric gas.

(Other Matters Regarding the First and Second Embodiments)

It should not be understood that the statements and drawings, which construct a part of the disclosure explained in the foregoing first and second embodiments, limit the present invention. It should be considered that the disclosure reveals various substitute embodiments, examples, and application technologies to a person skilled in the art. For example, as long as a degree of surface defect of the target object 2 is controlled inside a certain range, the number of irradiation of a light pulse is not limited to once, and may be more than once, such as twice or three times.

As the impurity element absorbs energy of the laser beam 6 more than once, it is possible to increase an activation rate. With the impurity doping apparatus $1b$ used in the second embodiment in particular, it is possible to carry out continuous irradiation efficiently. However, when irradiation is performed too many times, work hours become too long, and productivity of the semiconductor device is deteriorated. Therefore, it is preferred that the number of irradiation is within ten times or less at most, more preferably three times or less. The number of irradiation can be controlled by controlling operations of the light irradiation apparatus 20 through the arithmetic and control unit 30.

In the manufacturing methods for a semiconductor device according to the first and second embodiments, the pn junction diode and the MOSFET are explained as typical examples of the semiconductor device. However, the semiconductor device is not limited to the diode and MOSFET. The present invention may be applicable to various semiconductor devices (semiconductor devices) such as IGBT, SIT, GTO, or SI thyristor.

The method for doping impurities, the method for manufacturing a semiconductor device, and the semiconductor devices according to the present invention may be structured by combining technical ideas of each of the embodiments illustrated in FIG. 1 to FIG. 38.

(The Third Embodiment)
<Impurity Doping Apparatus>

Figure 39:
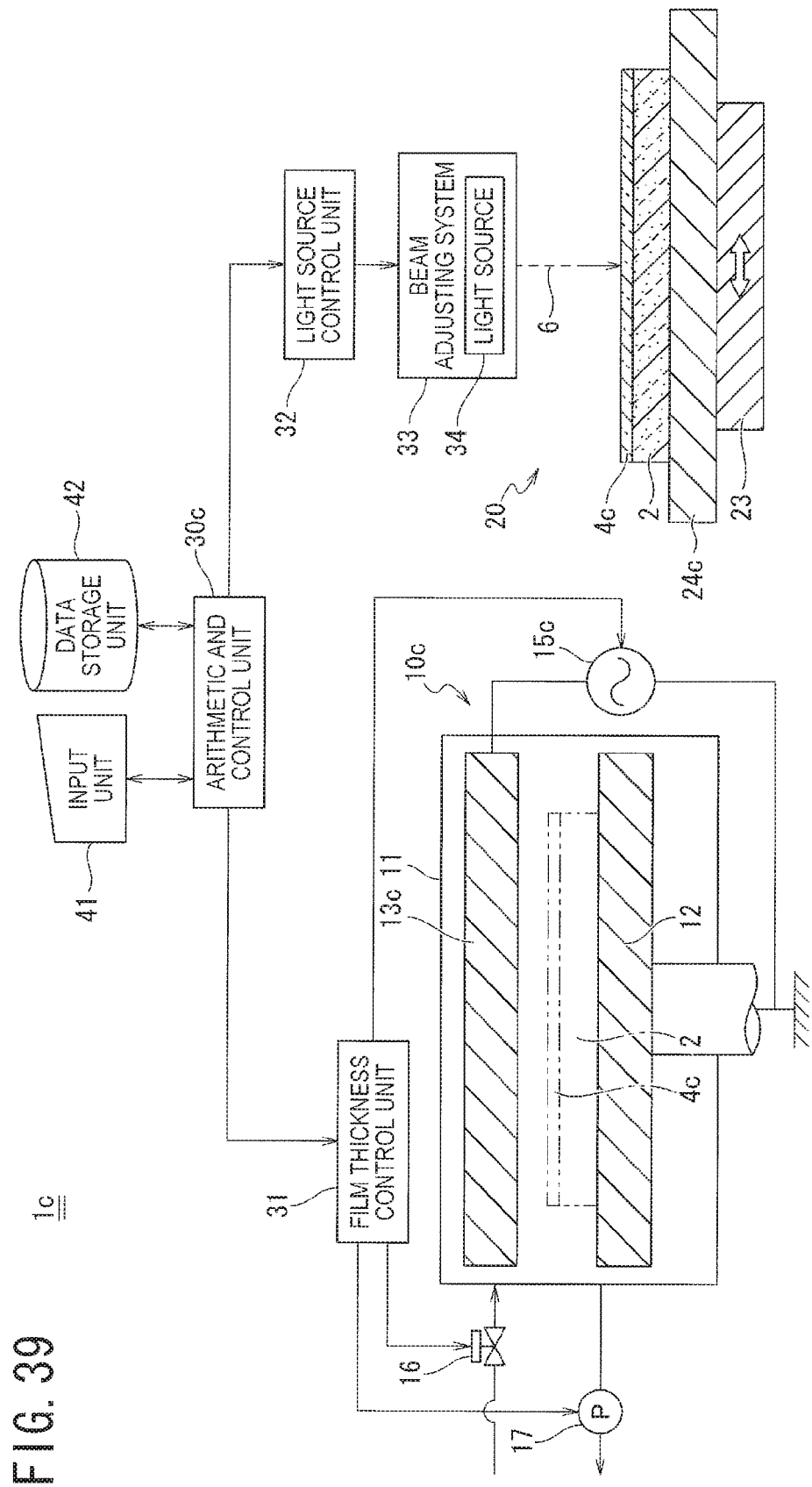
FIG. 39 is a block diagram including a sectional view for schematically explaining a rough structure of impurity doping apparatus used in the third embodiment of the present invention.

As illustrated on the left side of a block diagram in FIG. 39, the impurity doping apparatus $1c$ used in the third embodiment is provided with a coating equipment $10c$, in which a nitride film $4c$ is formed on a surface of a solid target object 2 made from a solid material. As illustrated on the right side in FIG. 39, the impurity doping apparatus $1c$ is provided with a light source 34, which emits a light pulse, a beam adjusting system 33 that irradiates the nitride film $4c$ with the light pulse, and a light source control unit 32 that controls the light source 34. The impurity doping apparatus $1c$ is also provided with an arithmetic and control unit $30c$ that controls film deposition conditions such as a film thickness of the nitride film $4c$, and light irradiation conditions such as an energy density of the laser beam 6 and a light irradiation position of a light pulse with respect to the target object 2. The impurity doping apparatus $1c$ dopes N in nitride contained in the nitride film $4c$ into the target object 2.

The nitride film $4c$ is source film that forms a source for doping impurities N into the target object 2, and may be a thin film containing nitride such as a silicon nitride ($Si_xN_y$, herein after, simply referredto as "SiN") and carbon nitride ($C_xN_y$). Herein below, an example case is explained, in which a SiN film is used.

Figure 42:
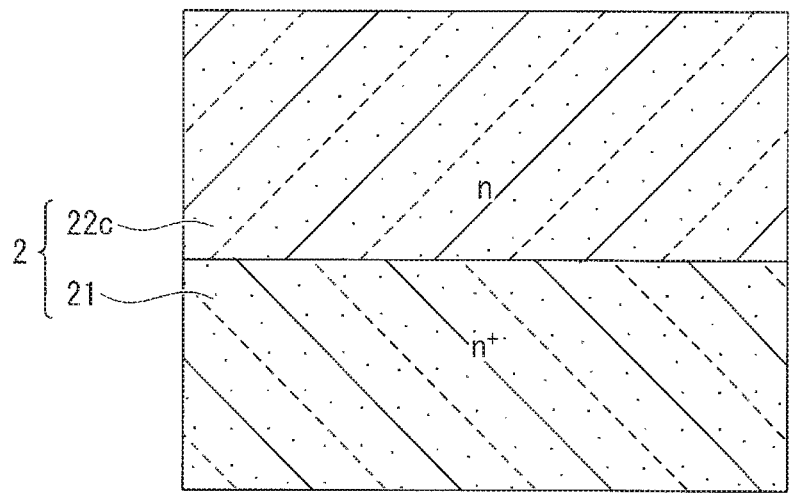
FIG. 42 is a process sectional view explaining the method for doping impurities according to the third embodiment (No. 1)

For the target object 2, a SiC substrate is used as an example. To be more specific, an $n^+$-type 4H—SiC substrate, which is expected as a substrate material for power semiconductor devices element, is used for explanation. As illustrated in FIG. 42, the target object 2 has a double-layer structure in which an epitaxial growth layer (herein below, referred to as an "epi layer") $22c$ of n-type 4H—SiC having a concentration of about $1 \times 10^{16}/cm^3$ and a thickness of about ten micrometers is provided on top of a semiconductor substrate 21 having a (0001) surface ((000-1) surface). The target object 2 illustrated in FIG. 39 as an example is arranged so that a face of the target object 2 on the epi layer $22c$ side, serving as its surface (upper surface), faces the beam adjusting system 33 side. An alignment mark (not illustrated) for positioning may be provided on the surface of the target object 2.

A material for the target object 2 is not limited to SiC, and the present invention is applicable to other wide band gap semiconductor such as gallium oxide ($Ga_2O_3$) and diamond. The target object 2 is not limited to wide band gap semiconductor as long as it is a solid material with an extremely small diffusion coefficient of N. However, a solid material, in which N functions as a donor-type impurity element, is preferred.

As the coating equipment 10c, for example, a sputtering system, an electron beam evaporation apparatus, a plasma CVD apparatus may be employed. FIG. 39 illustrates an example case where the coating equipment 10c according to the third embodiment is a capacitively-coupled plasma CVD apparatus, which is provided with a chamber 11 that can be evacuated, a lower electrode 12 which is provided inside the chamber 11 and mounts the target objects 2 thereon, and an upper electrode 13c that is provided so as to directly confront the lower electrode 12 with an interval in the vertical direction so that the upper electrode 13 and the lower electrode 12 become parallel to each other.

As the capacitively-coupled plasma CVD apparatus, the coating equipment 10c is also provided with a high frequency power supply 15c, which is connected between the lower electrode 12 and the upper electrode 13c, a gas doping valve 16 that is connected with the chamber 11 and dopes a raw material gas for film forming into the chamber 11, and a vacuum pump 17 that is connected with the chamber 11 and structured by a rotary pump, a turbo-molecular pump, a cryopump or the like, which makes inside of the chamber 11 in a vacuum pressure. A film thickness control unit 31, which controls a film thickness of the formed nitride film 4c, is connected with the high frequency power supply 15c, the gas doping valve 16, and the vacuum pump 17. Further, the film thickness control unit 31 is able to monitor in-situ and feedback control of signals from a film thickness meter (not illustrated) equipped on the coating equipment 10c. The high frequency power supply 15c, the gas doping valve 16, and the vacuum pump 17 are connected with an arithmetic and control unit 30 through the film thickness control unit 31.

The coating equipment 10c forms a film by adhering raw material gas, which is doped into the chamber 11, onto the surface of the target object 2 by using high-frequency voltage that is applied by the high frequency power supply 15c between the lower electrode 12 and the upper electrode 13c. The coating equipment 10c may be structured by an inductively coupled plasma CVD apparatus, a microwave plasma CVD apparatus, an electron cyclotron resonance plasma (ECR) plasma CVD apparatus, or the like other than the capacitively-coupled plasma CVD apparatus.

The light irradiation apparatus 20 is provided with a support stand 24c that supports the target object 2, and the X-Y motion stage 23 that mounts the target object 2 thereon through the support stand 24c and freely moves the target object 2 in an X-Y direction defined within a plane that is parallel to the main surface of the target object 2. The light irradiation apparatus 20 scans and irradiates the flat upper surface of the target object 2 with a light pulse of the laser beam 6 through the nitride film 4c. The "effect of optical excitation" includes an effect of thermal energy.

As illustrated in FIG. 39, the beam adjusting system 33 is provided integrally with a light source 34 that emits a light pulse of the laser beam 6 and so on with large irradiation fluence (energy density), and scans and irradiates the surface of the target object 2 with a light pulse in an irradiation area having a certain dimension. A light source control unit 32, which controls irradiation conditions of the laser beam 6 used for irradiation, is connected with the beam adjusting system 33 and the light source 34, and the light source control unit 32 is also connected with the arithmetic and control unit 30c.

As a light pulse with a large energy density, a pulse of the laser beam 6 is preferred as the laser beam 6 has a wavelength that is able to give optical energy to lattice vibration of the impurity element and the target object 2 so that sufficient reaction energy is generated through the nitride film 4c. For example, it is possible to use an excimer laser having an oscillation wavelength of 248 nanometers (KrF), 193 nanometers (ArF), 308 nanometers (XeCl), 351 nanometers (XeF) and so on, 266 nanometers (YAG fourth harmonic), 355 nanometers (YAG third harmonic), 532 nanometers (YAG second harmonic) lasers, 1.064 micrometers (YAG fundamental harmonic) and 10.6 micrometers (carbon dioxide ($CO_2$) gas) lasers and so on. It is also possible to obtain a light pulse with a large energy density by selecting a wavelength of high-output continuous light of, for example, a mercury (Hg) lamp and a xenon (Xe) lamp using a spectroscopy or a filter. Therefore, a light pulse is not necessarily limited to that of a laser.

Further, by using a structure such as an excimer laser that emits the laser beam 6 with a wavelength in an ultraviolet region, which produces larger energy than band gap of the nitride film 4c and many semiconductor materials, it is possible to excite vibrational energy of an constituent element of the nitride film 4c and a constituent element of the semiconductor material, and to optically excite a surface reaction such as a photocatalytic action due to optical energy in the ultraviolet region. Thus, lattice vibration of a surface of a solid material, serving as a doping target of impurity elements are excited, thereby facilitating a surface reaction that includes surface migration by which the impurity element moves to a doping position such as an interstitial site and a site of substitution of the target solid material.

However, light with a shorter wavelength than that of ArF (=193 nanometers) laser, namely, light with a short wavelength within a range of vacuum ultraviolet light, is absorbed in oxygen molecules in the atmosphere and propagation is inhibited. Therefore, for laser doping in the atmosphere, the laser beam 6 having a wavelength of about 190 nanometers or more is preferred. Further, in order to produce sufficient reaction energy between the nitride film 4c and 4H—SiC, the laser beam 6 with a wavelength of about 380 nanometers or smaller, namely, the laser beam 6 with a wavelength in the level of YAG third harmonic (=355 nanometers) or smaller, is preferred.

The beam adjusting system 33 is also provided with a forming apparatus (not illustrated) such as an adjustable slit that forms emitted laser beam 6 into a given shape, and a light condensing device (not illustrated) such as a lens that condenses the laser beam 6. A light pulse of the formed laser beam 6 and so on irradiates an interface region between the upper surface of the target object 2 and the nitride film 4c. The shape of the formed laser beam 6 is preferably a rectangular shape, but is not limited to the rectangular shape and may be other shapes.

Although not illustrated, an imaging device such as a CCD camera, which captures an image of the reference mark on the target object 2, an illumination light emitting device that emits illumination light, a mirror and an alignment mechanism for reflecting and transmitting the illumination light, and so on may be provided additionally in the beam adjusting system 33 where necessary, when controlling an irradiation position of the beam on the target object 2.

Further, when later-described direct writing is carried out, a ranging system such as a laser interferometer may be provided. When sweeping the laser beam 6, the beam adjusting system 33 may also be provided with other optical systems such as a reflecting mirror and a prism if necessary for reflecting and leading the formed laser beam 6 to the light condensing device.

The X-Y motion stage 23 supports the support stand 24c from below horizontally, and is connected with a motion stage driving apparatus (not illustrated). As the arithmetic and control unit 30c controls the motion stage driving apparatus, the X-Y motion stage 23 moves the support stand 24c in a X-Y direction within a horizontal X-Y plane freely so that the target object 2 is freely moved with respect to the irradiation position of a light pulse. For example, by freely moving the position of the target object 2 with respect to the irradiation position of a light pulse, it becomes possible to irradiate a desired range of a planar region and pattern regions selectively where N is added with a method of direct writing. Further, a Z motion stage may be provided between the support stand 24c and the X-Y motion stage 23. The Z motion stage moves the support stand 24c in Z direction perpendicular to the X-Y direction. Thus, the support stand 24c is structured to be able to move in Z direction in addition to the X-Y direction. Thus, focus adjustment and so on can be carried out.

Figure 40:
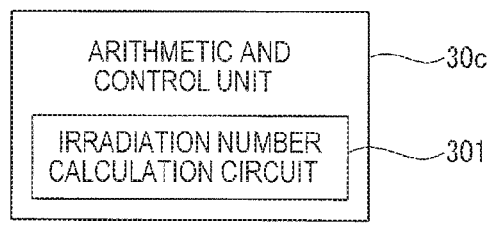
FIG. 40 is a block diagram schematically explaining a rough structure of an arithmetic and control unit used in the third embodiment.

As illustrated in FIG. 40, the arithmetic and control unit 30c is provided with shot number calculation circuit 301. Also, as illustrated in FIG. 39, an input unit 41 and a data storage unit 42 are connected with the arithmetic and control unit 30c, and the arithmetic and control unit 30c is structured so as to be able to access data stored inside the data storage unit 42. A film thickness $t_f$ of the nitride film 4c, and an energy density F of a light pulse and irradiation time (pulse width) τ per pulse (shot) are inputted to the data storage unit 42 through the input unit 41.

The shot number calculation circuit 301 of the arithmetic and control unit 30c calculates shot number n of a light pulse from a rule of thumb by using the film thickness $t_f$, the energy density F and irradiation time τ per pulse stored in the data storage unit 42. It is possible to set the shot number calculation circuit 301 so as to calculate the shot number n to an extent in which the nitride film 4c does not remain on the surface of the target object 2 after irradiation with a light pulse. It is also possible to set the shot number calculation circuit 301 so as to calculate the shot number n of a light pulse so that the nitride film 4c remains on the surface of the target object 2 by an amount of a film thickness corresponding to at least one atomic layer.

After light pulse irradiation, when the nitride film 4c is not able to remain by an amount of a film thickness corresponding to at least one atomic layer on the surface of the target object 2, a degree of projection and depression that cause surface defect of the nitrogen doping region becomes conspicuous. When a semiconductor device is manufactured by delineating electrodes on the surface of the target object 2 in an after process, a decrease in a forward current value and an increase in reverse-bias leakage current are caused. Thus, the semiconductor device is not able to have sufficient characteristics.

The film thickness $t_f$ of the nitride film 4c is decided in consideration of irradiation time τ per light pulse and an energy density F of a light pulse. It is preferred that the film thickness $t_f$ of the nitride film 4c is set to about ten nanometers or larger but not exceeding about one micrometer.

When the film thickness $t_f$ is smaller than ten nanometers, it can be difficult to dope N sufficiently, and a degree of projection and depression on the surface can be conspicuous because the thickness is too small for the energy density F of a light pulse. When the film thickness $t_f$ exceeds one micrometer, energy efficiency is deteriorated, even if N is doped. It is preferred that the energy density F of a light pulse is set to about 1.0 J/cm² or larger but not exceeding about 6.0 J/cm². When the energy density F is smaller than 1.0 J/cm², it becomes difficult to dope N sufficiently. When the energy density F exceeds 6.0 J/cm², energy efficiency is deteriorated, and, at the same time, a degree of projection and depression on a surface of a nitrogen doping region becomes conspicuous.

Irradiation time τ of a light pulse is set as appropriate within a range of about 20 ns to 100 ns, but, for example, about 50 ns is preferred. The shot number n of a light pulse may be set to an arbitrarily selected number as long as the nitride film 4c is able to remain by an amount of a film thickness corresponding to at least one atomic layer. However, it is preferred that the shot number n is in a range of once or more but not exceeding 100 times, in consideration of mass productivity of semiconductor devices.

As described above, the shot number n of a light pulse is set in consideration of the film thickness $t_f$ of the nitride film 4c, the energy density F of the laser beam 6, and the irradiation time τ per pulse. Therefore, projection and depression are not formed excessively on the surface of the target object 2, and, even if a surface defect is generated, the degree of the projection and depression can be contained within an allowable range so that desired I-V characteristics are achieved.

The data of the shot number n calculated by the arithmetic and control unit 30c is inputted into the light source control unit 32 together with the data of the energy density F and irradiation time τ inputted into the arithmetic and control unit 30c. The data of the film thickness $t_f$ inputted in the arithmetic and control unit 30c is inputted into the film thickness control unit 31. A display device (not illustrated) may be connected with the arithmetic and control unit 30c so that the data of the film thickness $t_f$, the energy density F, the irradiation time τ and the shot number n, and so on are displayed.

The film thickness control unit 31 controls voltage of the high frequency power supply 15c, and operations of the gas doping valve 16 and the vacuum pump 17 in the coating equipment 10c so that the nitride film 4c having the inputted film thickness $t_f$ is formed on the target object 2. The light source control unit 32 controls operations of the beam adjusting system 33 and the light source 34 so that scanning irradiation with a light pulse is performed with the inputted energy density F and irradiation time τ, and the calculated shot number n.

<Method for Doping Impurities>

Next, a method for doping impurities according to the third embodiment is explained with reference to the flowchart in FIG. 41, and FIG. 42 to FIG. 46, with regard to a case where the target object 2 is used. In the target object 2, an n-type epi layer 22c is formed on an upper surface side of an n⁺-type semiconductor substrate 21 as illustrated in FIG. 42. The structure of the target object 2 in FIG. 42 is only an example, and it is possible to use, for example, a structure in which an n-type epi layer is formed on an upper surface side of the p⁺-type semiconductor substrate, or a structure in which a p-type epi layer is formed on an upper surface side of an n+-type semiconductor substrate. Alternatively, a bulk semiconductor substrate without an epi layer may be used.

Figure 41:
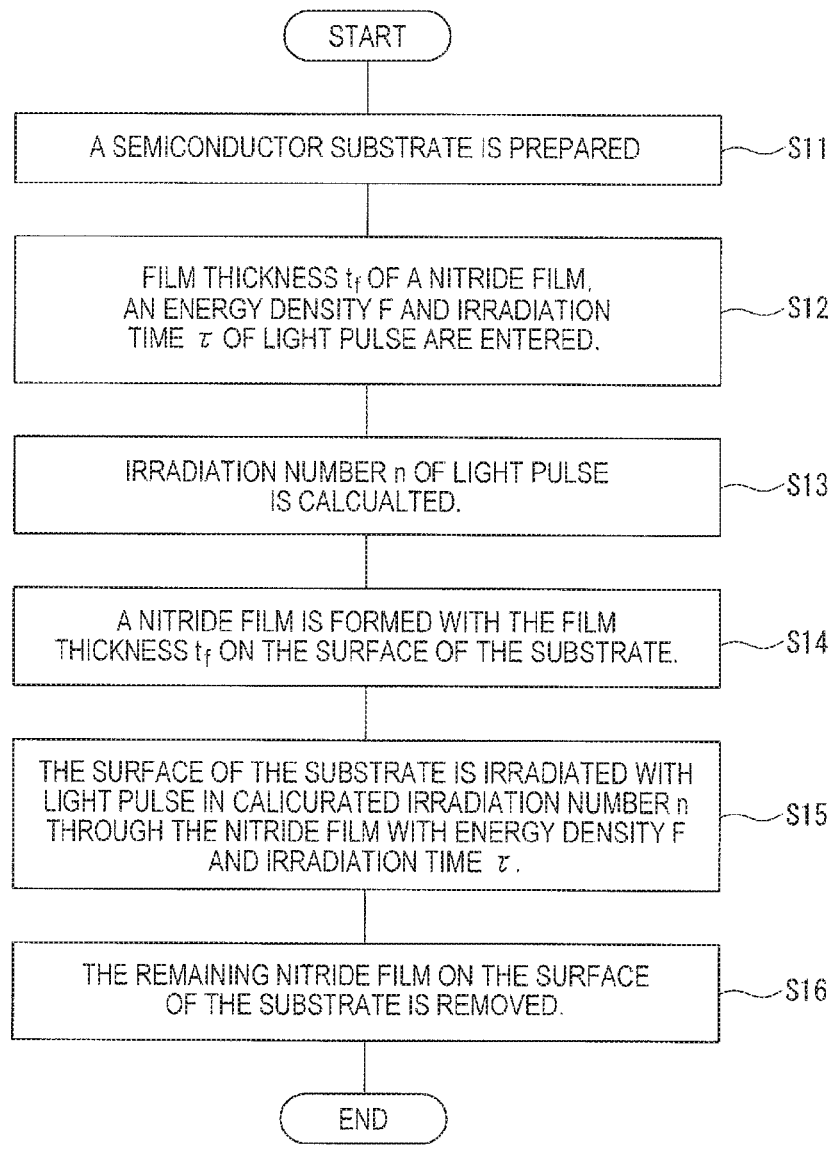
FIG. 41 is a flowchart explaining a method for doping impurities according to the third embodiment.

(a) First of all, in step S11 in FIG. 41, the prepared target object 2 is mounted and fixed on the lower electrode 12 so that the surface of the target object 2 on the epi layer 22c side faces the upper electrode 13c side as illustrated by a two-dotted line inside the coating equipment 10c in FIG. 39.

(b) Next, in step S12, a film thickness $t_f$ of the nitride film, an energy density F and irradiation time τ of a light pulse are inputted through the input unit 41 and stored in the data storage unit 42. Step 12 may be carried out before step S11.

(c) Next, the arithmetic and control unit 30c of the impurity doping apparatus 1c reads the film thickness $t_f$ of the nitride film, the energy density F and irradiation time τ of a light pulse from the data storage unit 42 and calculates the shot number n in step S13. Then, the calculated shot number n, and the energy density F and irradiation time τ of a light pulse are outputted to the light source control unit 32 of the light irradiation apparatus 20. The film thickness $t_f$ is outputted to the film thickness control unit 31 of the coating equipment 10c.

Figure 43:
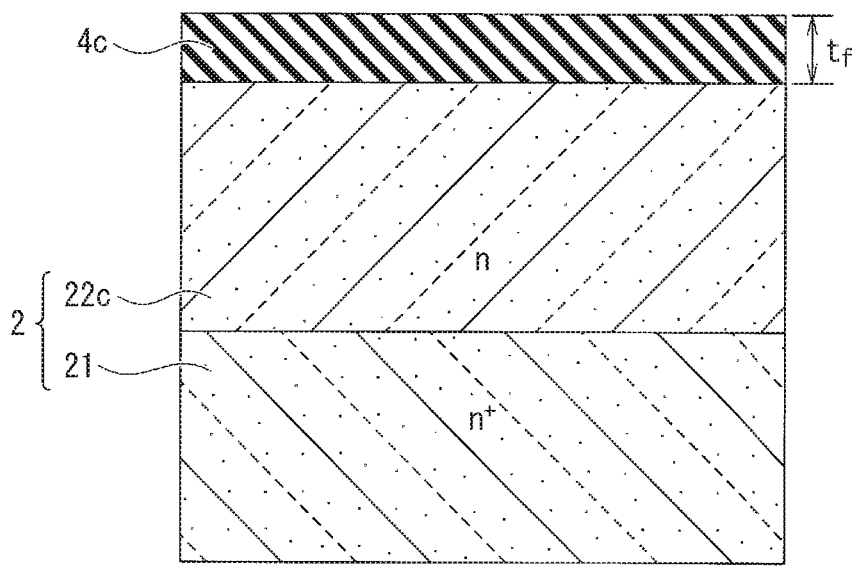
FIG. 43 is a process sectional view explaining the method for doping impurities according to the third embodiment (No. 2)

(d) Next, in step S14, the film thickness control unit 31 of the coating equipment 10c controls operations of the high frequency power supply 15c, the gas doping valve 16, and the vacuum pump 17, and, as illustrated in FIG. 43, a thin film of the nitride film 4c, such as a SiN film, is deposited with the set film thickness $t_f$ on the upper surface of the epi layer 22c of the target object 2.

(e) Next, the target object 2, on which the nitride film 4c is formed, is taken out from the coating equipment 10c and conveyed to the light irradiation apparatus 20, and the target object 2 is mounted and fixed onto the support stand 24c so that the upper surface of the nitride film 4c faces the beam adjusting system 33 side. The light irradiation apparatus 20 is arranged in the atmosphere at room temperature. It is possible to appropriately set temperature of the target object 2 mounted on the light irradiation apparatus 20 in a range from room temperature or higher but not exceeding about 600° C. Then, the beam adjusting system 33 is moved by a given amount in X direction and Y direction so that the position of the reference mark coincides with an optical axis of the laser beam 6. The reference mark corresponds to an initial target irradiation position where the impurity element N is doped in the epi layer 22c of the target object 2.

Figure 44:
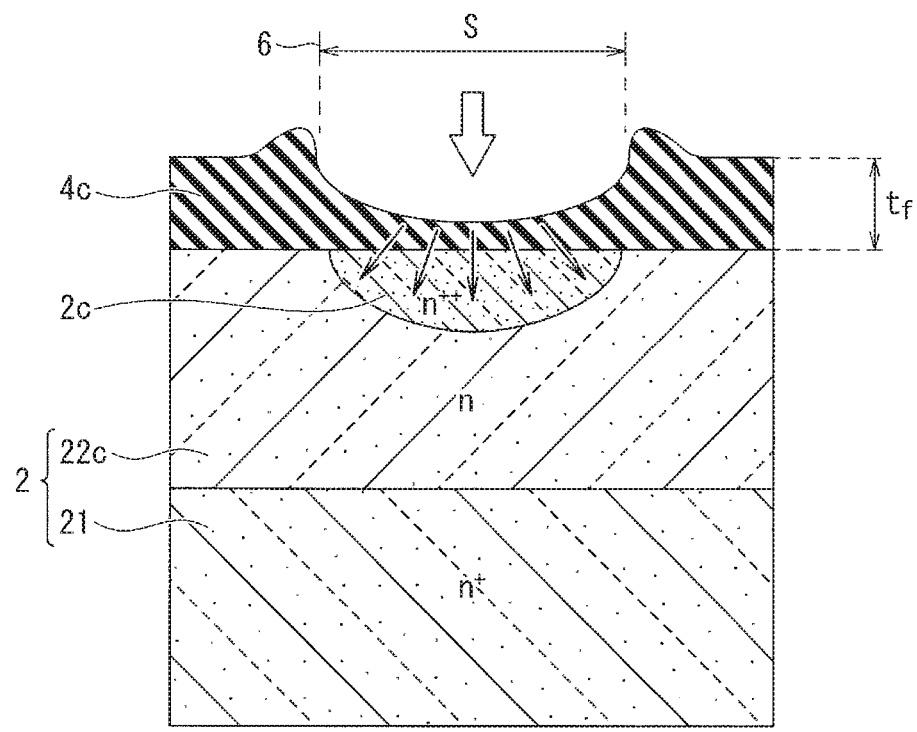
FIG. 44 is a process sectional view explaining the method for doping impurities according to the third embodiment (No. 3)

(f) Next, in step S15, the light source control unit 32 of the light irradiation apparatus 20 controls operations of the beam adjusting system 33 and the light source 34 so that irradiation with the laser beam 6 is performed with the inputted energy density F, irradiation time τ, shot number n. Then, as illustrated in FIG. 44, a light pulse of the laser beam 6 irradiates the upper surface of the epi layer 22c of the target object 2 through the nitride film 4c.

In an irradiation area S of the nitride film 4c, which is irradiated with the light pulse, N serving as a doping element is activated dramatically due to energy of the laser beam 6, and the nitride film 4c is melted. Then, in the interface between the nitride film 4c and the epi layer 22c, N is doped into the epi layer 22c to a level that exceeds a solid solution concentration. As laser doping progresses, the film thickness $t_f$ of the nitride film 4c is reduced. In a case where the shot number n is more than once and the same irradiation area S is irradiated with a light pulse repeatedly, the thickness of the nitride film 4c is reduced as the shot number n increases. Meanwhile, a melt flow region of SiN is generated in the periphery of the irradiation area S.

Figure 45:
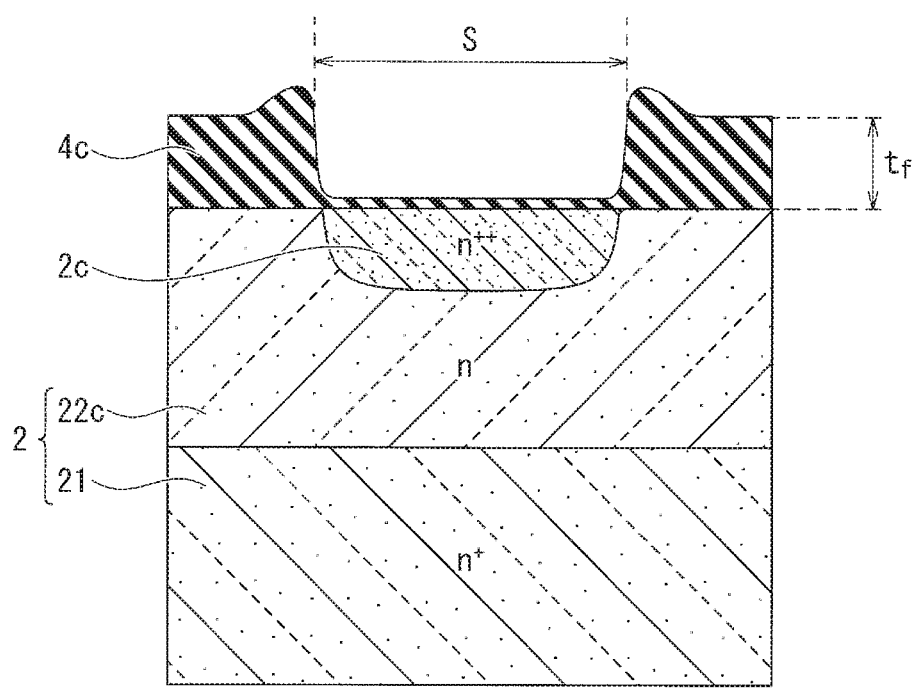
FIG. 45 is a process sectional view explaining the method for doping impurities according to the third embodiment (No. 4)

As illustrated in FIG. 45, after irradiation with a light pulse for n times, a nitrogen doping region 2c is formed in an upper part of the epi layer 22c, which corresponds to the irradiation area S. Also, a step is formed between the irradiation area S and a non-non-irradiation area of the nitride film 4c. In a part of a region near the boundary between the irradiation area S and the non-irradiation area, a part of SiN is deposited in a raised state due to melt flow. FIG. 45 illustrates an example case where a part of the nitride film 4c is deposited and remains on the upper surface of the nitrogen doping region 2c with a certain thickness so that the projection and depression that cause a surface defect of the target object 2 are reduced by the treatments in steps S12 and S13 carried out previously.

Figure 46:
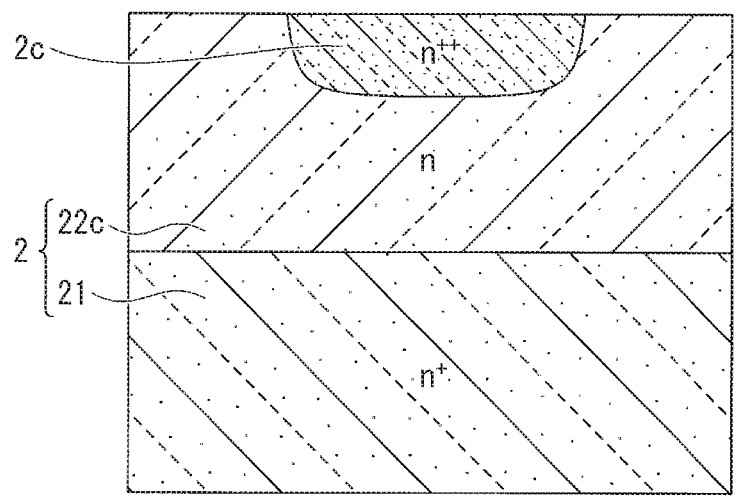
FIG. 46 is a process sectional view explaining the method for doping impurities according to the third embodiment (No. 5)

(g) Next, in a case where the nitride film 4c is a SiN film, in step S16, the nitride film 4c remaining on the surface of the epi layer 22c is removed by using hot phosphoric acid ($H_3PO_4$) as illustrated in FIG. 46. Since the remaining nitride film 4c protects the upper surface of the nitrogen doping region 2c, the nitrogen doping region 2c is formed flat because roughening of the upper surface is controlled. The foregoing steps (a) to (g) structure the method for doping impurities according to the third embodiment.

Example 2

Next, Example 2 of the present invention is explained. In Example 2, the target object 2 having the epi layer 22c illustrated in FIG. 42 was prepared, and a nitride film 4c SiNx was formed with a thickness $t_f$=about 100 nanometers on a surface of the epi layer 22c on an upper side of the semiconductor substrate 21.

Figure 47:
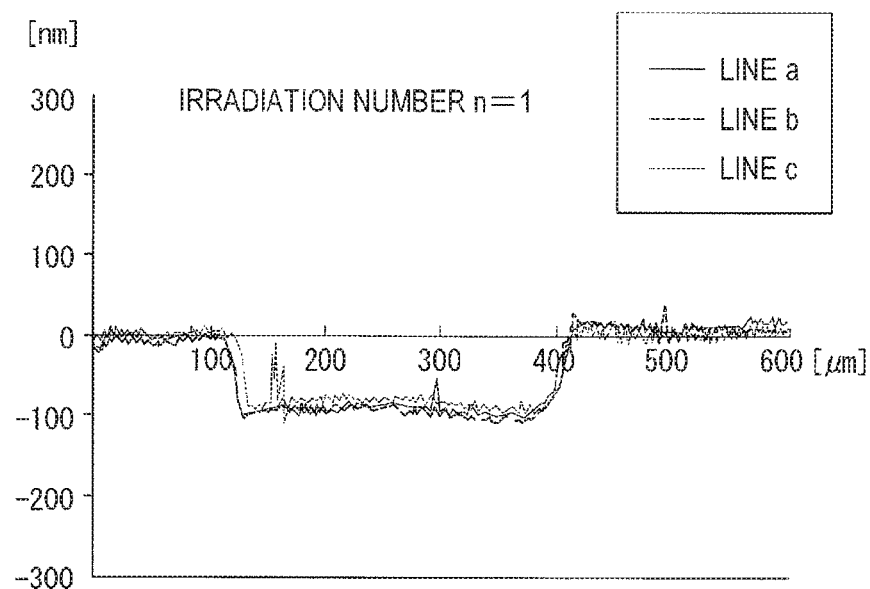
FIG. 47 is a graph illustrating profiles of steps that are formed between irradiation areas and non-irradiation areas of nitride films in a case where light pulse irradiation is performed once in a method for doping impurities according to Example 2.
Figure 48:
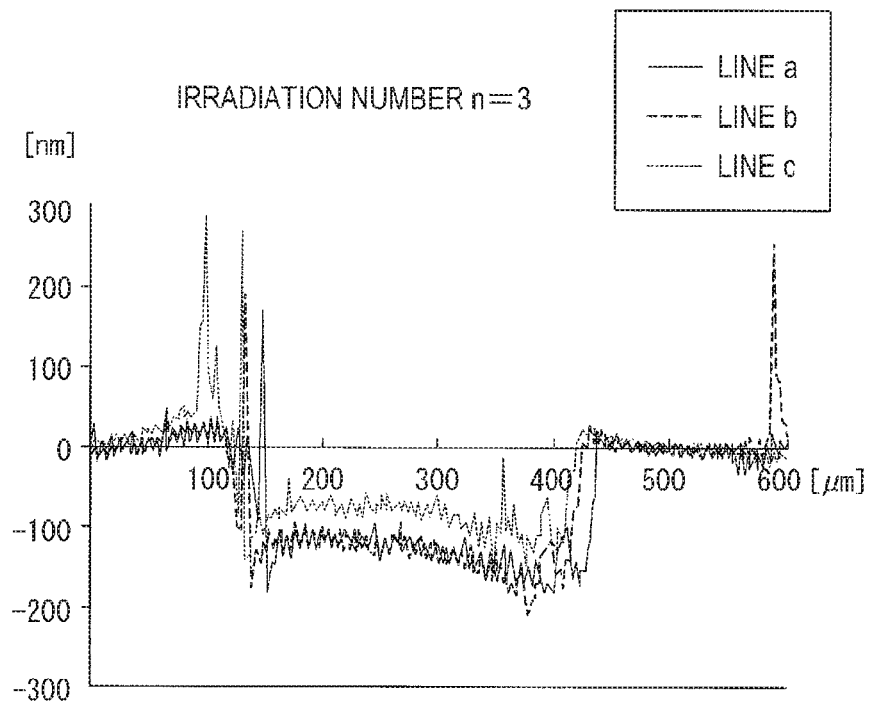
FIG. 48 is a graph illustrating profiles of steps that are formed between irradiation areas and non-irradiation areas of nitride films in a case where light pulse irradiation is performed three times in the method for doping impurities according to Example 2.
Figure 49:
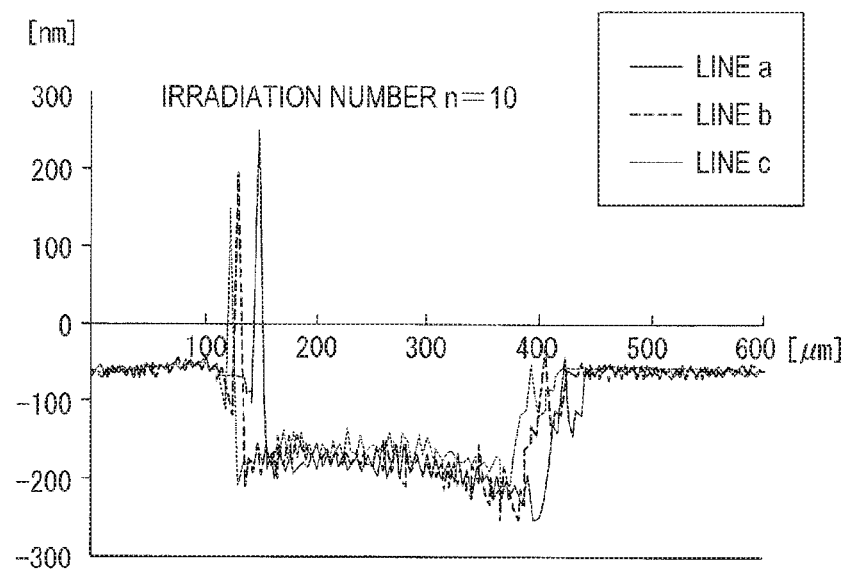
FIG. 49 is a graph illustrating profiles of steps that are formed between irradiation areas and non-irradiation areas of nitride films in a case where light pulse irradiation is performed ten times in the method for doping impurities according to Example 2.

Next, as illustrated in FIG. 44 and FIG. 45, by using the light irradiation apparatus 20 provided in the atmosphere, the nitride film 4c was irradiated with a light pulse with an energy density F=about 4.0 J/cm$^2$, and irradiation time τ=50 ns, thereby doping N into the epi layer 22c. As the laser beam 6, a 248 nanometers (KrF) excimer laser was used, and a beam was formed so that an irradiation area S became a square shape of about 300 micrometers square in a planar pattern. The laser doping was carried out in five patterns of shot number n, which are, once, twice, three times, five times, and ten times. Also, patterning was carried out in total three lines of line a, line b, and line c. FIG. 47 to FIG. 49 illustrate examples of profiles of steps on the surface of the irradiation area S, which were obtained in the three patterns of n=1, 3, 10 out of the five patterns.

In the case where the shot number n=1, as illustrated in the graph in FIG. 47, maximum depths of steps were about 100 nanometers. In the case where the shot number n=3, as illustrated in the graph in FIG. 48, maximum depths of steps were about 150 nanometers to 200 nanometers. In the case where the shot number n=10, as illustrated in the graph in FIG. 49, maximum depths of steps were about 200 nanometers to 250 nanometers. This proves that, as the shot number n increases, the sizes of the steps were increased. In FIG. 47 to FIG. 49, the position of "0" in the vertical axis corresponds to the height of the upper surface of the nitride film 4c formed before light pulse irradiation.

Figure 50:
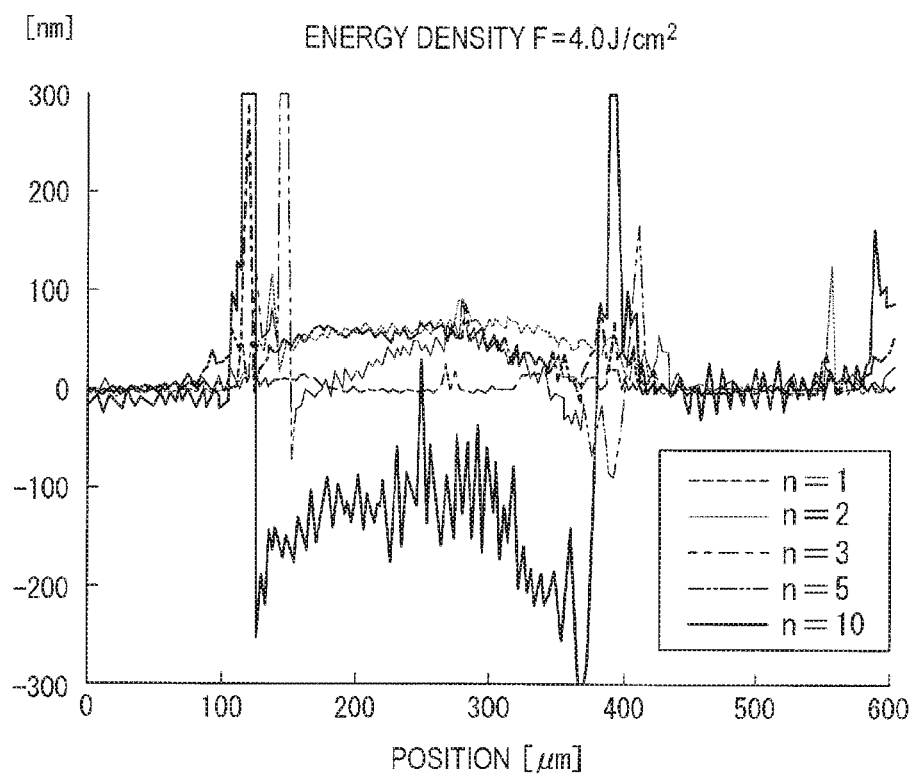
FIG. 50 is a graph illustrating profiles of steps formed on upper surfaces of nitrogen doping regions after removal of nitride films in the method for doping impurities according to Example 2.

Next, as illustrated in FIG. 46, the nitride film 4c remaining on the upper surface of the epi layer 22c was removed. As illustrated in the graph in FIG. 50, in the case of the four patterns of shot number n=1, 2, 3, and 5, the height of the upper surface of the epi layer 22c in the irradiation area S was nearly flat with almost no changes or slight protrusions. On the other hand, in the case where the shot number n=10, the nitride film 4c is almost gone in the irradiation area S, and further, an upper part of the nitrogen doping region $2c$ under the nitride film $4c$ is partially etched by 100 nanometers or more. It is understood that, in the case where the shot number n=10, remarkable projection and depression are formed on the surface of the nitrogen doping region $2c$. In FIG. 50, the position of "0" in the vertical axis corresponds to the upper surface of the epi layer $22c$, namely, the upper surface of the nitrogen doping region $2c$.

Figure 51:
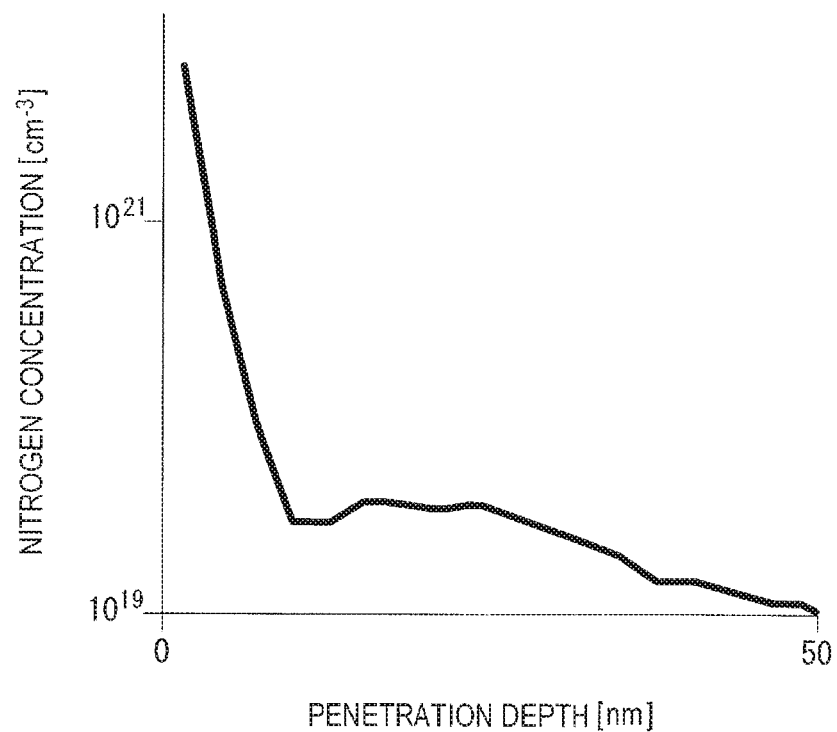
FIG. 51 is a graph illustrating a profile of a concentration and a penetration depth of nitrogen in the nitrogen doping region formed by using the method for doping impurities according to Example 2.

In the case of Example 2, as illustrated in the graph in FIG. 51, N was doped into the outermost surface of the epi layer $22c$ with a concentration of about $1 \times 10^{21}$ cm$^{-3}$, which largely exceeds the solid solution concentration of 4H—SiC, which is about $1 \times 10^{20}$ cm$^{-3}$. Also, N was doped to a position inside the epi layer $22c$ at a depth of nearly 50 nanometers. FIG. 51 illustrates a profile of a nitrogen concentration in the case where the shot number n=10.

Figure 52:
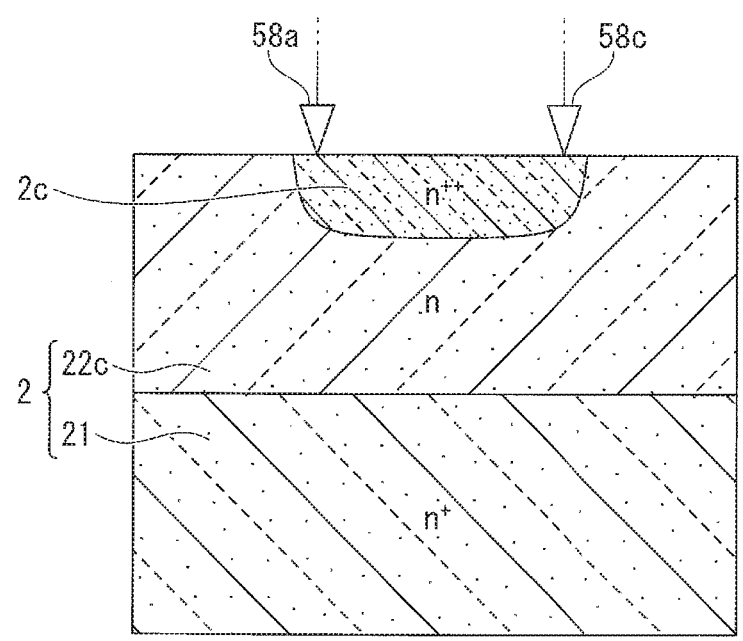
FIG. 52 is a sectional view explaining a method for measuring a current-voltage (I-V) characteristic of a surface of the nitrogen doping region that is formed by using the method for doping impurities according to Example 2.

Next, as illustrated in the sectional view in FIG. 52, two probe needles $58a$, $58c$, which are distanced from each other, are brought into contact with the surface of the nitrogen doping region $2c$, and electrical resistance was measured between the probe needles $58a$, $58c$. Out of the nitrogen doping regions $2c$ formed with the five different patterns of shot number n, I-V characteristics obtained in the case of the four patterns of n=1, 3, 5, 10 are illustrated in the graph in FIG. 53 as examples. The graph in FIG. 54 illustrates resistance values obtained in the respective five patterns when voltage of 2V was applied between the probe needles $58a$, $58c$.

Figure 53:
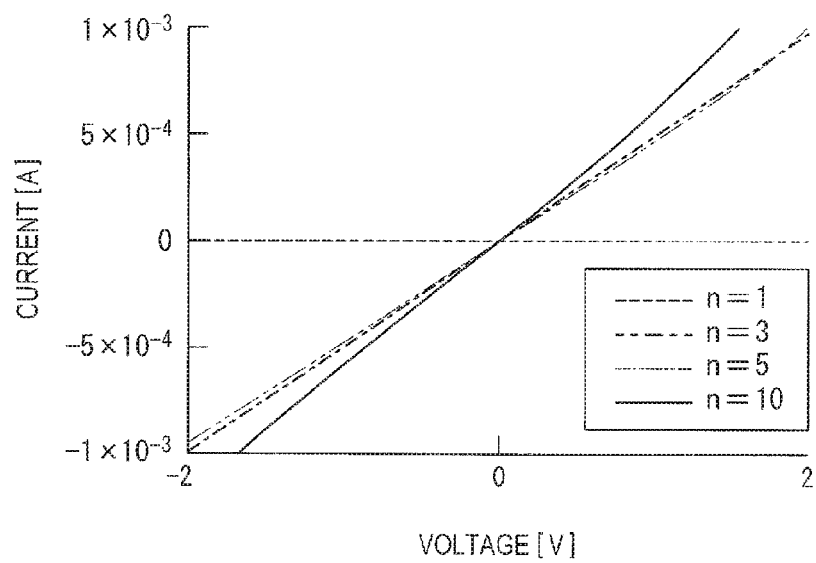
FIG. 53 is a graph illustrating the I-V characteristic of the nitrogen doping region for each shot number, the nitrogen doping region being formed by using the method for doping impurities according to Example 2.
Figure 54:
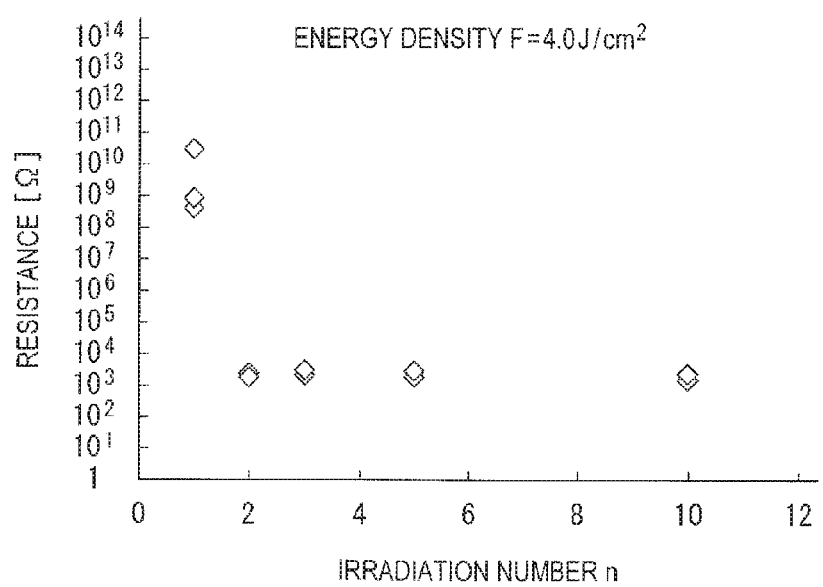
FIG. 54 is a graph illustrating a resistance value in the nitrogen doping region for each shot number, the nitrogen doping region being formed by using the method for doping impurities according to Example 2.

In the case where the shot number n=1, as illustrated by the broken line in FIG. 53, almost no current was flown even when voltage was changed. As illustrated in FIG. 54, when voltage of 2V was applied, three resistance values of line "a" to line "c" were relatively high within a range of about $6 \times 10^8$ to $5 \times 10^{10} \Omega$.

Meanwhile, in the case where the shot number n=3, 5, 10, as illustrated in FIG. 53, ohmic characteristics were illustrated, in which current is flown in proportion to voltage when voltage was changed. Further, as illustrated in FIG. 54, in the case of the four patterns of shot number n=2, 3, 5, 10, the three resistance values when voltage of 2V was applied were around $10^3 \Omega$. According to FIG. 53 and FIG. 54, under the laser doping conditions of Example 2, it is understood that the nitrogen doping region $2c$ has effective I-V characteristics in the case where the shot number n is twice of more.

Example 3

Next, Example 3 of the present invention is explained. Similarly to Example 2, Example 3 is a case where the nitride film $4c$ is a SiNx film. However, an energy density F of a light pulse is reduced to about 1.0 J/cm$^2$, which is about one fourth of the case of Example 2, and the rest of laser doping conditions were similar to those in the case of Example 2. Similarly to the case of Example 2, five patterns of shot number n were used, which are, once, twice, three times, five times, and ten times. Also, patterning was carried out in total three lines of line a, line b, and line c.

Figure 55:
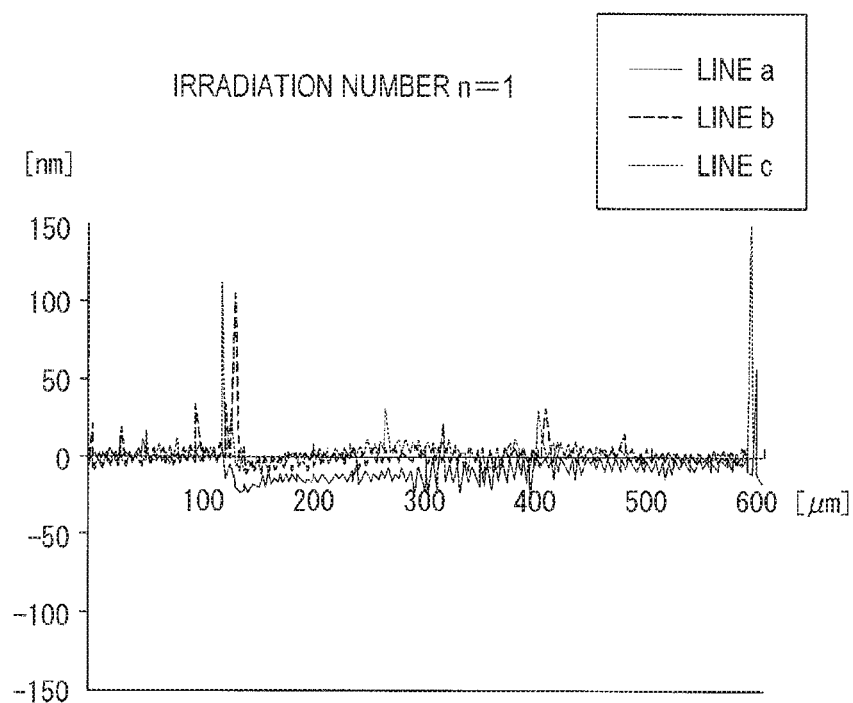
FIG. 55 is a graph illustrating profiles of steps that are formed between irradiation areas and non-irradiation areas of nitride films in a case where light pulse irradiation is performed once in a method for doping impurities according to Example 3.
Figure 56:
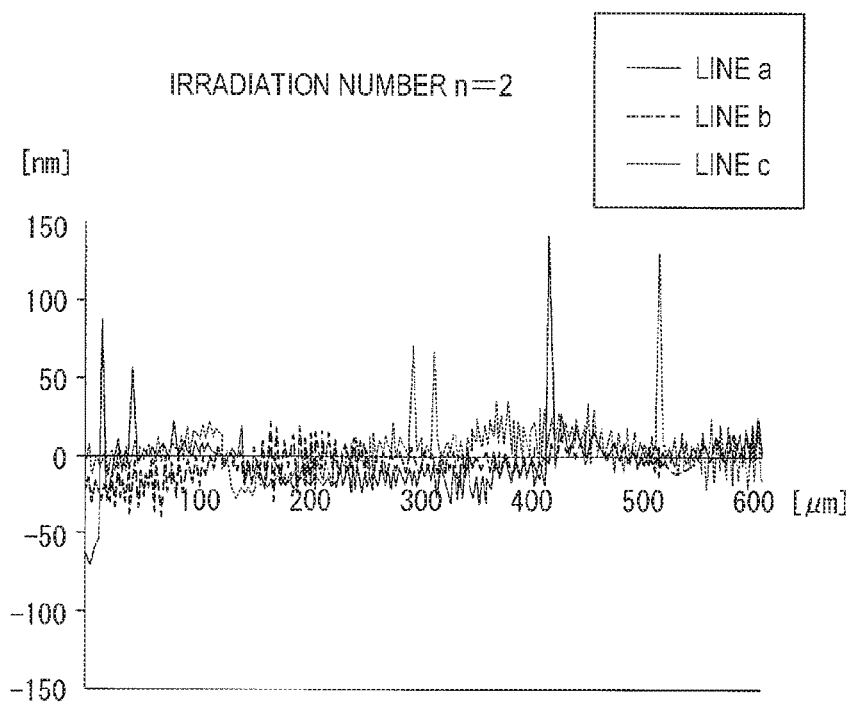
FIG. 56 is a graph illustrating profiles of steps that are formed between irradiation areas and non-irradiation areas of nitride films in a case where light pulse irradiation is performed twice in the method for doping impurities according to Example 3.

In the case where shot number n=1, as illustrated in the graph in FIG. 55, an average maximum depth of steps was about 20 to 30 nanometers, and the depths of the steps became smaller by about one fifth to one fourth compared to those under the corresponding laser doping conditions of Example 2 illustrated in FIG. 47. In the case where the shot number n=2, as illustrated in the graph in FIG. 56, maximum depths of steps were about 30 to 70 nanometers.

Figure 57:
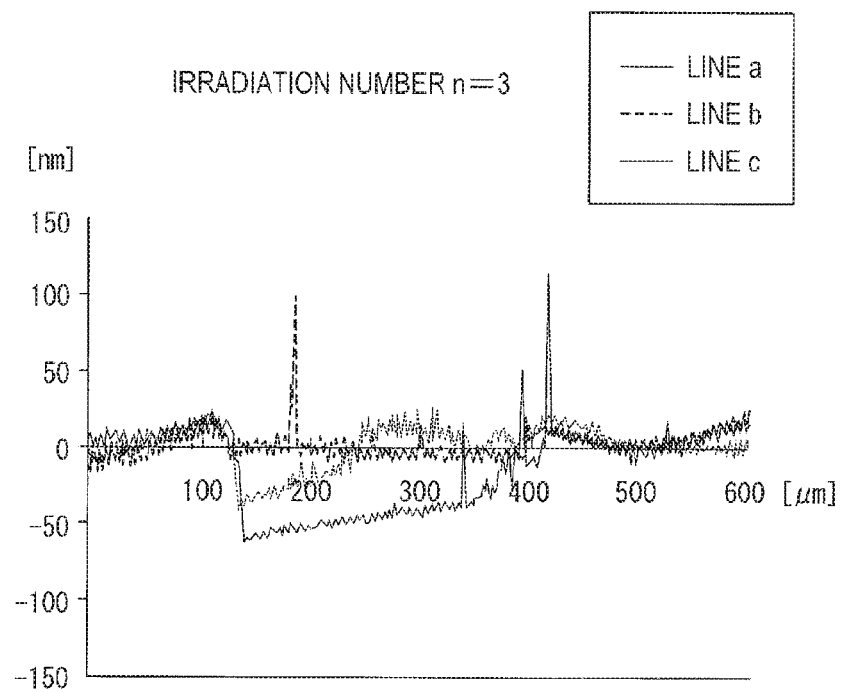
FIG. 57 is a graph illustrating profiles of steps that are formed between irradiation areas and non-irradiation areas of nitride films in a case where light pulse irradiation is performed three times in the method for doping impurities according to Example 3.
Figure 58:
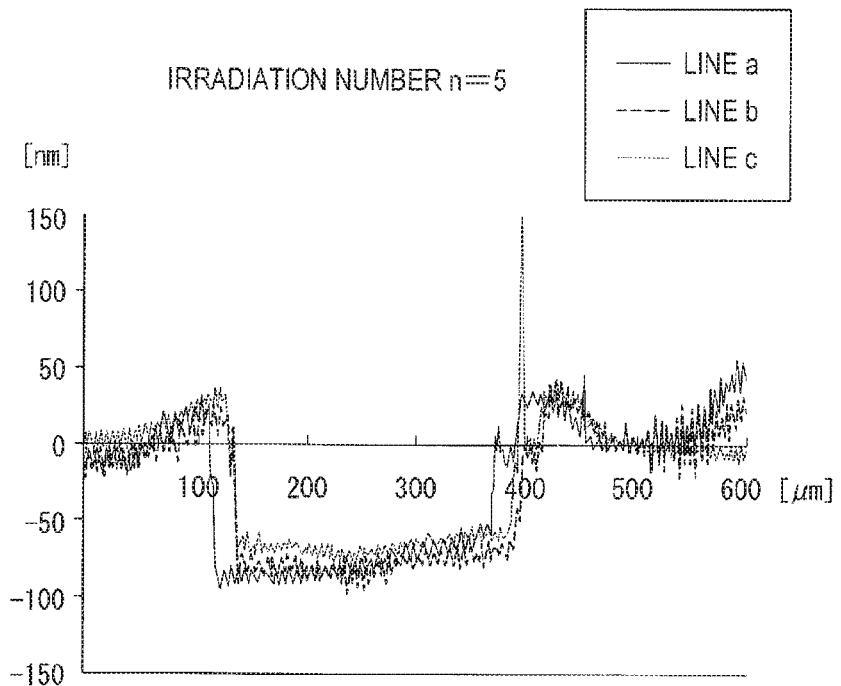
FIG. 58 is a graph illustrating profiles of steps that are formed between irradiation areas and non-irradiation areas of nitride films in a case where light pulse irradiation is performed five times in the method for doping impurities according to Example 3.

In the case where the shot number n=3, as illustrated in the graph in FIG. 57, maximum depths of steps were about 70 nanometers, and the depths of the steps became smaller to about one third to half compared to those under the corresponding laser doping conditions in Example 2 illustrated in FIG. 48. In the case where the shot number n=5, as illustrated in the graph in FIG. 58, maximum depths of steps were about 70 to 100 nanometers.

Figure 59:
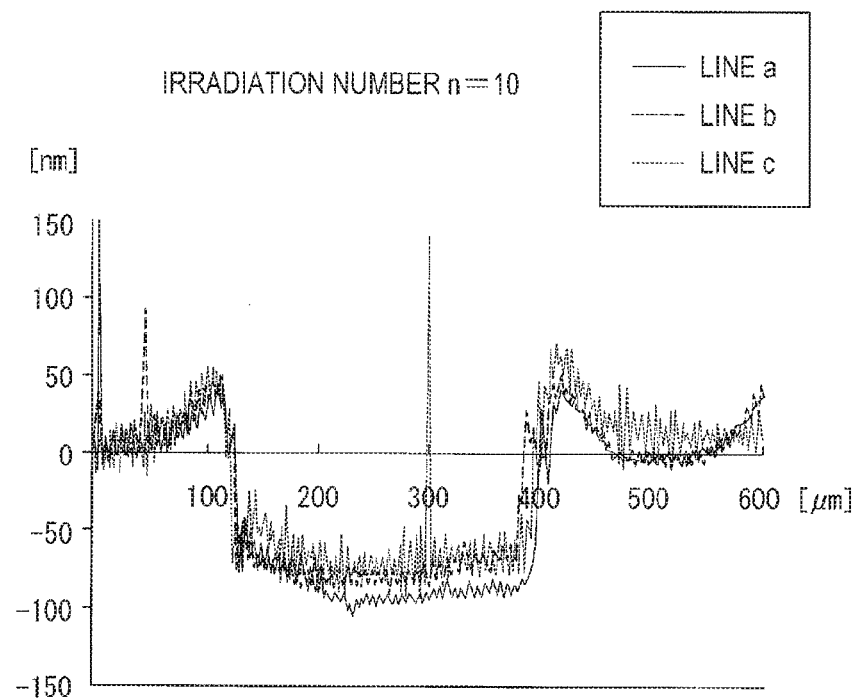
FIG. 59 is a graph illustrating profiles of steps that are formed between irradiation areas and non-irradiation areas of nitride films in a case where light pulse irradiation is performed ten times in the method for doping impurities according to Example 3.

In the case where the shot number n=10, as illustrated in the graph in FIG. 59, maximum depths of steps were about 80 to 100 nanometers, and the depths of the steps became smaller to about one third to half compared to those under the corresponding laser doping conditions in Example 2 illustrated in FIG. 49.

Figure 60:
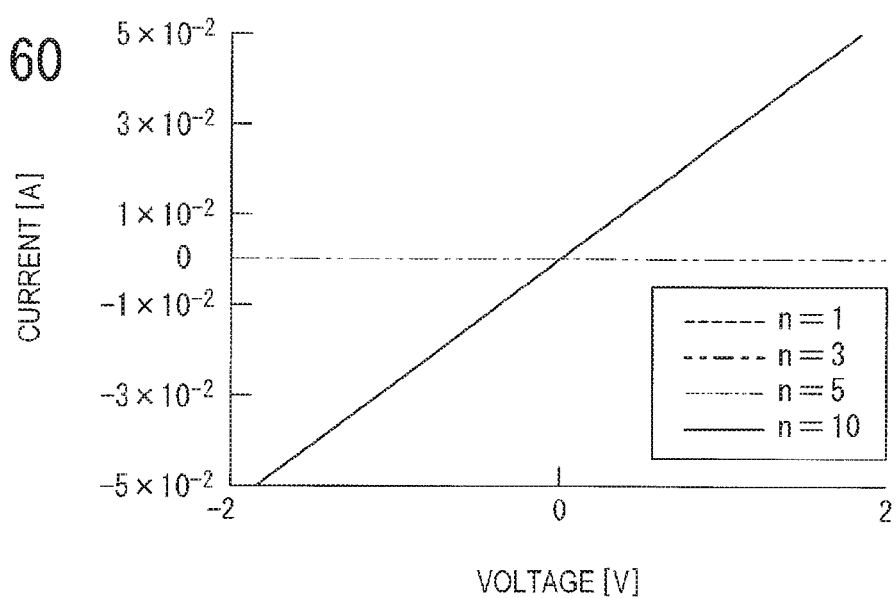
FIG. 60 is a graph illustrating I-V characteristic of the nitrogen doping region for each shot number, the nitrogen doping region being formed by using the method for doping impurities according to Example 3.
Figure 61:
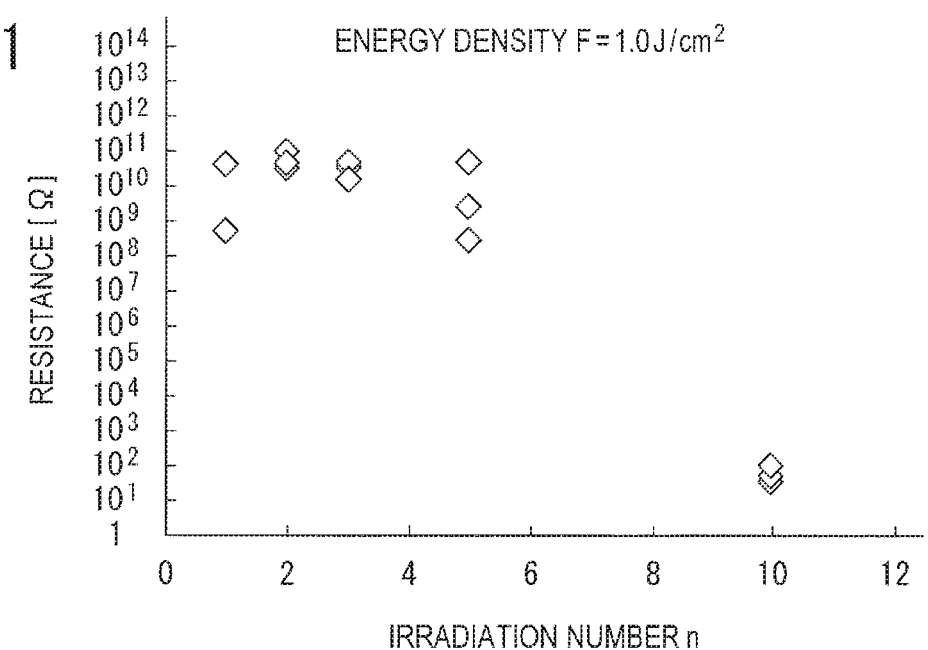
FIG. 61 is a graph illustrating a resistance value in the nitrogen doping region for each shot number, the nitrogen doping region being formed by using the method for doping impurities according to Example 3.

Similarly to the case of Example 2, out of the nitrogen doping regions $2c$ formed with the five different patterns of shot number n, I-V characteristics obtained in the case of the four patterns of n=1, 3, 5, 10 are illustrated in the graph in FIG. 60 as examples. The graph in FIG. 61 illustrates resistance values obtained in the respective five patterns by using the method illustrated in FIG. 52.

In FIG. 60, a locus in the case where the shot number n=1 illustrated by the broken line as an example, a locus in the case where the shot number n=3 illustrated by the alternating long and short dash line as an example, and a locus in the case where the shot number n=5 illustrated by the two-dotted line as an example, are illustrated in a nearly overlapped state on the same straight line. As illustrated in FIG. 60, in any of the cases where the shot number n=1, 3, 5, almost no current was flown even when voltage was changed. As illustrated in FIG. 61, in the case where the shot number n=1, 2, 3, 5, three resistance values of line a to line c when voltage of 2V was applied were relatively high within a range of about $1 \times 10^8$ to $1 \times 10^{11} \Omega$.

In the case where the shot number n=10, when voltage is changed, large current was flown with ohmic characteristics. As illustrated in FIG. 61, the three respective resistance values when voltage of 2V was applied were around $1 \times 10^2 \Omega$, which is remarkably lower than those in the four patterns of the shot number n=1, 2, 3, 5. According to FIG. 61 and FIG. 61, it is understood that, in the case where the energy density F of a light pulse is reduced, the nitrogen doping region $2c$ can be controlled to have effective I-V characteristics by adjusting the shot number n to a larger number.

Further, in addition to Example 2 and Example 3, laser doping was performed with an energy density F of a light pulse increased to about 6.0 J/cm$^2$, which is larger than those in the cases of Example 2 and Example 3, and under laser doping conditions similar to those of Example 2 and Example 3. In this case, similarly to the cases of Example 2 and Example 3, the larger the shot number n became, the larger a step of a nitride film $4c$ became, and an etching depth also became larger when the nitrogen doping region $2c$ was etched.

With the method for doping impurities according to the third embodiment, the shot number n of a light pulse is decided in consideration of the film thickness $t_f$ of the nitride film $4c$, and the energy density F and the irradiation time $\tau$ of a light pulse in advance. Then, the nitride film $4c$ is irradiated with the light pulse at room temperature and under atmospheric pressure. Thus, doping of N into the surface of the epi layer $22c$ of 4H-SiCi is promoted. Therefore, it is possible to dope N in the surface of the epi layer $22c$ of 4H—SiC as the target object 2 at a concentration of nitrogen in a level of $10^{21}$ cm$^{-3}$ that is significantly larger than a solid solution concentration of N (about $1 \times 10^{20}$ cm$^{-3}$ or lower).

Further, N is easily doped to a position at a depth of about 50 nanometers from the surface of the epi layer 22c.

In a case of a method for doping N, in which a SiC semiconductor substrate is immersed into a highly concentrated ammonia aqueous solution and irradiated with a light pulse of a laser beam through the ammonia aqueous solution, there is a problem that not only the intended N atoms but also oxygen (O) and hydrogen (H) contained in the ammonia aqueous solution enter the crystal of SiC, thus deteriorating crystallinity. In this regard, with the method for doping impurities according to the third embodiment, a solid body of nitride film 4c is used instead of the ammonia aqueous solution, and a large amount of O and H that causes deterioration of semiconductor characteristics do not enter the crystal of SiC. Further, since laser doping is carried out in a nitrogen atmosphere as an irradiation atmosphere under atmospheric pressure, it is possible to further restrain entrance of O and H. In the method for doping impurities according to third embodiment in which SiC is the target object, SiNx, a compound of Si and N, is used as nitride. Therefore, affinity with SiC is high, and, even if SiNx is abraded and Si is deposited on the surface of 4H—SiC, there is less concern about Si working as an unnecessary substance for the element.

With the method for doping impurities according to the third embodiment, laser doping is performed within a range of about room temperature to 600°. Therefore, unlike the related art, it is not necessary to anneal at extremely high temperature of about 1600 to 1800° C. It is thus possible to dope N easily without adding stress deformation by thermal history.

Conventionally, when Impurity elements are provided as a solid phase doping source on the target object 2 of 4H—SiC and irradiated by the laser beam 6 to implement laser doping, there are instances where laser doping is performed in a low-pressure state of about $6.7 \times 10^{-5}$ Pa. With the method for doping impurities according to the third embodiment, it is possible to dope nitrogen as impurity elements even under atmospheric pressure. Therefore, facility and workload burdens to have a low-pressure state are removed, and it is possible to implement laser doping more easily and swiftly than before.

<Method for Manufacturing a Semiconductor Device>

Next, a method for manufacturing a semiconductor device according to the third embodiment is explained with reference to FIG. 42 to FIG. 46 used for explaining the method for doping impurities according to the third embodiment.

Figure 62:
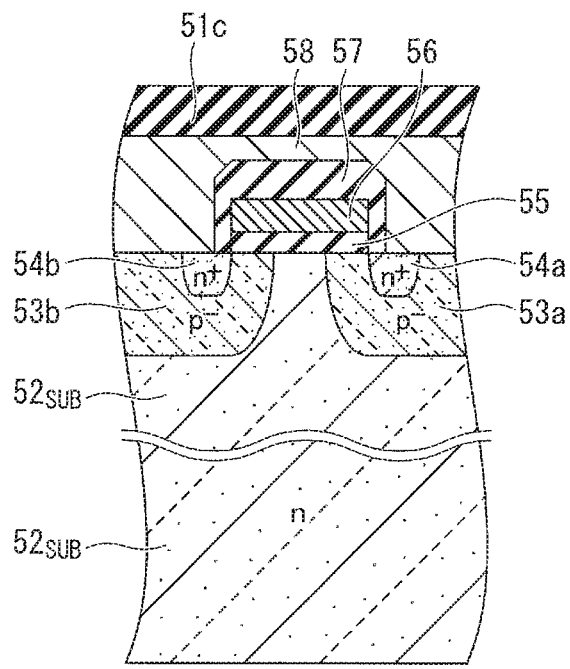
FIG. 62 is a schematic process sectional view explaining an outline of a method for manufacturing a semiconductor device according to the third embodiment (No. 1)

(h) First of all, as illustrated in a sectional view in FIG. 62, an intermediate product 2 is prepared as the target object 2. In the intermediate product 2, a semiconductor substrate $52_{SUB}$, which will become an n-type drift layer at the end, is formed.

Inside an upper surface of the semiconductor substrate $52_{SUB}$ of the intermediate product 2 in FIG. 62, a plurality of p-type well regions 53a, 53b are provided selectively. Inside the plurality of p-type well regions 53a, 53b, source regions 54a, 54b are provided, respectively. On the surfaces of the well regions 53a, 53b, a gate electrode 56 is provided through a gate insulation film 55. On top of the gate electrode 56, an interlayer insulation film 57 is provided. At the same time, on top of the interlayer insulation film 57, a source electrode film 58 is provided so as to short-circuit the well regions 53a, 53b and the source regions 54a, 54b. On top of the source electrode film 58, a passivation film 51c such as a silicon oxide film ($SiO_2$ film) and a polyimide film is formed. Thus, a MOS gate structure is formed on the surface of the intermediate product 2 illustrated in FIG. 62.

(i) By using a technique such as a chemical machine polishing (CMP), a thickness of the semiconductor substrate $52_{SUB}$ is adjusted until the semiconductor substrate $52_{SUB}$ has a desired thickness $t_{drift}$. For example, it is possible to select a thickness of about ten micrometers to 60 micrometers as the desired thickness $t_{drift}$. A remaining part of the semiconductor substrate $52_{SUB}$ having the desired thickness $t_{drift}$ functions as a drift layer 52 of a semiconductor device. The drift layer 52 corresponds to a first n-type semiconductor region according to the present invention.

Figure 63:
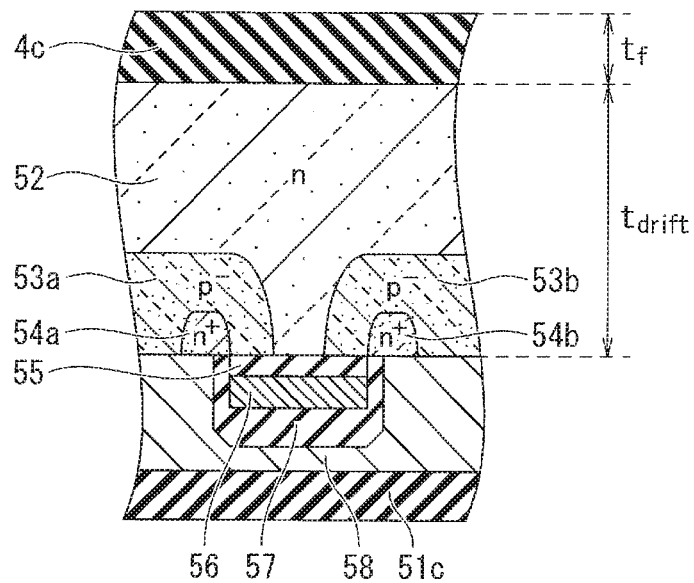
FIG. 63 is a schematic process sectional view explaining the outline of the method for manufacturing a semiconductor device according to the third embodiment (No. 2)

(j) Next, as illustrated in a sectional view in FIG. 63, the semiconductor device is reversed upside down and arranged inside the chamber 11 of the coating equipment 10c illustrated in FIG. 39 so that a back surface of the drift layer 52 on the opposite side of the MOS gate structure becomes an upper surface. Then, similarly to FIG. 5, a nitride film 4c is deposited with a certain thickness $t_f$ on the back surface of the drift layer 52 by using a low-temperature film forming technology such as plasma CVD.

Figure 64:
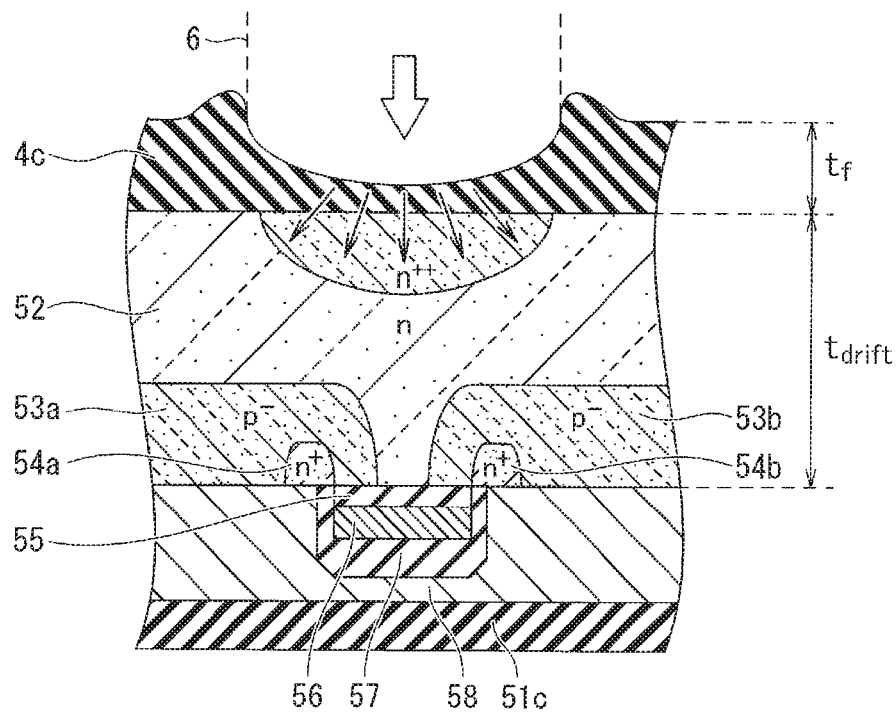
FIG. 64 is a schematic process sectional view explaining the outline of the method for manufacturing a semiconductor device according to the third embodiment (No. 3)

(k) Next, as illustrated in a sectional view in FIG. 64, the back surface of the drift layer 52 is irradiated with a light pulse of the laser beam 6 through the nitride film 4c similarly to FIG. 6. At this time, the back surface of the drift layer 52 is entirely scanned and irradiated by the laser beam 6, and N is doped into a lower part of the drift layer 52 (expressed as the "upper part" in FIG. 64) at a high concentration exceeding a solid solution concentration of the drift layer 52. The scanning can be performed by movements of the X-Y motion stage 23 illustrated by the two-way arrow inside the X-Y motion stage 23 in FIG. 39, or movements on the beam adjusting system 33 side.

When an energy density F of a light pulse for irradiation is relatively large, it is possible to form a nitrogen doping region having excellent I-V characteristics even if the shot number n is reduced to a small numbers such as three or five times as illustrated in FIG. 53 and FIG. 54. By reducing the shot number n of a light pulse used to irradiate the back surface of the drift layer 52, a manufacturing process for a semiconductor device is shortened, an increase in an etched amount of the surface of the nitrogen doping region is restrained.

Figure 65:
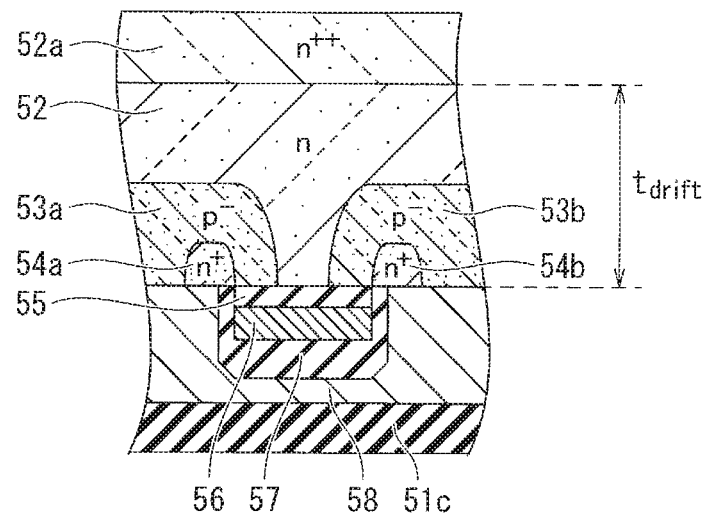
FIG. 65 is a schematic process sectional view explaining the outline of the method for manufacturing a semiconductor device according to the third embodiment (No. 4)

(l) Next, similarly to FIG. 46, the nitride film 4c remaining on the back surface of the drift layer 52 is removed. Then, as illustrated in a sectional view in FIG. 65, an $n^{++}$-type nitrogen doping region, in which N is doped in a level exceeding the solid solution concentration, is formed as a drain region 52a on the entire surface of the lower part of the drift layer 52 on the opposite side of the MOS gate structure. The drain region 52a corresponds to a second n-type semiconductor region according to the present invention.

Figure 66:
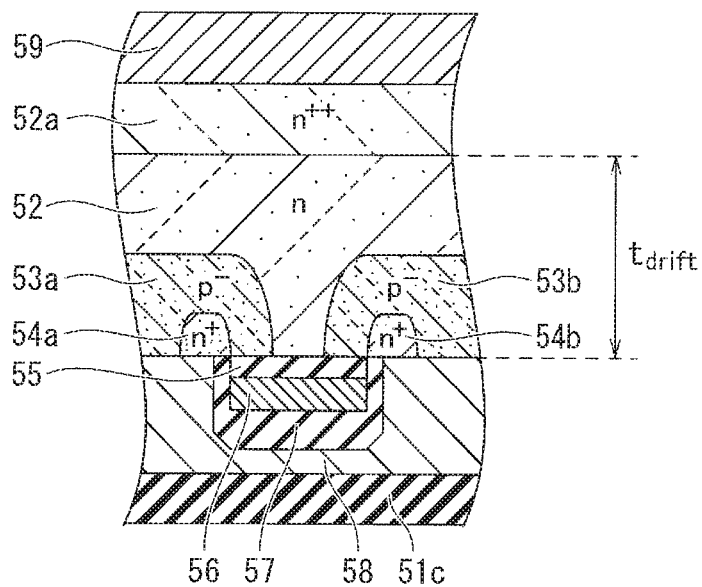
FIG. 66 is a schematic process sectional view explaining the outline of the method for manufacturing a semiconductor device according to the third embodiment (No. 5).

(m) Next, as illustrated in a sectional view in FIG. 66, a drain electrode film 59 made from, for example, Ni, is formed on the drain region 52a. The drain region 52a, to which nitrogen is doped at a high concentration, and the drain electrode film 59 are in good ohmic contact with each other as explained in FIG. 51 to FIG. 61, and an element structure, configured to provide an ohmic contact structure in the second n-type semiconductor region, is formed. The foregoing steps (h) to (m) structure the method for manufacturing a semiconductor device according to the third embodiment.

With the method for manufacturing a semiconductor device according to the third embodiment, the shot number n of a light pulse is set in consideration of a film thickness $t_f$ of the nitride film 4c, and an energy density F and irradiation time τ of a light pulse. Then, the nitride film 4c is irradiated with a light pulse at room temperature and under atmospheric pressure. Therefore, it is possible to dope N so that a concentration in the surface of the 4H—SiC semiconductor substrate is in a level of $10^{21}$ cm$^{-3}$ or more, which is significantly larger than a solid solution concentration of N (about $1\times10^{20}$ cm$^{-3}$ or lower). Also, it is possible to manufacture a semiconductor device 50c having a semiconductor region with low ohmic resistance and excellent contact properties.

Conventionally, with regard to a drain region provided on a back surface side of a semiconductor substrate, a semiconductor substrate having a relatively large thickness is prepared in advance, a MOS gate structure or the like is formed on a surface side of the semiconductor substrate, and then the back surface of the semiconductor substrate is shaved off by CMP and so on. Thereafter, treatments such as doping of an n-type impurity and high-temperature annealing are required. Therefore, there has been a problem that damages such as warps and cracks happen in the semiconductor substrate. However, with the method for manufacturing a semiconductor device according to the third embodiment, it is not necessary to anneal in high-temperature. Therefore, it is possible to form the drain region 52a at a high concentration even after the semiconductor substrate having the surface structure formed therein is shaved to an extremely small thickness of about $t_{drift}$=ten micrometers to 60 micrometers. Thus, a burden in manufacturing a semiconductor device is reduced, and the process becomes more efficient. At the same time, it is possible to realize a high-speed, low-loss semiconductor device.

(Other Embodiments)

The present invention is explained based on the foregoing disclosed embodiments. However, it is should not be understood that the statements and drawings included in the disclosure limit the present invention. It should be considered that the disclosure reveals various substitute embodiments, examples, and application technologies to a person skilled in the art. For example, in the method for manufacturing a semiconductor device according to the third embodiment, the arithmetic and control unit 30c implements arithmetic processing to decide the shot number n of a light pulse from the film thickness $t_f$ of the nitride film 4c, and an energy density F and irradiation time τ of a light pulse as input data. However, an operator may decide the shot number n of a light pulse.

Further, in the method for manufacturing a semiconductor device according to the third embodiment, MOSFET was explained as an example. However, the semiconductor device is not limited to MOSFET. The present invention is applicable to n-type semiconductor regions of various kinds of semiconductor devices (semiconductor devices), such as IGBT, SIT, GTO, SI thyristors and so on, as well as a diode. As described so far, the present invention includes various embodiments that are not described above, and the technical scope of the invention is defined only by a matter specifying the invention according to the reasonable scope of patent claims based on the foregoing explanation.

What is claimed is:

1. A method for doping impurities, comprising:
    depositing a source film made of material containing impurity elements on a surface of a solid target object, a thickness of the source film is determined by an irradiation time light pulse and an energy density of the light pulse; and
    irradiating the source film by the light pulse with the irradiation time and the energy density so as to dope the impurity elements into the target object at a concentration exceeding a thermodynamic equilibrium concentration.

2. The method of claim 1, wherein a film thickness of the source film is further determined by a distribution state and a depth of recessed irregularities generated on a surface of the target object, the recessed irregularities are ascribable to irradiation by the light pulse.

3. The method of claim 2, wherein the energy density is 3.3 J/cm$^2$ or higher, but not exceeding 6.0 J/cm$^2$.

4. The method of claim 3, wherein a wavelength of the light pulse is 190 nanometers or longer.

5. The method of claim 4, wherein an irradiation processing with the light pulse is executed in a state where the target object is at room temperature or higher, but not exceeding 500° C.

6. The method of claim 5, wherein the impurity element is aluminum.

7. The method of claim 6, wherein the film thickness is decided within a range of 240 nanometers or larger,
    but not exceeding $(4.4\times10^3 \cdot \ln(F)-5350)$ nanometers where the energy density is F (J/cm$^2$).

8. The method of claim 1, wherein the source film is a nitride film, and,
    the impurity element to be doped is nitrogen contained in the nitride film.

9. The method of claim 8, wherein the irradiation by the light pulse includes:
    deciding shot number of the light pulse in consideration of a film thickness of the nitride film, an energy density of the light pulse, and irradiation time per a single shot of the light pulse; and
    irradiating the nitride film with the light pulse with the energy density, the irradiation time, and the shot number.

10. The method of claim 9, wherein the nitride film is a silicon nitride film.

11. The method of claim 10, wherein a film thickness of the nitride film is ten nanometers or larger, but not exceeding one micrometer.

12. The method of claim 11, wherein the energy density is 1.0 J/cm$^2$ or higher, but not exceeding 6.0 J/cm$^2$.

13. The method of claim 12, wherein a wavelength of the light pulse is 190 nanometers or longer, but not exceeding 380 nanometers.

14. The method of claim 13, wherein the light pulse is irradiated with the shot number of one or more, but not exceeding ten per a single irradiation area.

15. The method of claim 14, wherein a planar pattern is directly written, by scanning a beam of the light pulse so as to move the target object in an X-Y plane, relative to an irradiation position of the beam.

16. The method of claim 15, wherein the irradiation by the light pulse is executed in a state where temperature of the target object is set to room temperature or higher, but not exceeding 600° C.

17. A method for manufacturing a semiconductor device, comprising:
    preparing an intermediate product having a first semiconductor region;
    depositing source film made of material containing impurity elements on a surface of the first semiconductor region, a thickness of the source film is determined by an irradiation time per light pulse and an energy density of the light pulse; and
    forming a second semiconductor region by irradiating the source film by the light pulse with the irradiation time and the energy density and doping the impurity elements into the first semiconductor region at a concentration exceeding a thermodynamic equilibrium concentration.

18. The method of claim 17, wherein the first semiconductor region is a first conductivity type,
the source film contains impurity elements of a second conductivity type,
the second conductivity type of the second semiconductor region is established by the impurity elements in the source film; and
an element structure is produced through the intermediate product, the element structure includes a pn junction implemented by the first semiconductor region and the second semiconductor region.

19. The method of claim 17, wherein the source film contains impurity elements having the same conductivity type as that of the first semiconductor region, in the second semiconductor region serving as a contact region, the impurity elements in the source film is doped to a higher concentration than that of the first semiconductor region, and the method further comprises:
forming an electrode film serving as an ohmic contact with the contact region,
wherein an element structure including an ohmic contact structure is produced through the intermediate product.

20. The method of claim 17, wherein the first semiconductor region is the first conductivity type, and the method further comprises:
delineating doping mask on the first semiconductor region, the doping mask having a window for doping impurities,
wherein the source film containing the second conductivity type impurity element is deposited on a surface of the first semiconductor region partially through the doping mask, the source film having the thickness; and
by irradiating the source film by the light pulse, a pattern of the second semiconductor region having the second conductivity type is selectively formed in the first semiconductor region immediately below the window.

21. The method of claim 20, wherein the doping mask is made of a silicon oxide film.

22. The method of claim 17, wherein the first semiconductor region is n-type, the source film is a nitride film, by irradiating the nitride film with the light pulse, nitrogen contained in the nitride film is doped into the first semiconductor region, establishing the second semiconductor region having the n-type, and the method further comprises:
depositing an ohmic contact electrode film so as to contact with the second semiconductor region.

23. The method of claim 22, wherein the forming the second semiconductor region includes:
deciding shot number of the light pulse in consideration of a film thickness of the nitride film, an energy density of the light pulse, and irradiation time per a single shot of the light pulse; and
irradiating the nitride film with the light pulse with the energy density, the irradiation time, and the shot number.

24. The method of claim 18, wherein a planar pattern of the second semiconductor region in directly written by scanning a beam of the light pulse so as to move the position of the first conductivity region in an X-Y plane, relative to an irradiation position of the beam.

* * * * *

UNITED STATES PATENT AND TRADEMARK OFFICE
CERTIFICATE OF CORRECTION

PATENT NO. : 9,659,775 B2
APPLICATION NO. : 15/052427
DATED : May 23, 2017
INVENTOR(S) : Akihiro Ikeda et al.

It is certified that error appears in the above-identified patent and that said Letters Patent is hereby corrected as shown below:

In the Claims
Column 40, Line 42, In Claim 12, delete "$J/cm^2$" and insert -- $J/cm^2$. --, therefore.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*